US012751027B2

(12) United States Patent
Lin et al.

(10) Patent No.: US 12,751,027 B2
(45) Date of Patent: Sep. 29, 2026

(54) TRANSISTOR DEVICE INCLUDING A PLURALITY OF NANOSTRUCTURE CHANNELS AND METHODS OF FORMATION WITH CONTINUOUS POLYSILICON ON DIFFUSION EDGE (CPODE) PROCESS

(71) Applicant: Taiwan Semiconductor Manufacturing Company, Ltd., Hsinchu (TW)

(72) Inventors: Tzu-Ging Lin, Kaohsiung City (TW); Chen-Yu Tai, Miaoli County (TW); Chun-Liang Lai, Hsinchu City (TW); Yun-Chen Wu, Hsinchu (TW); Shun-Hui Yang, Jungli City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 448 days.

(21) Appl. No.: 18/461,043

(22) Filed: Sep. 5, 2023

(65) Prior Publication Data

US 2025/0081493 A1 Mar. 6, 2025

(51) Int. Cl.

| | |
|---|---|
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |

(52) U.S. Cl.

CPC ........... *H10D 30/014* (2025.01); *H10D 30/43* (2025.01); *H10D 30/6735* (2025.01); *H10D 62/121* (2025.01); *H10D 64/017* (2025.01)

(58) Field of Classification Search

CPC .. H10D 30/014; H10D 30/43; H10D 30/6735; H10D 62/121; H10D 64/017; H10D 30/6757; H10D 30/797

See application file for complete search history.

(56) References Cited

U.S. PATENT DOCUMENTS

| | | | | |
|---|---|---|---|---|
| 11,282,967 | B2 | 3/2022 | Chang et al. | |
| 2022/0130865 | A1* | 4/2022 | Park | H10D 84/85 |
| 2022/0173097 | A1* | 6/2022 | Yang | H10D 30/6757 |
| 2022/0384619 | A1 | 12/2022 | Lin et al. | |
| 2024/0178274 | A1* | 5/2024 | Jo | H10D 84/038 |

FOREIGN PATENT DOCUMENTS

| | | |
|---|---|---|
| TW | 202125648 A | 7/2021 |

* cited by examiner

*Primary Examiner* — Changhyun Yi

(74) *Attorney, Agent, or Firm* — Harrity & Harrity, LLP

(57) ABSTRACT

A continuous metal on diffusion edge (CMODE) may be used to form a CMODE structure in a semiconductor device after a replacement gate process that is performed to replace the polysilicon dummy gate structures of the semiconductor device with metal gate structures. The CMODE process described herein includes removing a portion of a metal gate structure (as opposed to removing a portion of a polysilicon dummy gate structure) to enable formation of the CMODE structure in a recess left behind by removal of the portion of the metal gate structure.

20 Claims, 36 Drawing Sheets

TRANSISTOR DEVICE INCLUDING A PLURALITY OF NANOSTRUCTURE CHANNELS AND METHODS OF FORMATION WITH CONTINUOUS POLYSILICON ON DIFFUSION EDGE (CPODE) PROCESS

BACKGROUND

As semiconductor device manufacturing advances and technology processing nodes decrease in size, transistors may become affected by short channel effects (SCEs) such as hot carrier degradation, barrier lowering, and quantum confinement, among other examples. In addition, as the gate length of a transistor is reduced for smaller technology nodes, source/drain (S/D) electron tunneling increases, which increases the off current for the transistor (the current that flows through the channel of the transistor when the transistor is in an off configuration). Silicon (Si)/silicon germanium (SiGe) nanostructure transistors such as nanowires, nanosheets, and gate-all-around (GAA) devices are potential candidates to overcome short channel effects at smaller technology nodes. Nanostructure transistors are efficient structures that may experience reduced SCEs and enhanced carrier mobility relative to other types of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
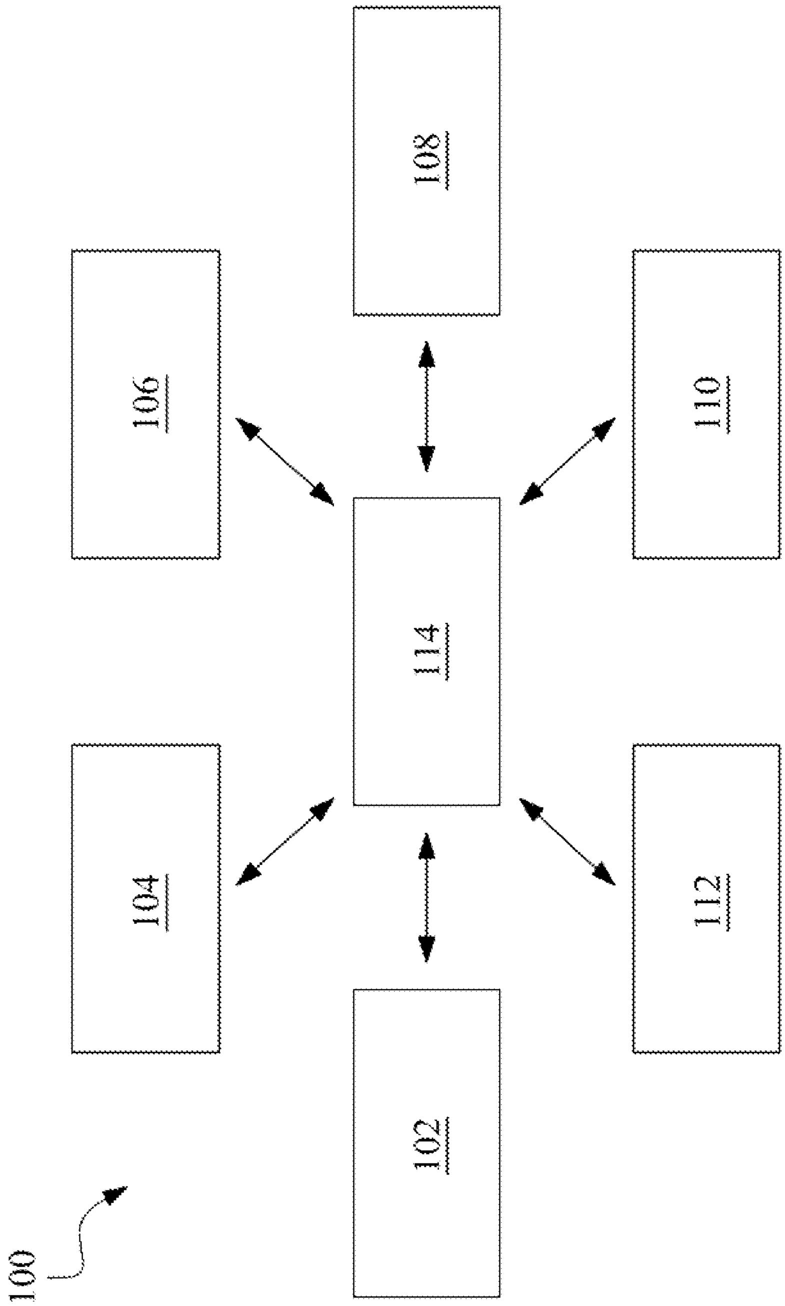
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A continuous polysilicon on diffusion edge (CPODE) process may be performed to remove a portion of a polysilicon dummy gate structure, and replace the portion of the polysilicon dummy gate structure with a CPODE structure. The CPODE structure includes an isolation structure that is formed in a recess after removal of the portion of the polysilicon dummy gate structure. The CPODE structure may extend into a silicon fin under the polysilicon dummy gate structure. The CPODE structure may be formed to provide isolation (e.g., electrical isolation and/or physical isolation) between regions of a semiconductor device, such as between device regions of the semiconductor device, between active regions of the semiconductor device, and/or between transistors of the semiconductor device, among other examples.

In some cases, the CPODE process may cause one or more layout dependent effects (LDEs) to occur in the semiconductor device. For example, the portion of the polysilicon dummy gate structure that is removed for the CPODE structure may be adjacent to one or more source/drain regions of transistors of the semiconductor device. The etch process to remove the portion of the polysilicon dummy gate structure may result in critical dimension (CD) loading and epitaxial damage (EPI damage) to these source/drain regions. As another example, depth loading may occur in the etch process, where an insufficient amount of the silicon fin is removed to form the CPODE structure to an adequate depth to provide electrical isolation between the source/drain regions. This can lead to an increased likelihood of current leakage between the source/drain regions (e.g., through the silicon fin and/or through the underlying substrate). As another example, the CPODE structure may cause gate deformation of the polysilicon dummy gate structure and/or of other polysilicon dummy gate structures, which may result in threshold voltage ($V_t$) shifting and threshold voltage variation for the transistors of the semiconductor device. The threshold voltage variation may cause variations in transistor switching speed, variations in power consumption, and/or reduced device performance for the transistors of the semiconductor device.

Some implementations described herein provide a continuous metal on diffusion edge (CMODE) process in which a CMODE structure is formed in a semiconductor device after a replacement gate process (RPG) that is performed to replace the polysilicon dummy gate structures of the semiconductor device with metal gate structures. Accordingly, the CMODE process described herein includes removing a portion of a metal gate structure (as opposed to removing a portion of a polysilicon dummy gate structure) to enable formation of the CMODE structure in a recess left behind by removal of the portion of the metal gate structure.

The materials used for the metal gate structures of the semiconductor device may be stronger and may better withstand the stresses and strains of etching and forming the CMODE structures of the semiconductor device. Accordingly, the CMODE process described herein may reduce the likelihood of stress loss the source/drain regions on opposing sides of the CMODE structures, may reduce the likelihood of depth loading in the semiconductor, and/or may reduce the likelihood of gate deformation in the semiconductor device, among other examples. Thus, the CMODE process described herein may reduce the likelihood of stress release to the source/drain regions, may reduce current leakage between the source/drain regions, and/or may reduce the likelihood of threshold voltage shifting for the transistors of the semiconductor device. The reduced likelihood of threshold voltage shifting may provide more uniform and/or faster switching speeds for the transistors, more uniform and/or lower power consumption for the transistors, and/or increased device performance for the transistors, among other examples.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that can be filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions. In some implementations, the etch tool 108 includes a plasma-based asher to remove a photoresist material and/or another material.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

As described herein, the semiconductor processing tools 102-112 may perform a combination of operations to form one or more portions of a nanostructure transistor. In some implementations, the combination of operations includes forming, over a semiconductor substrate, a plurality of nanostructure layers in a direction that is perpendicular to the semiconductor substrate, where the plurality of nanostructure layers includes a plurality of sacrificial layers alternating with a plurality of channel layers; forming, over the plurality of nanostructure layers, a dummy gate structure; removing portions of the plurality of nanostructure layers to form one or more recesses adjacent to one or more sides of the dummy gate structure; forming one or more source/drain regions in the one or more recesses; replacing, after forming the one or more source/drain regions, the dummy gate structure and portions of the sacrificial layers under the dummy gate structure with a metal gate structure, where the metal gate structure wraps around at least three sides of the channel layers; removing, to form an active region isolation recess after replacing the dummy gate structure and the portions of the sacrificial layers under the dummy gate structure with the metal gate structure, a portion of the metal gate structure, portions of the channel layers around which the metal gate structure wraps, and a mesa region, under the portions of the channel layers, that extends above the semiconductor substrate; and/or forming an active region isolation structure in the active region isolation recess, among other examples.

In some implementations, the combination of operations includes forming, over a semiconductor substrate, a plurality of nanostructure layers in a direction that is perpendicular to the semiconductor substrate, where the plurality of nanostructure layers include a plurality of sacrificial layers alternating with a plurality of channel layers; forming, over the plurality of nanostructure layers, a plurality of dummy gate structures; removing portions of the plurality of nanostructure layers to form one or more recesses adjacent to one or more sides of a dummy gate structure of the plurality of dummy gate structures; forming one or more source/drain regions in the one or more recesses; replacing, after forming the one or more source/drain regions, the plurality of dummy gate structures and portions of the sacrificial layers under the plurality of dummy gate structures with a plurality of metal gate structures, where the plurality of metal gate structures wraps around at least three sides of the channel layers; forming gate isolation structures across the plurality of metal gate structures after replacing the dummy gate structure and the portions of the sacrificial layers under the dummy gate structure with the metal gate structure; removing, between the gate isolation structures to form an active region isolation recess, a portion of a metal gate structure of the plurality of metal gate structures, portions of the channel layers around which the metal gate structure wraps, and a mesa region, under the portions of the channel layers, that extends above the semiconductor substrate; and/or forming an active region isolation structure in the active region isolation recess between the gate isolation structures.

In some implementations, the combination of operations includes one or more operations described in connection with one or more of FIGS. 3A-11I.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
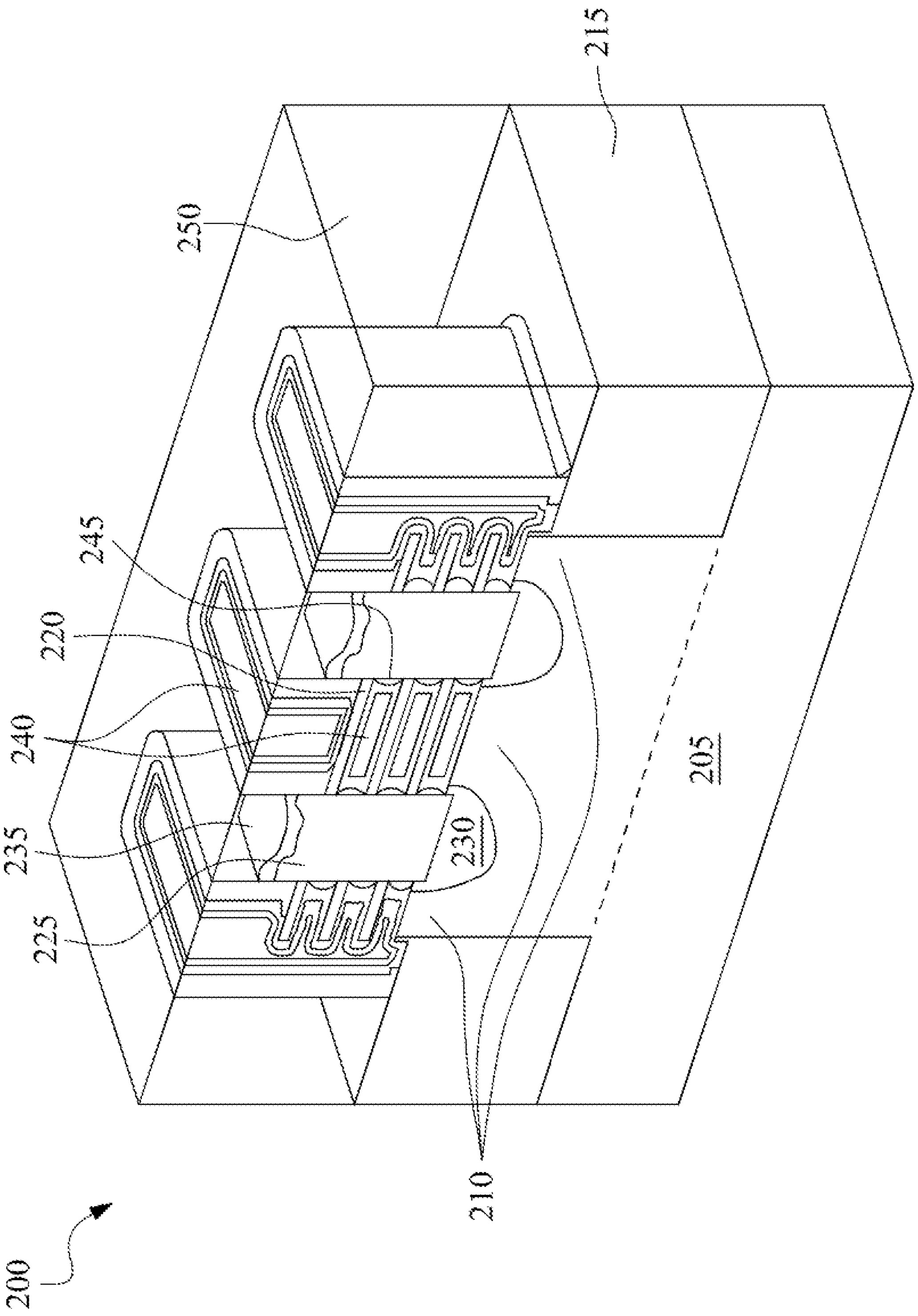
FIG. 2 is a diagram of an example semiconductor device described herein.

FIG. 2 is a diagram of an example semiconductor device 200 described herein. The semiconductor device 200 includes one or more transistors. The one or more transistors may include nanostructure transistor(s) such as nanowire transistors, nanosheet transistors, gate-all-around (GAA) transistors, multi-bridge channel transistors, nanoribbon transistors, and/or other types of nanostructure transistors. The semiconductor device 200 may include one or more additional devices, structures, and/or layers not shown in FIG. 2. For example, the semiconductor device 200 may include additional layers and/or dies formed on layers above and/or below the portion of the semiconductor device 200 shown in FIG. 2. Additionally, or alternatively, one or more additional semiconductor structures and/or semiconductor devices may be formed in a same layer of an electronic device or integrated circuit (IC) that includes the semiconductor device as the semiconductor device 200 shown in FIG. 2. One or more of FIGS. 3A-12B may include schematic cross-sectional views of various portions of the semiconductor device 200 illustrated in FIG. 2, and correspond to various processing stages of forming nanostructure transistors of the semiconductor device 200.

The semiconductor device 200 includes a semiconductor substrate 205. The semiconductor substrate 205 includes a silicon (Si) substrate, a substrate formed of a material including silicon, a III-V compound semiconductor material substrate such as gallium arsenide (GaAs), a silicon on insulator (SOI) substrate, a germanium (Ge) substrate, a silicon germanium (SiGe) substrate, a silicon carbide (SiC) substrate, or another type of semiconductor substrate. The semiconductor substrate 205 may include various layers, including conductive or insulating layers formed on a semiconductor substrate. The semiconductor substrate 205 may include a compound semiconductor and/or an alloy semiconductor. The semiconductor substrate 205 may include various doping configurations to satisfy one or more design parameters. For example, different doping profiles (e.g., n-wells, p-wells) may be formed on the semiconductor substrate 205 in regions designed for different device types (e.g., p-type metal-oxide semiconductor (PMOS) nanostructure transistors, n-type metal-oxide semiconductor (NMOS) nanostructure transistors). The suitable doping may include ion implantation of dopants and/or diffusion processes. Further, the semiconductor substrate 205 may include an epitaxial layer (epi-layer), may be strained for performance enhancement, and/or may have other suitable enhancement features. The semiconductor substrate 205 may include a portion of a semiconductor wafer on which other semiconductor devices are formed.

Mesa regions 210 are included above (and/or extend above) the semiconductor substrate 205. A mesa region 210 provides a structure on which nanostructures of the semiconductor device 200 are formed, such as nanostructure channels, nanostructure gate portions that wrap around each of the nanostructure channels, and/or sacrificial nanostructures, among other examples. In some implementations, one or more mesa regions 210 are formed in and/or from a fin structure (e.g., a silicon fin structure) that is formed in the semiconductor substrate 205. The mesa regions 210 may include the same material as the semiconductor substrate 205 and are formed from the semiconductor substrate 205. In some implementations, the mesa regions 210 are doped to form different types of nanostructure transistors, such as p-type nanostructure transistors and/or n-type nanostructure transistors. In some implementations, the mesa regions 210 include silicon (Si) materials or another elementary semiconductor material such as germanium (Ge). In some implementations, the mesa regions 210 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof.

The mesa regions 210 are fabricated by suitable semiconductor process techniques, such as masking, photolithography, and/or etch processes, among other examples. As an example, fin structures may be formed by etching a portion of the semiconductor substrate 205 away to form recesses in the semiconductor substrate 205. The recesses may then be filled with isolating material that is recessed or etched back to form shallow trench isolation (STI) regions 215 above the semiconductor substrate 205 and between the fin structures. Source/drain recesses may be formed in the fin structures, which results in formation of the mesa regions 210 between the source/drain recesses. However, other fabrication techniques for the STI regions 215 and/or for the mesa regions 210 may be used.

The STI regions 215 may electrically isolate adjacent fin structures and may provide a layer on which other layers and/or structures of the semiconductor device 200 are formed. The STI regions 215 may include a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. The STI regions 215 may include a multi-layer structure, for example, having one or more liner layers.

The semiconductor device 200 includes a plurality of nanostructure channels 220 that extend between, and are electrically coupled with, source/drain regions 225. Source/drain region(s) may refer to a source or a drain, individually or collectively dependent upon the context. The nanostructure channels 220 are arranged in a direction that is approximately perpendicular to the semiconductor substrate 205. In other words, the nanostructure channels 220 are vertically arranged or stacked above the semiconductor substrate 205.

The nanostructure channels 220 include silicon-based nanostructures (e.g., nanosheets or nanowires, among other examples) that function as the semiconductive channels of the nanostructure transistor(s) of the semiconductor device 200. In some implementations, the nanostructure channels 220 may include silicon germanium (SiGe) or another silicon-based material. The source/drain regions 225 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the semiconductor device 200 may include p-type metal-oxide semiconductor (PMOS) nanostructure transistors that include p-type source/drain regions 225, n-type metal-oxide semiconductor (NMOS) nanostructure transistors that include n-type source/drain regions 225, and/or other types of nanostructure transistors.

In some implementations, a buffer region 230 is included under a source/drain region 225 between the source/drain region 225 and a fin structure above the semiconductor substrate 205. A buffer region 230 may provide isolation between a source/drain region 225 and adjacent mesa regions 210. A buffer region 230 may be included to reduce, minimize, and/or prevent electrons from traversing into the mesa regions 210 (e.g., instead of through the nanostructure channels 220, thereby reducing current leakage), and/or may be included to reduce, minimize and/or prevent dopants from the source/drain region 225 into the mesa regions 210 (which reduces short channel effects).

A capping layer 235 may be included over and/or on the source/drain region 225. The capping layer 235 may include silicon, silicon germanium, doped silicon, doped silicon germanium, and/or another material. The capping layer 235 may be included to reduce dopant diffusion and to protect the source/drain regions 225 in semiconductor processing operations for the semiconductor device 200 prior to contact formation. Moreover, the capping layer 235 may contribute to metal-semiconductor (e.g., silicide) alloy formation.

At least a subset of the nanostructure channels 220 extend through one or more gate structures 240. The gate structures 240 may be formed of one or more metal materials, one or more high dielectric constant (high-k) materials, and/or one or more other types of materials. In some implementations, dummy gate structures (e.g., polysilicon (PO) gate structures or another type of gate structures) are formed in the place of (e.g., prior to formation of) the gate structures 240 so that one or more other layers and/or structures of the semiconductor device 200 may be formed prior to formation of the gate structures 240. This reduces and/or prevents damage to the gate structures 240 that would otherwise be caused by the formation of the one or more layers and/or structures. A replacement gate process (RGP) is then performed to remove the dummy gate structures and replace the dummy gate structures with the gate structures 240 (e.g., replacement gate structures).

As further shown in FIG. 2, portions of a gate structure 240 are formed in between pairs of nanostructure channels 220 in an alternating vertical arrangement. In other words, the semiconductor device 200 includes one or more vertical stacks of alternating nanostructure channels 220 and portions of a gate structure 240, as shown in FIG. 2. In this way, a gate structure 240 wraps around an associated nanostructure channel 220 on multiple sides of the nanostructure channel 220 which increases control of the nanostructure channel 220, increases drive current for the nanostructure transistor(s) of the semiconductor device 200, and reduces short channel effects (SCEs) for the nanostructure transistor (s) of the semiconductor device 200.

Some source/drain regions 225 and gate structures 240 may be shared between two or more nanoscale transistors of the semiconductor device 200. In these implementations, one or more source/drain regions 225 and a gate structure 240 may be connected or coupled to a plurality of nanostructure channels 220, as shown in the example in FIG. 2. This enables the plurality of nanostructure channels 220 to be controlled by a single gate structure 240 and a pair of source/drain regions 225.

Inner spacers (InSP) 245 may be included between a source/drain region 225 and an adjacent gate structure 240. In particular, inner spacers 245 may be included between a source/drain region 225 and portions of a gate structure 240 that wrap around a plurality of nanostructure channels 220. The inner spacers 245 are included on ends of the portions of the gate structure 240 that wrap around the plurality of nanostructure channels 220. The inner spacers 245 are included in cavities that are formed in between end portions of adjacent nanostructure channels 220. The inner spacer 245 are included to reduce parasitic capacitance and to protect the source/drain regions 225 from being etched in a nanosheet release operation to remove sacrificial nanosheets between the nanostructure channels 220. The inner spacers 245 include a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material.

The semiconductor device 200 may also include an interlayer dielectric (ILD) layer 250 above the STI regions 215. The ILD layer 250 may be referred to as an ILDO layer. The ILD layer 250 surrounds the gate structures 240 to provide electrical isolation and/or insulation between the gate structures 240 and/or the source/drain regions 225, among other examples. Conductive structures such as contacts and/or interconnects may be formed through the ILD layer 250 to the source/drain regions 225 and the gate structures 240 to provide control of the source/drain regions 225 and the gate structures 240.

As indicated above, FIG. 2 is provided as an example. Other examples may differ from what is described with regard to FIG. 2.

Figure 3A:
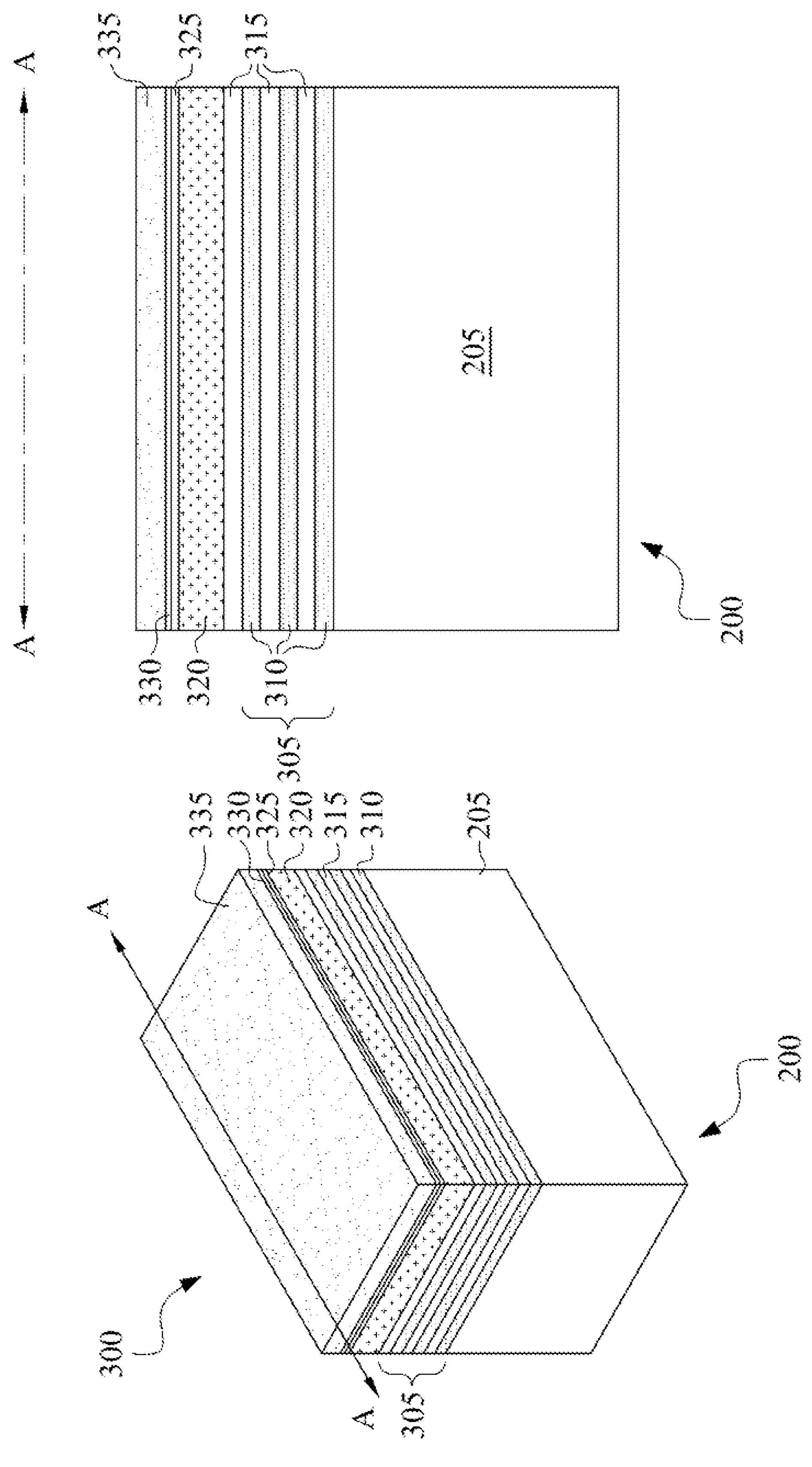
FIGS. 3A and 3B are diagrams of an example implementation of a fin formation process described herein.
Figure 3B:
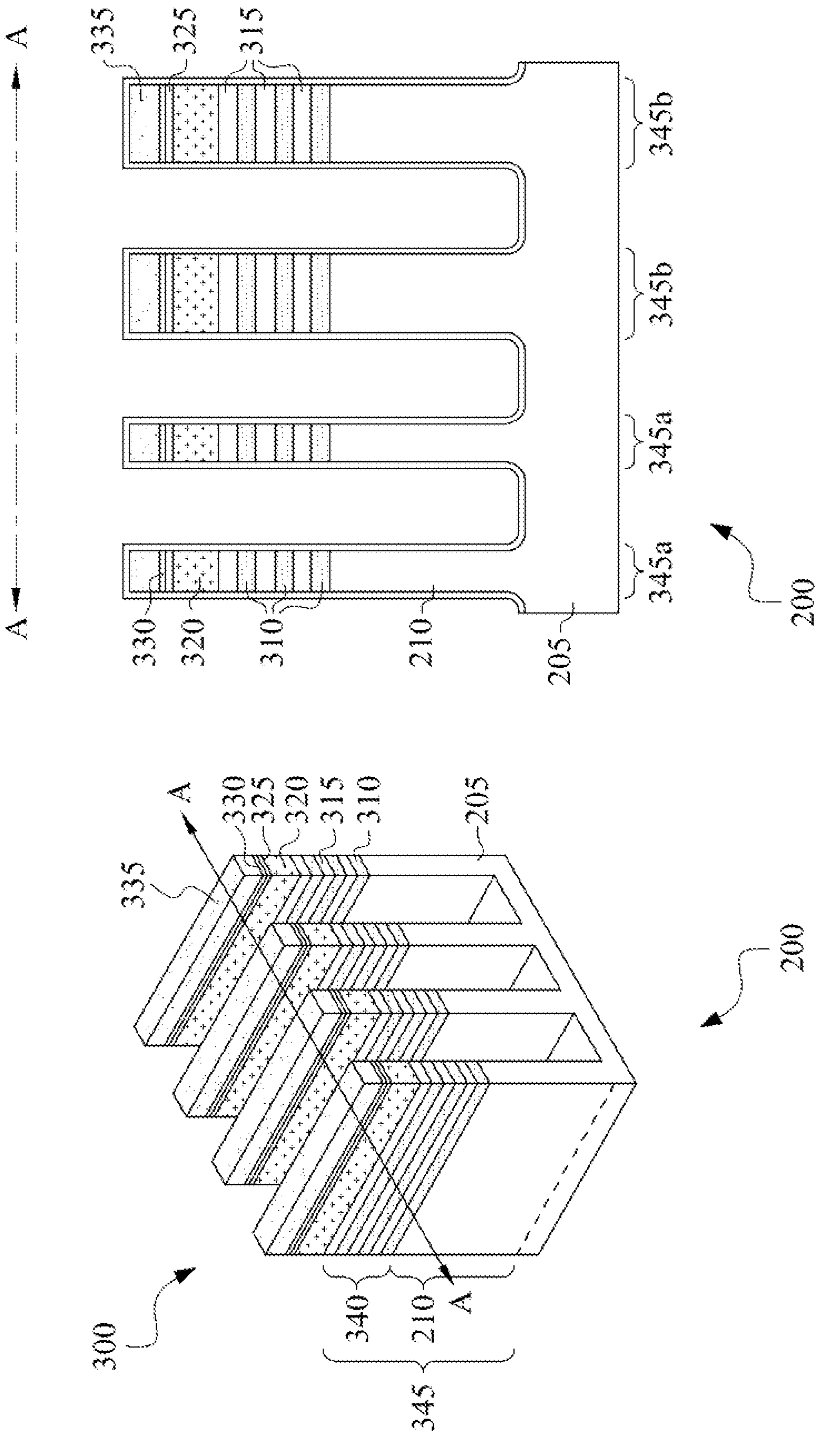

FIGS. 3A and 3B are diagrams of an example implementation 300 of a fin formation process described herein. The example implementation 300 includes an example of forming fin structures for the semiconductor device 200 or a portion thereof. The semiconductor device 200 may include one or more additional devices, structures, and/or layers not shown in FIGS. 3A and 3B. The semiconductor device 200 may include additional layers and/or dies formed on layers above and/or below the portion of the semiconductor device 200 shown in FIGS. 3A and 3B. Additionally, or alternatively, one or more additional semiconductor structures and/or semiconductor devices may be formed in a same layer of an electronic device that includes the semiconductor device 200.

FIG. 3A illustrates a perspective view of the semiconductor device 200 and a cross-sectional view along the line A-A in the perspective view. As shown in FIGS. 3A, processing of the semiconductor device 200 is performed in connection with the semiconductor substrate 205. A layer stack 305 is formed on the semiconductor substrate 205. The layer stack 305 may be referred to as a superlattice. In some implementations, one or more operations are performed in connection with the semiconductor substrate 205 prior to formation of the layer stack 305. For example, an anti-punch through (APT) implant operation may be performed. The APT implant operation may be performed in one or more regions of the semiconductor substrate 205 above which the nanostructure channels 220 are to be formed. The APT implant operation is performed, for example, to reduce and/or prevent punch-through or unwanted diffusion into the semiconductor substrate 205.

The layer stack 305 includes a plurality of alternating layers that are arranged in a direction that is approximately perpendicular to the semiconductor substrate 205. For example, the layer stack 305 includes vertically alternating layers of first layers 310 and second layers 315 above the semiconductor substrate 205. The quantity of the first layers 310 and the quantity of the second layers 315 illustrated in FIG. 3A are examples, and other quantities of the first layers 310 and the second layers 315 are within the scope of the present disclosure. In some implementations, the first layers 310 and the second layers 315 are formed to different thicknesses. For example, the second layers 315 may be formed to a thickness that is greater relative to a thickness of the first layers 310. In some implementations, the first layers 310 (or a subset thereof) are formed to a thickness in a range of approximately 4 nanometers to approximately 7 nanometers. In some implementations, the second layers 315 (or a subset thereof) are formed to a thickness in a range of approximately 8 nanometers to approximately 12 nanometers. However, other values for the thickness of the first layers 310 and for the thickness of the second layers 315 are within the scope of the present disclosure.

The first layers 310 include a first material composition, and the second layers 315 include a second material composition. In some implementations, the first material composition and the second material composition are the same material composition. In some implementations, the first material composition and the second material composition are different material compositions. As an example, the first layers 310 may include silicon germanium (SiGe) and the second layers 315 may include silicon (Si). In some implementations, the first material composition and the second material composition have different oxidation rates and/or etch selectivity.

As described herein, the second layers 315 may be processed to form the nanostructure channel 220 for subsequently-formed nanostructure transistors of the semiconductor device 200. The first layers 310 are sacrificial nanostructures that are eventually removed and serve to define a vertical distance between adjacent nanostructure channels 220 for a subsequently-formed gate structure 240 of the semiconductor device 200. Accordingly, the first layers 310 are referred to herein as sacrificial layers, and the second layers 315 may be referred to as channel layers.

The deposition tool 102 deposits and/or grows the alternating layers of the layer stack 305 to include nanostructures (e.g., nanosheets) on the semiconductor substrate 205. For example, the deposition tool 102 grows the alternating layers by epitaxial growth. However, other processes may be used to form the alternating layers of the layer stack 305. Epitaxial growth of the alternating layers of the layer stack 305 may be performed by a molecular beam epitaxy (MBE) process, a metalorganic chemical vapor deposition (MOCVD) process, and/or another suitable epitaxial growth process. In some implementations, the epitaxially grown layers such as the second layers 315 include the same material as the material of the semiconductor substrate 205. In some implementations, the first layers 310 and/or the second layers 315 include a material that is different from the material of the semiconductor substrate 205. As described above, in some implementations, the first layers 310 include epitaxially grown silicon germanium (SiGe) layers and the second layers 315 include epitaxially grown silicon (Si) layers. Alternatively, the first layers 310 and/or the second layers 315 may include other materials such as germanium (Ge), a compound semiconductor material such as silicon carbide (SiC), gallium arsenide (GaAs), gallium phosphide (GaP), indium phosphide (InP), indium arsenide (IAs), indium antimonide (InSb), an alloy semiconductor such as silicon germanium (SiGe), gallium arsenide phosphide (GaAsP), aluminum indium arsenide (AlInAs), aluminum gallium arsenide (AlGaAs), indium gallium arsenide (InGaAs), gallium indium phosphide (GaInP), gallium indium arsenide phosphide (GaInAsP), and/or a combination thereof. The material(s) of the first layers 310 and/or the material(s) of the second layers 315 may be chosen based on providing different oxidation properties, different etching selectivity properties, and/or other different properties.

As further shown in FIG. 3A, the deposition tool 102 may form one or more additional layers over and/or on the layer stack 305. For example, a hard mask (HM) layer 320 may be formed over and/or on the layer stack 305 (e.g., on the top-most second layer 315 of the layer stack 305). As another example, a capping layer 325 may be formed over and/or on the hard mask layer 320. As another example, another hard mask layer including an oxide layer 330 and a nitride layer 335 may be formed over and/or on the capping layer 325. The one or more hard mask (HM) layers 320, 325, and 330 may be used to form one or more structures of the semiconductor device 200. The oxide layer 330 may function as an adhesion layer between the layer stack 305 and the nitride layer 335, and may act as an etch stop layer for etching the nitride layer 335. The one or more hard mask layers 320, 325, and 330 may include silicon germanium (SiGe), a silicon nitride ($Si_xN_y$), a silicon oxide ($SiO_x$), and/or another material. The capping layer 325 may include silicon (Si) and/or another material. In some implementations, the capping layer 325 is formed of the same material as the semiconductor substrate 205. In some implementations, the one or more additional layers are thermally grown, deposited by CVD, PVD, ALD, and/or are formed using another deposition technique.

FIG. 3B illustrates a perspective view of the semiconductor device 200 and a cross-sectional view along the line A-A. As shown in FIG. 3B, the layer stack 305 and the semiconductor substrate 205 are etched to remove portions of the layer stack 305 and portions of the semiconductor substrate 205. The portions 340 of the layer stack 305, and mesa regions 210 (also referred to as silicon mesas or mesa portions), remaining after the etch operation are referred to a fin structures 345 above the semiconductor substrate 205 of the semiconductor device 200. A fin structure 345 includes a portion 340 of the layer stack 305 over and/or on a mesa region 210 formed in and/or above the semiconductor substrate 205. The fin structures 345 may be formed by any suitable semiconductor processing technique. For example, the deposition tool 102, the exposure tool 104, the developer tool 106, and/or the etch tool 108 may form the fin structures 345 using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fin structures.

In some implementations, the deposition tool 102 forms a photoresist layer over and/or on the hard mask layer including the oxide layer 330 and the nitride layer 335, the exposure tool 104 exposes the photoresist layer to radiation (e.g., deep ultraviolet (UV) radiation, extreme UV (EUV) radiation), a post-exposure bake process is performed (e.g., to remove residual solvents from the photoresist layer), and the developer tool 106 develops the photoresist layer to form a masking element (or pattern) in the photoresist layer. In some implementations, patterning the photoresist layer to form the masking element is performed using an electron beam (e-beam) lithography process. The masking element may then be used to protect portions of the semiconductor substrate 205 and portions of the layer stack 305 in an etch operation such that the portions of the semiconductor substrate 205 and portions of the layer stack 305 remain non-etched to form the fin structures 345. Unprotected portions of the semiconductor substrate 205 and unprotected portions of the layer stack 305 are etched (e.g., by the etch tool 108) to form trenches in the semiconductor substrate 205. The etch tool 108 may etch the unprotected portions of the semiconductor substrate 205 and unprotected portions of the layer stack 305 using a dry etch technique (e.g., reactive ion etching), a wet etch technique, and/or a combination thereof.

In some implementations, another fin formation technique is used to form the fin structures 345. For example, a fin region may be defined (e.g., by mask or isolation regions), and the portions 340 may be epitaxially grown in the form of the fin structures 345. In some implementations, forming the fin structures 345 includes a trim process to decrease the width of the fin structures 345. The trim process may include wet and/or dry etching processes, among other examples.

As further shown in FIG. 3B, fin structures 345 may be formed for different types of nanostructure transistors for the semiconductor device 200. In particular, a first subset of fin structures 345*a* may be formed for p-type nanostructure transistors (e.g., p-type metal oxide semiconductor (PMOS) nanostructure transistors), and a second subset of fin structures 345*b* may be formed for n-type nanostructure transistors (e.g., n-type metal oxide semiconductor (NMOS) nanostructure transistors). The second subset of fin structures 345*b* may be doped with a p-type dopant (e.g., boron (B) and/or germanium (Ge), among other examples) and the first subset of fin structures 345*a* may be doped with an n-type dopant (e.g., phosphorous (P) and/or arsenic (As), among other examples). Additionally or alternatively, p-type source/drain regions 225 may be subsequently formed for the p-type nanostructure transistors that include the first subset of fin structures 345*a*, and n-type source/drain regions 225 may be subsequently formed for the n-type nanostructure transistors that include the second subset of fin structures 345*b*.

The first subset of fin structures 345*a* (e.g., PMOS fin structures) and the second subset of fin structures 345*b* (e.g., NMOS fin structures) may be formed to include similar properties and/or different properties. For example, the first subset of fin structures 345*a* may be formed to a first height and the second subset of fin structures 345*b* may be formed to a second height, where the first height and the second height are different heights. As another example, the first subset of fin structures 345*a* may be formed to a first width and the second subset of fin structures 345*b* may be formed to a second width, where the first width and the second width are different widths. In the example shown in FIG. 3B, the second width of the second subset of fin structures 345*b* (e.g., for the NMOS nanostructure transistors) is greater relative to the first width of the first subset of fin structures 345*a* (e.g., for the PMOS nanostructure transistors). However, other examples are within the scope of the present disclosure.

As indicated above, FIGS. 3A and 3B are provided as an example. Other examples may differ from what is described with regard to FIGS. 3A and 3B. Example implementation 300 may include additional operations, fewer operations, different operations, and/or a different order of operations than those described in connection with FIGS. 3A and 3B.

Figure 4A:
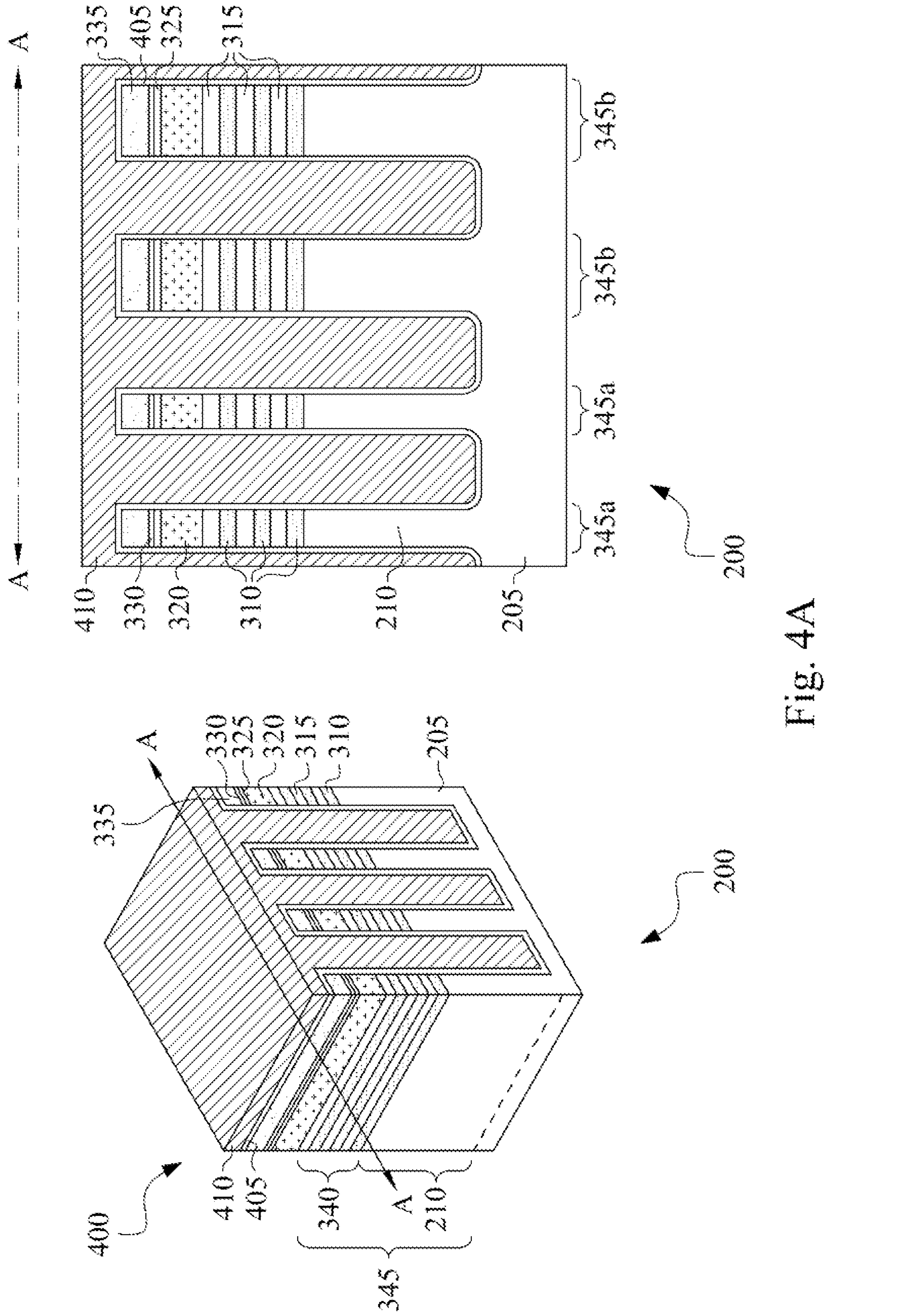
FIGS. 4A and 4B are diagrams of an example implementation of a shallow trench isolation (STI) process described herein.
Figure 4B:
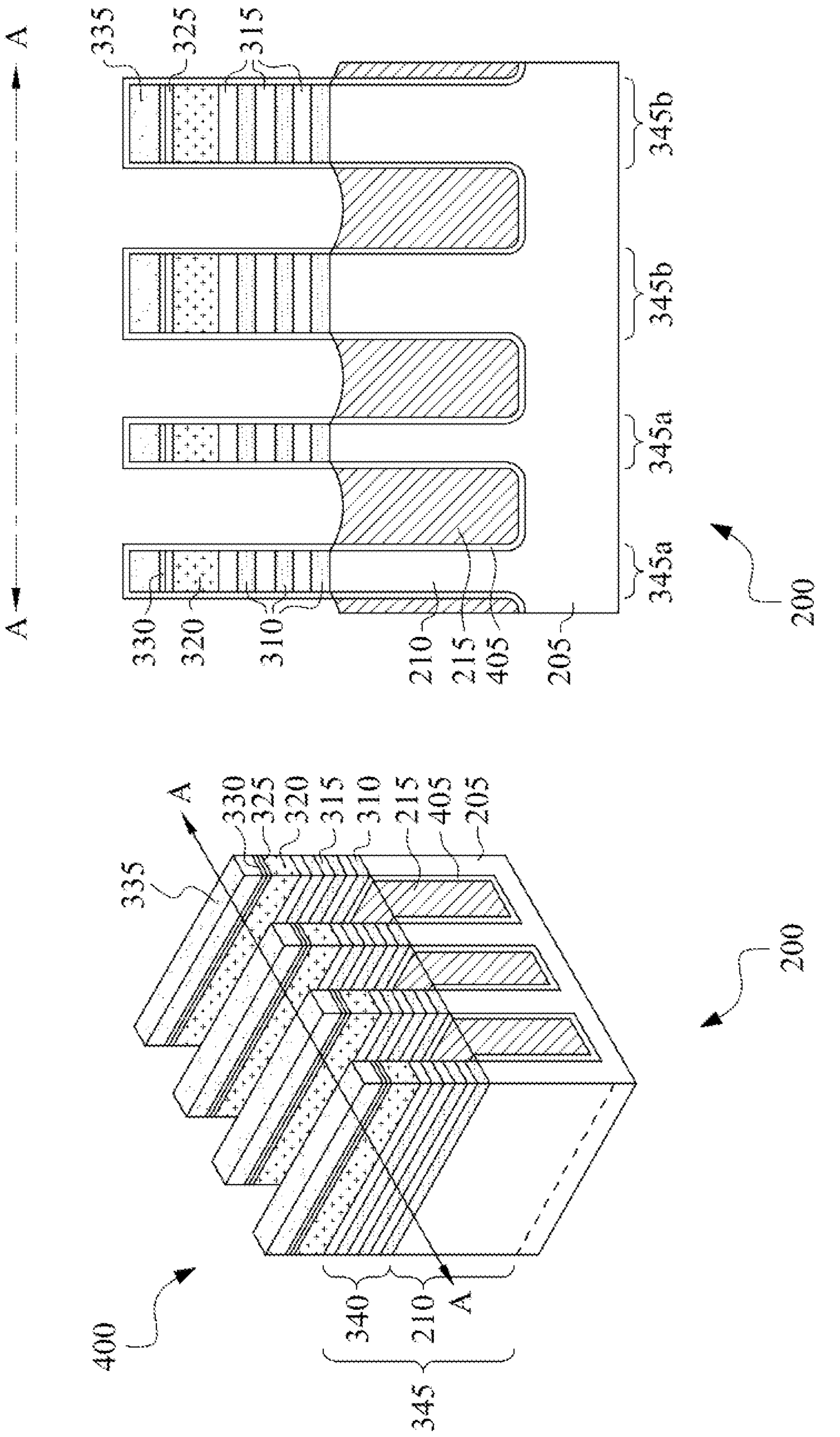

FIGS. 4A and 4B are diagrams of an example implementation 400 of an STI formation process described herein. The example implementation 400 includes an example of forming STI regions 215 between the fin structures 345 for the semiconductor device 200 or a portion thereof. The semiconductor device 200 may include one or more additional devices, structures, and/or layers not shown in FIGS. 4A and/or 4B. The semiconductor device 200 may include additional layers and/or dies formed on layers above and/or below the portion of the semiconductor device 200 shown in FIGS. 4A and 4B. Additionally, or alternatively, one or more additional semiconductor structures and/or semiconductor devices may be formed in a same layer of an electronic device that includes the semiconductor device 200. In some implementations, the operations described in connection with the example implementation 400 are performed after the processes described in connection with FIGS. 3A and 3B.

FIG. 4A illustrates a perspective view of the semiconductor device 200 and a cross-sectional view along the line A-A. As shown in FIG. 4A, a liner 405 and a dielectric layer 410 are formed above the semiconductor substrate 205 and interposing (e.g., in between) the fin structures 345. The deposition tool 102 may deposit the liner 405 and the dielectric layer 410 over the semiconductor substrate 205 and in the trenches between the fin structures 345. The deposition tool 102 may form the dielectric layer 410 such that a height of a top surface of the dielectric layer 410 and a height of a top surface of the nitride layer 335 are approximately a same height.

Alternatively, the deposition tool 102 may form the dielectric layer 410 such that the height of the top surface of the dielectric layer 410 is greater relative to the height of the top surface of the nitride layer 335, as shown in FIG. 4A. In this way, the trenches between the fin structures 345 are overfilled with the dielectric layer 410 to ensure the trenches are fully filled with the dielectric layer 410. Subsequently, the planarization tool 110 may perform a planarization or polishing operation (e.g., a CMP operation) to planarize the dielectric layer 410. The nitride layer 335 of the hard mask layer may function as a CMP stop layer in the operation. In other words, the planarization tool 110 planarizes the dielectric layer 410 until reaching the nitride layer 335 of the hard mask layer. Accordingly, a height of top surfaces of the dielectric layer 410 and a height of top surfaces of the nitride layer 335 are approximately equal after the operation.

The deposition tool 102 may deposit the liner 405 using a conformal deposition technique. The deposition tool 102 may deposit the dielectric layer 410 using a CVD technique (e.g., a flowable CVD (FCVD) technique or another CVD technique), a PVD technique, an ALD technique, and/or another deposition technique. In some implementations, after deposition of the liner 405, the semiconductor device 200 is annealed, for example, to increase the quality of the liner 405.

The liner 405 and the dielectric layer 410 each includes a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. In some implementations, the dielectric layer 410 may include a multi-layer structure, for example, having one or more liner layers.

FIG. 4B illustrates a perspective view of the semiconductor device 200 and a cross-sectional view along the line A-A. As shown in FIG. 4B, an etch back operation is performed to remove portions of the liner 405 and portions of the dielectric layer 410 to form the STI regions 215. The etch tool 108 may etch the liner 405 and the dielectric layer 410 in the etch back operation to form the STI regions 215. The etch tool 108 etches the liner 405 and the dielectric layer 410 based on the hard mask layer (e.g., the hard mask layer including the oxide layer 330 and the nitride layer 335). The etch tool 108 etches the liner 405 and the dielectric layer 410 such that the height of the STI regions 215 are less than or approximately a same height as the bottom of the portions 340 of the layer stack 305. Accordingly, the portions 340 of the layer stack 305 extend above the STI regions 215. In some implementations, the liner 405 and the dielectric layer 410 are etched such that the heights of the STI regions 215 are less than heights of top surfaces of the mesa regions 210.

In some implementations, the etch tool 108 uses a dry etch technique to etch the liner 405 and the dielectric layer 410.

Ammonia ($NH_3$), hydrofluoric acid (HF), and/or another etchant may be used. The plasma-based dry etch technique may result in a reaction between the etchant(s) and the material of the liner 405 and the dielectric layer 410, including:

$$SiO_2 + 4HF \rightarrow SiF_4 + 2H_2O$$

where silicon dioxide ($SiO_2$) of the liner 405 and the dielectric layer 410 react with hydrofluoric acid to form byproducts including silicon tetrafluoride ($SiF_4$) and water ($H_2O$). The silicon tetrafluoride is further broken down by the hydrofluoric acid and ammonia to form an ammonium fluorosilicate ($(NH_4)_2SiF_6$) byproduct:

$$SiF_4 + 2HF + 2NH_3 \rightarrow (NH_4)_2SiF_6$$

The ammonium fluorosilicate byproduct is removed from a processing chamber of the etch tool 108. After removal of the ammonium fluorosilicate, a post-process temperature in a range of approximately 100 degrees Celsius to approximately 250 degrees Celsius is used to sublimate the ammonium fluorosilicate into constituents of silicon tetrafluoride ammonia and hydrofluoric acid.

In some implementations, the etch tool 108 etches the liner 405 and the dielectric layer 410 such that a height of the STI regions 215 between the first subset of fin structures 345*a* (e.g., for the PMOS nanostructure transistors) is greater relative to a height of the STI regions 215 between the second subset of fin structures 345*b* (e.g., for the NMOS nanostructure transistors). This primarily occurs due to the greater width of the fin structures 345*b* relative to the width of the fin structures 345*a*. Moreover, this results in a top surface of an STI region 215 between a fin structure 345*a* and a fin structure 345*b* being sloped or slanted (e.g., downward sloped from the fin structure 345*a* to the fin structure 345*b*, as shown in the example in FIG. 4B). The etchants used to etch the liner 405 and the dielectric layer 410 first experience physisorption (e.g., a physical bonding to the liner 405 and the dielectric layer 410) as a result of a Van der Waals force between the etchants and the surfaces of the liner 405 and the dielectric layer 410. The etchants become trapped by dipole movement force. The etchants then attach to dangling bonds of the liner 405 and the dielectric layer 410, and chemisorption begins. Here, the chemisorption of the etchant on the surface of the liner 405 and the dielectric layer 410 results in etching of the liner 405 and the dielectric layer 410. The greater width of the trenches between the second subset of fin structures 345*b* provides a greater surface area for chemisorption to occur, which results in a greater etch rate between the second subset of fin structures 345*b*. The greater etch rate results in the height of the STI regions 215 between the second subset of fin structures 345*b* being lesser relative to the height of the STI regions 215 between the first subset of fin structures 345*a*.

As indicated above, FIGS. 4A and 4B are provided as an example. Other examples may differ from what is described with regard to FIGS. 4A and 4B. Example implementation 400 may include additional operations, fewer operations, different operations, and/or a different order of operations than those described in connection with FIGS. 4A and 4B.

Figure 5:
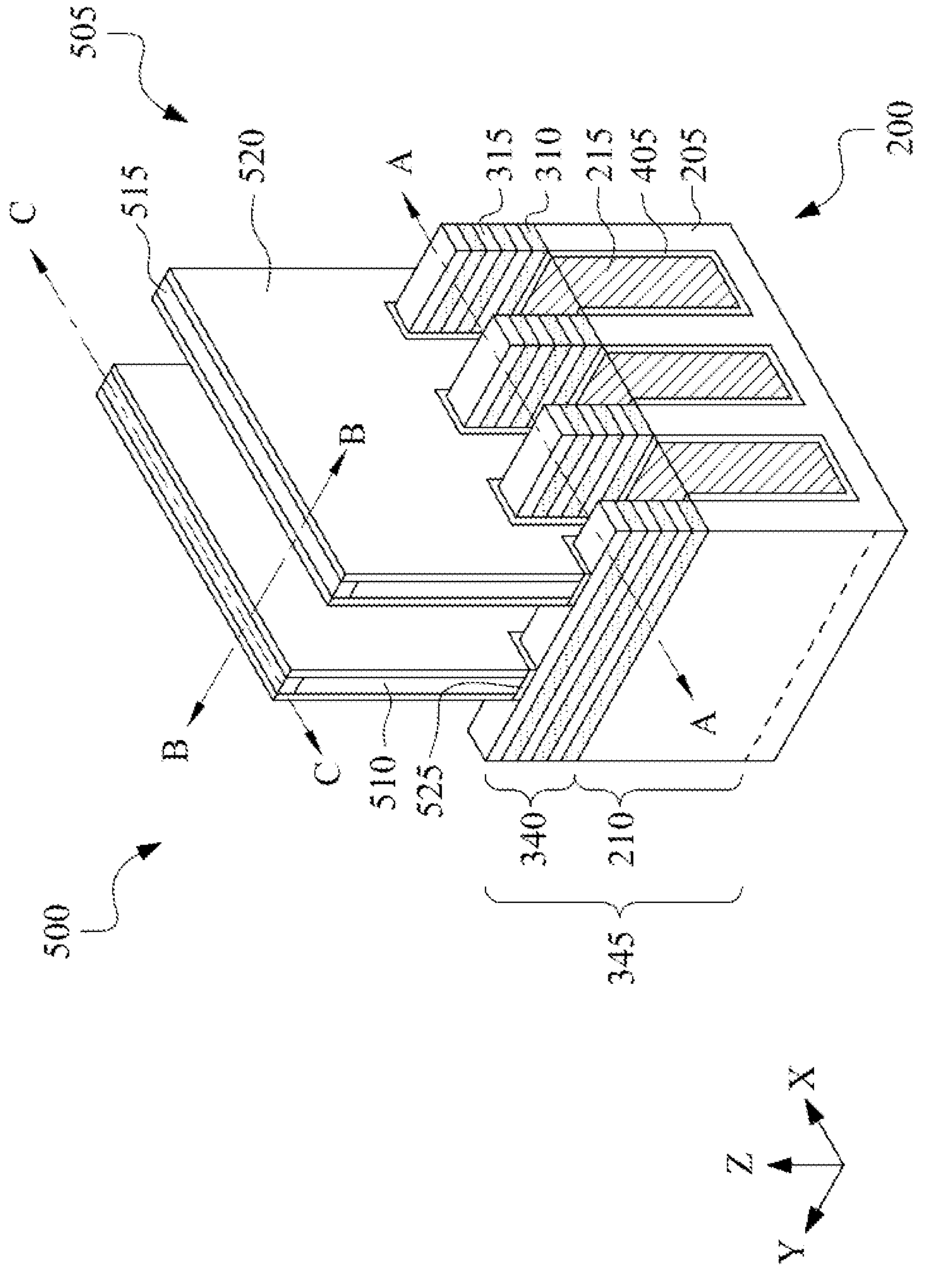
FIGS. 5 and 6 are diagrams of an example dummy gate structure formation process described herein.

FIG. 5 is a diagram of an example implementation 500 of a dummy gate formation process described herein. The example implementation 500 includes an example of forming dummy gate structures for the semiconductor device 200 or a portion thereof. The semiconductor device 200 may include one or more additional devices, structures, and/or layers not shown in FIG. 5. The semiconductor device 200 may include additional layers and/or dies formed on layers above and/or below the portion of the semiconductor device 200 shown in FIG. 5. Additionally, or alternatively, one or more additional semiconductor structures and/or semiconductor devices may be formed in a same layer of an electronic device that includes the semiconductor device 200. In some implementations, the operations described in connection with the example implementation 500 are performed after the processes described in connection with FIGS. 3A-4B.

FIG. 5 illustrates a perspective view of the semiconductor device 200. As shown in FIG. 5, dummy gate structures 505 (also referred to as dummy gate stacks or temporary gate structures) are formed over the fin structures 345. The dummy gate structures 505 are sacrificial structures that are to be replaced by replacement gate structures or replacement gate stacks (e.g., the gate structures 240) at a subsequent processing stage for the semiconductor device 200. Portions of the fin structures 345 underlying the dummy gate structures 505 may be referred to as channel regions. The dummy gate structures 505 may also define source/drain (S/D) regions of the fin structures 345, such as the regions of the fin structures 345 adjacent and on opposing sides of the channel regions.

A dummy gate structure 505 may include a gate electrode layer 510, a hard mask layer 515 over and/or on the gate electrode layer 510, and spacer layers 520 on opposing sides of the gate electrode layer 510 and on opposing sides of the hard mask layer 515. The dummy gate structures 505 may be formed on a gate dielectric layer 525 between the top-most second layer 315 and the dummy gate structures 505. The gate electrode layer 510 includes polycrystalline silicon (polysilicon or PO) or another material. The hard mask layer 515 includes one or more layers such as an oxide layer (e.g., a pad oxide layer that may include silicon dioxide ($SiO_2$) or another material) and a nitride layer (e.g., a pad nitride layer that may include a silicon nitride such as $Si_3N_4$ or another material) formed over the oxide layer. The spacer layers 520 include a silicon oxycarbide (SiOC), a nitrogen free SiOC, or another suitable material. The gate dielectric layer 525 may include a silicon oxide (e.g., $SiO_x$ such as $SiO_2$), a silicon nitride (e.g., $Si_xN_y$ such as $Si_3N_4$), a high-K dielectric material and/or another suitable material.

The layers of the dummy gate structures 505 may be formed using various semiconductor processing techniques such as deposition (e.g., by the deposition tool 102), patterning (e.g., by the exposure tool 104 and the developer tool 106), and/or etching (e.g., by the etch tool 108), among other examples. Examples include CVD, PVD, ALD, thermal oxidation, e-beam evaporation, photolithography, e-beam lithography, photoresist coating (e.g., spin-on coating), soft baking, mask aligning, exposure, post-exposure baking, photoresist developing, rinsing, drying (e.g., spin-drying and/or hard baking), dry etching (e.g., reactive ion etching), and/or wet etching, among other examples.

In some implementations, the gate dielectric layer 525 is conformally deposited on the semiconductor device 200 and then selectively removed from portions of the semiconductor device 200 (e.g., the source/drain areas). The gate electrode layer 510 is then deposited onto the remaining portions of the gate dielectric layer 525. The hard mask layers 515 are then deposited onto the gate electrode layers 510. The spacer layers 520 may be conformally deposited in a similar manner as the gate dielectric layer 525 and etched back such that the spacer layers 520 remain on the sidewalls of the dummy gate structures 505. In some implementations, the spacer layers 520 include a plurality of types of spacer layers. For example, the spacer layers 520 may include a seal spacer layer that is formed on the sidewalls of the dummy gate structures 505 and a bulk spacer layer that is formed on the seal spacer layer. The seal spacer layer and the bulk spacer layer may be formed of similar materials or different materials. In some implementations, the bulk spacer layer is formed without plasma surface treatment that is used for the seal spacer layer. In some implementations, the bulk spacer layer is formed to a greater thickness relative to the thickness of the seal spacer layer. In some implementations, the gate dielectric layer 525 is omitted from the dummy gate structure formation process and is instead formed in the replacement gate process.

FIG. 5 illustrates reference cross-sections that are used in subsequent figures described herein. Cross-section A-A is in an x-z plane (referred to as a y-cut) across the fin structures 345 in source/drain areas of the semiconductor device 200. Cross-section B-B is in a y-z plane (referred to as an x-cut) perpendicular to the cross-section A-A, and is across the dummy gate structures 505 in the source/drain areas of the semiconductor device 200. Cross-section C-C is in the x-z plane parallel to the cross-section A-A and perpendicular to the cross-section B-B, and is along a dummy gate structures 505. Subsequent figures refer to these reference cross-sections for clarity. In some figures, some reference numbers of components or features illustrated therein may be omitted to avoid obscuring other components or features for ease of depicting the figures.

As indicated above, FIG. 5 is provided as an example. Other examples may differ from what is described with regard to FIG. 5. Example implementation 500 may include additional operations, fewer operations, different operations, and/or a different order of operations than those described in connection with FIG. 5.

Figure 6:
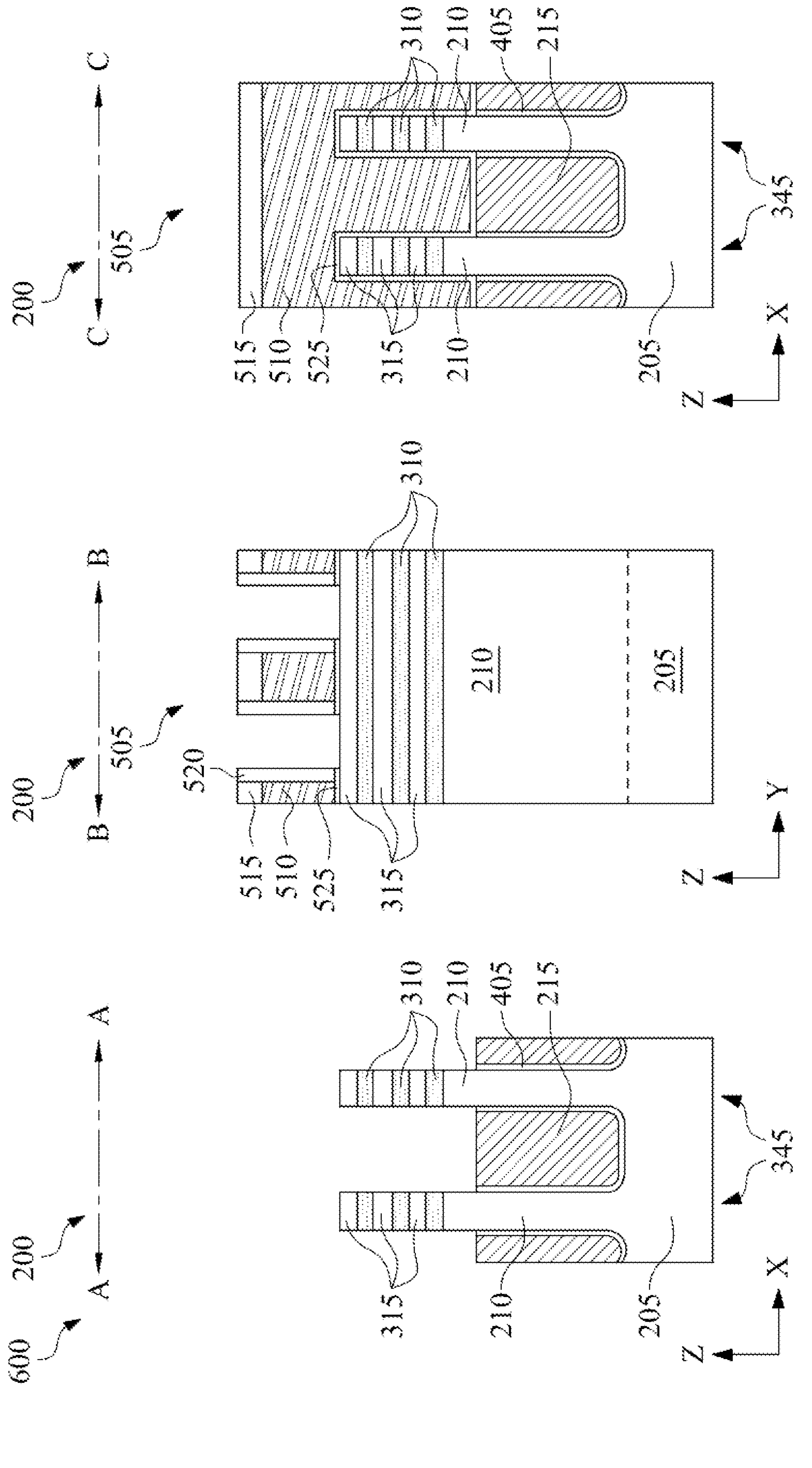

FIG. 6 is a diagram of an example implementation 600 of the semiconductor device 200 described herein. FIG. 6 includes cross-sectional views along the cross-sectional planes A-A, B-B, and C-C of FIG. 5. As shown in the cross-sectional planes B-B and C-C in FIG. 6, the dummy gate structures 505 are formed above the fin structures 345. As shown in the cross-sectional plane C-C in FIG. 6, portions of the gate dielectric layer 525 and portions of the gate electrode layers 510 are formed in recesses above the fin structures 345 that are formed as a result of the removal of the hard mask layer 320.

As indicated above, FIG. 6 is provided as an example. Other examples may differ from what is described with regard to FIG. 6. Example implementation 600 may include additional operations, fewer operations, different operations, and/or a different order of operations than those described in connection with FIG. 6.

FIGS. 7A-7D are diagrams of an example implementation 700 of a source/drain recess formation process and an inner spacer formation process described herein. The example implementation 700 includes an example of forming source/drain recesses 705 and the inner spacers 245 for the semiconductor device 200. FIGS. 7A-7D are illustrated from a plurality of perspectives illustrated in FIG. 5, including the perspective of the cross-sectional plane A-A in FIG. 5, the perspective of the cross-sectional plane B-B in FIG. 5, and the perspective of the cross-sectional plane C-C in FIG. 5. In some implementations, the operations described in connection with the example implementation 700 are performed after the processes described in connection with FIGS. 3A-6.

Figure 7A:
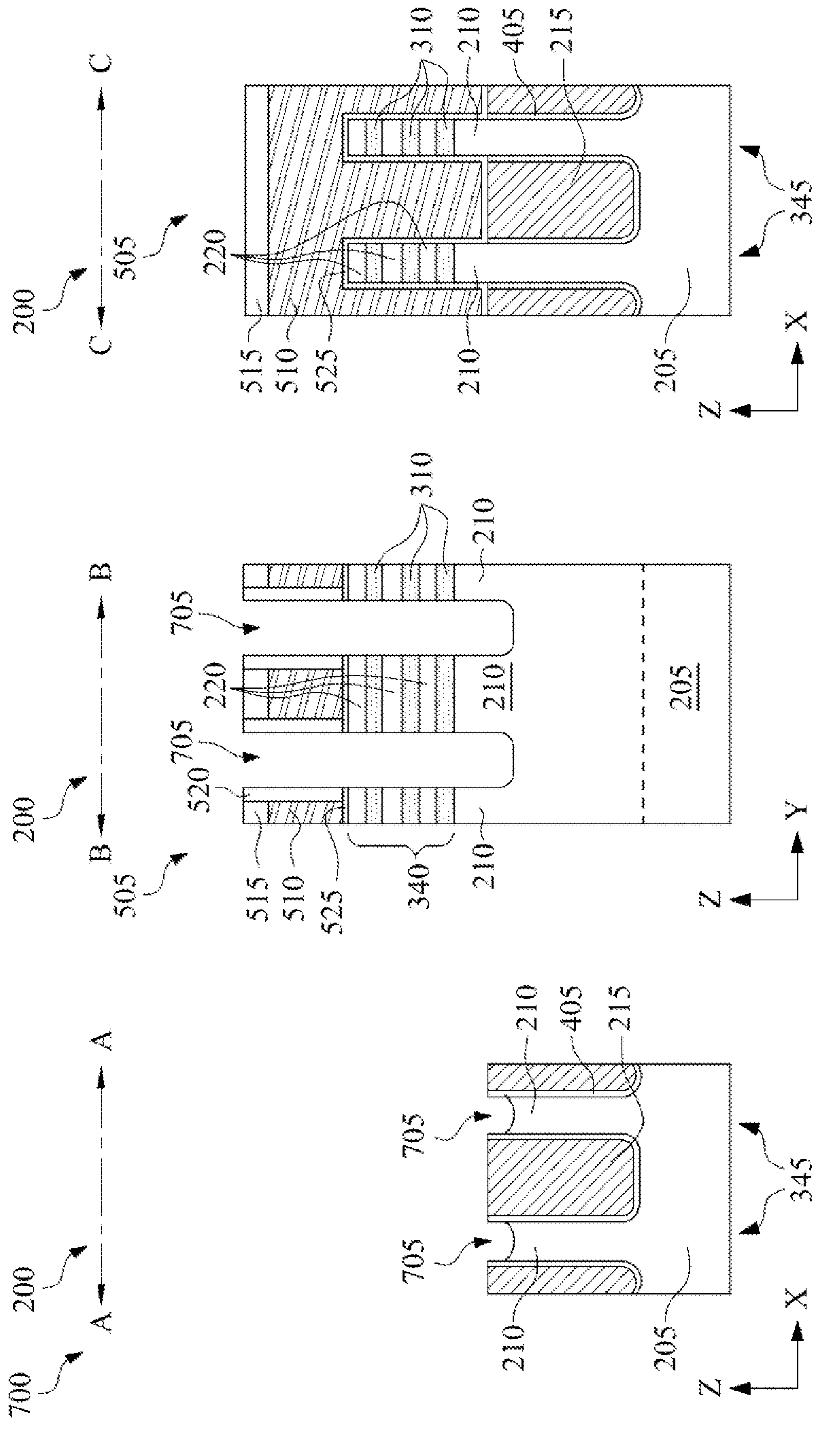
FIGS. 7A-7D are diagrams of example implementations of a source/drain recess formation process and an inner spacer formation process described herein.

As shown in the cross-sectional plane A-A and cross-sectional plane B-B in FIG. 7A, source/drain recesses 705 are formed in the portions 340 of the fin structure 345 in an etch operation. The source/drain recesses 705 are formed to provide spaces in which source/drain regions 225 are to be formed on opposing sides of the dummy gate structures 505. The etch operation may be performed by the etch tool 108 and may be referred to a strained source/drain (SSD) etch operation. In some implementations, the etch operation includes a plasma etch technique, a wet chemical etch technique, and/or another type of etch technique.

The source/drain recesses 705 also extend into a portion of the mesa regions 210 of the fin structure 345. This results in the formation of a plurality of mesa regions 210 in each fin structure 345, where sidewalls of the portions of each source/drain recess 705 below the portions 340 correspond to sidewalls of mesa regions 210. The source/drain recesses 705 may penetrate into a well portion (e.g., a p-well, an n-well) of the fin structure 345. In implementations in which the semiconductor substrate 205 includes a silicon (Si) material having a (100) orientation, (111) faces are formed at bottoms of the source/drain recesses 705, resulting in formation of a V-shape or a triangular shape cross section at the bottoms of the source/drain recesses 705. In some implementations, a wet etching using tetramethylammonium hydroxide (TMAH) and/or a chemical dry etching using hydrochloric acid (HCl) are employed to form the V-shape profile. However, the cross section at the bottoms of the source/drain recesses 705 may include other shapes, such as round or semi-circular, among other examples.

As shown in the cross-sectional plane B-B and the cross-sectional plane C-C in FIG. 7A, portions of the first layers 310 and portions of the second layers 315 of the layer stack 305 remain under the dummy gate structures 505 after the etch operation to form the source/drain recesses 705. The portions of the second layers 315 under the dummy gate structures 505 form the nanostructure channels 220 of the nanostructure transistors of the semiconductor device 200. The nanostructure channels 220 extend between adjacent source/drain recesses 705.

Figure 7B:
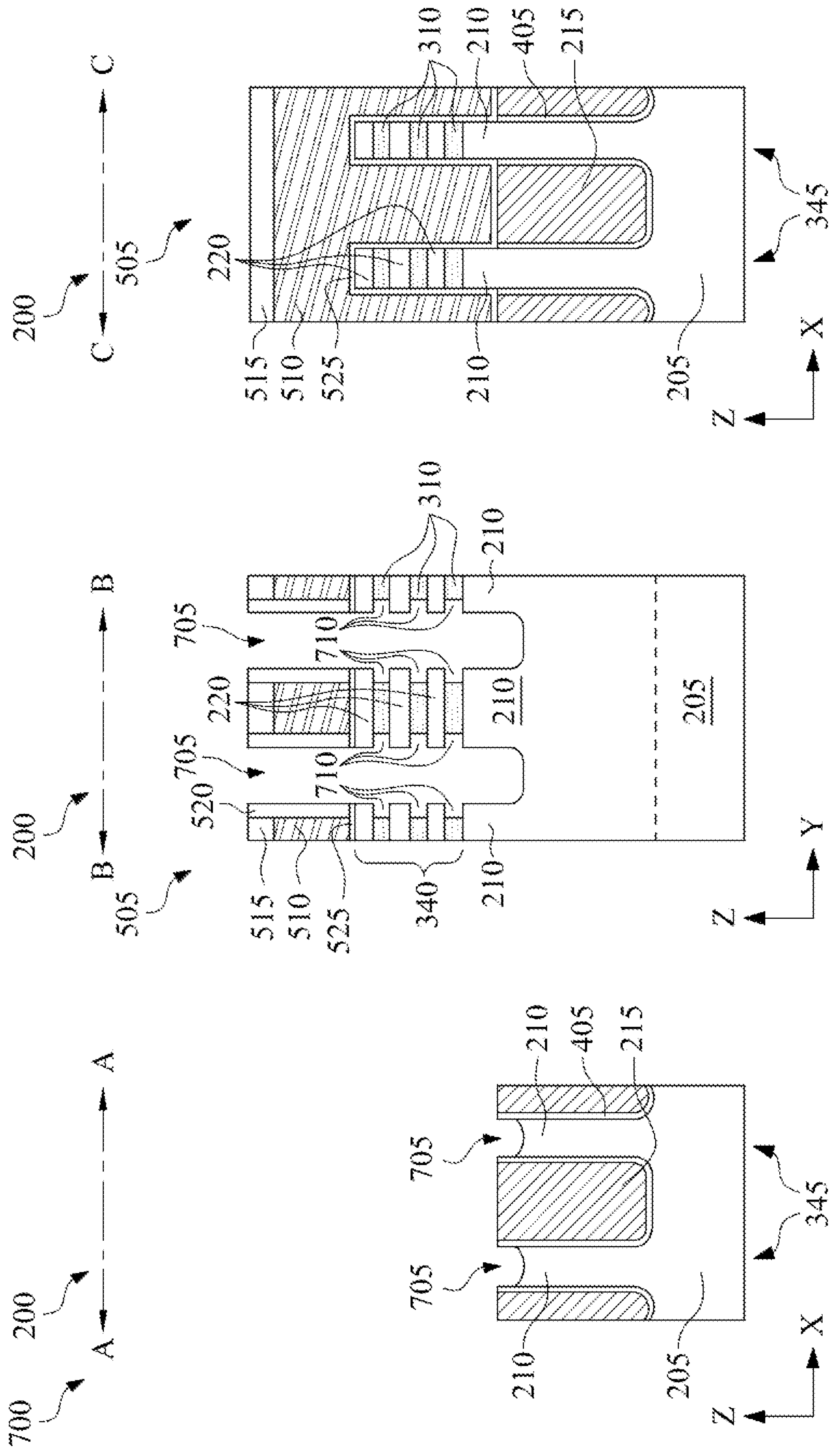

As shown in the cross-sectional plane B-B in FIG. 7B, the first layers 310 are laterally etched (e.g., in a direction that is approximately parallel to a length of the first layers 310) in an etch operation, thereby forming cavities 710 between portions of the nanostructure channels 220. In particular, the etch tool 108 laterally etches ends of the first layers 310 under the dummy gate structures 505 through the source/drain recesses 705 to form the cavities 710 between ends of the nanostructure channels 220. In implementations where the first layers 310 are silicon germanium (SiGe) and the second layers 315 are silicon (Si), the etch tool 108 may selectively etch the first layers 310 using a wet etchant such as, a mixed solution including hydrogen peroxide ($H_2O_2$), acetic acid ($CH_3COOH$), and/or hydrogen fluoride (HF), followed by cleaning with water ($H_2O$). The mixed solution and the water may be provided into the source/drain recesses 705 to etch the first layers 310 from the source/drain recesses 705. In some embodiments, the etching by the mixed solution and cleaning by water is repeated approximately 10 to approximately 20 times. The etching time by the mixed solution is in a range from about 1 minute to about 2 minutes in some implementations. The mixed solution may be used at a temperature in a range of approximately 60° Celsius to approximately 90° Celsius. However, other values for the parameters of the etch operation are within the scope of the present disclosure.

The cavities 710 may be formed to an approximately curved shape, an approximately concave shape, an approximately triangular shape, an approximately square shape, or to another shape. In some implementations, the depth of one or more of the cavities 710 (e.g., the dimension of the cavities extending into the first layers 310 from the source/drain recesses 705) is in a range of approximately 0.5 nanometers to about 5 nanometers. In some implementations, the depth of one or more of the cavities 710 is in a range of approximately 1 nanometer to approximately 3 nanometers. However, other values for the depth of the cavities 710 are within the scope of the present disclosure. In some implementations, the etch tool 108 forms the cavities 710 to a length (e.g., the dimension of the cavities extending from a nanostructure channel 220 below a first layer 310 to another nanostructure channel 220 above the first layer 310) such that the cavities 710 partially extend into the sides of the nanostructure channels 220 (e.g., such that the width or length of the cavities 710 are greater than the thickness of the first layers 310). In this way, the inner spacers that are to be formed in the cavities 710 may extend into a portion of the ends of the nanostructure channels 220.

Figure 7C:
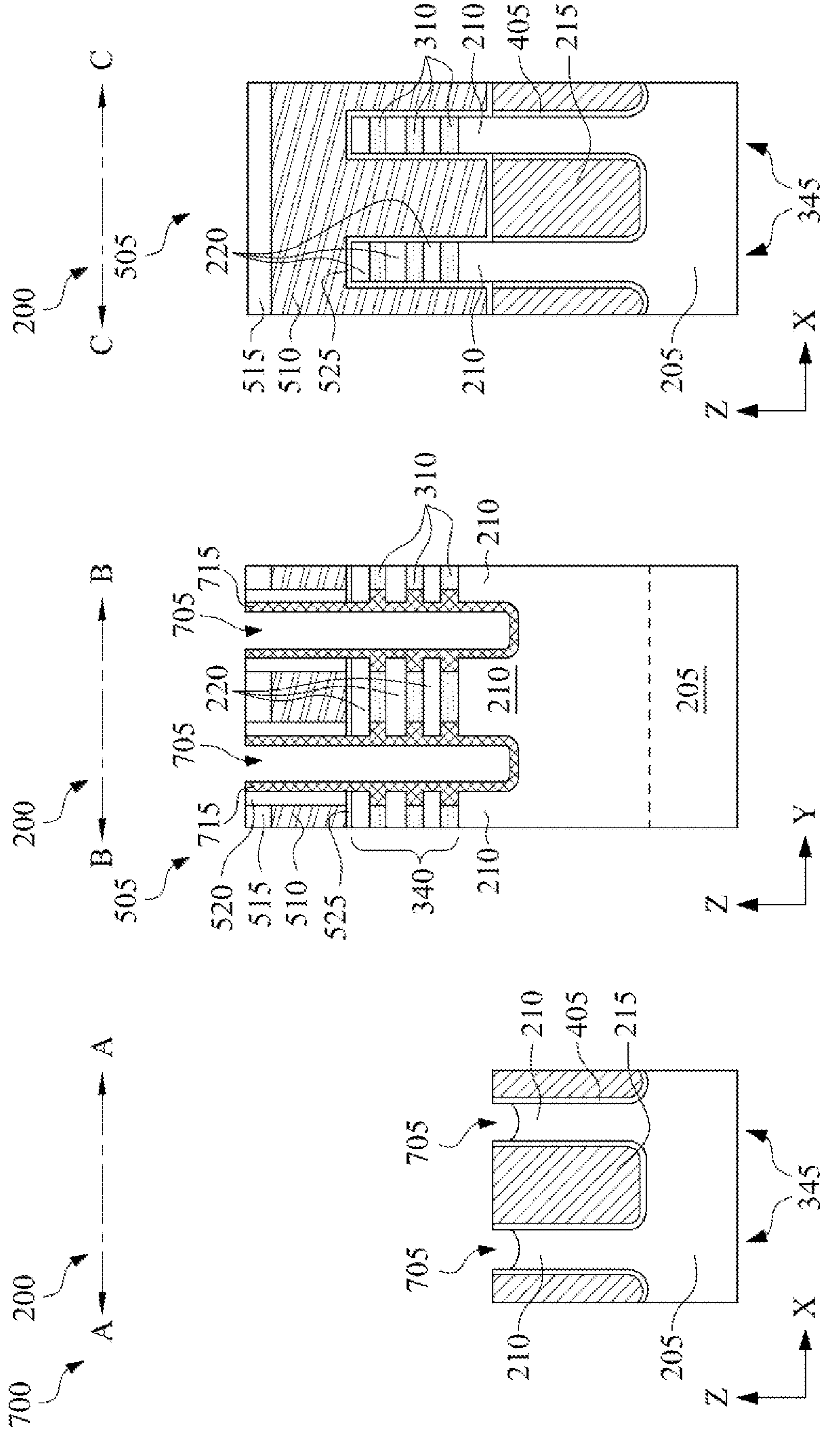

As shown in the cross-sectional plane A-A and in the cross-sectional plane B-B in FIG. 7C, an insulating layer 715 is conformally deposited along the bottom and along the sidewalls of the source/drain recesses 705. The insulating layer 715 further extends along the spacer layer 520. The deposition tool 102 may deposit the insulating layer 715 using a CVD technique, a PVD technique, and ALD technique, and/or another deposition technique. The insulating layer 715 includes a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material. The insulating layer 715 may include a material that is different from the material of spacer layers 520.

The deposition tool 102 forms the insulating layer 715 to a thickness sufficient to fill in the cavities 710 between the nanostructure channels 220 with the insulating layer 715. For example, the insulating layer 715 may be formed to a thickness in a range of approximately 1 nanometer to approximately 10 nanometers. As another example, the insulating layer 715 may be formed to a thickness in a range of approximately 2 nanometers to approximately 5 nanometers. However, other values for the thickness of the insulating layer 715 are within the scope of the present disclosure.

Figure 7D:
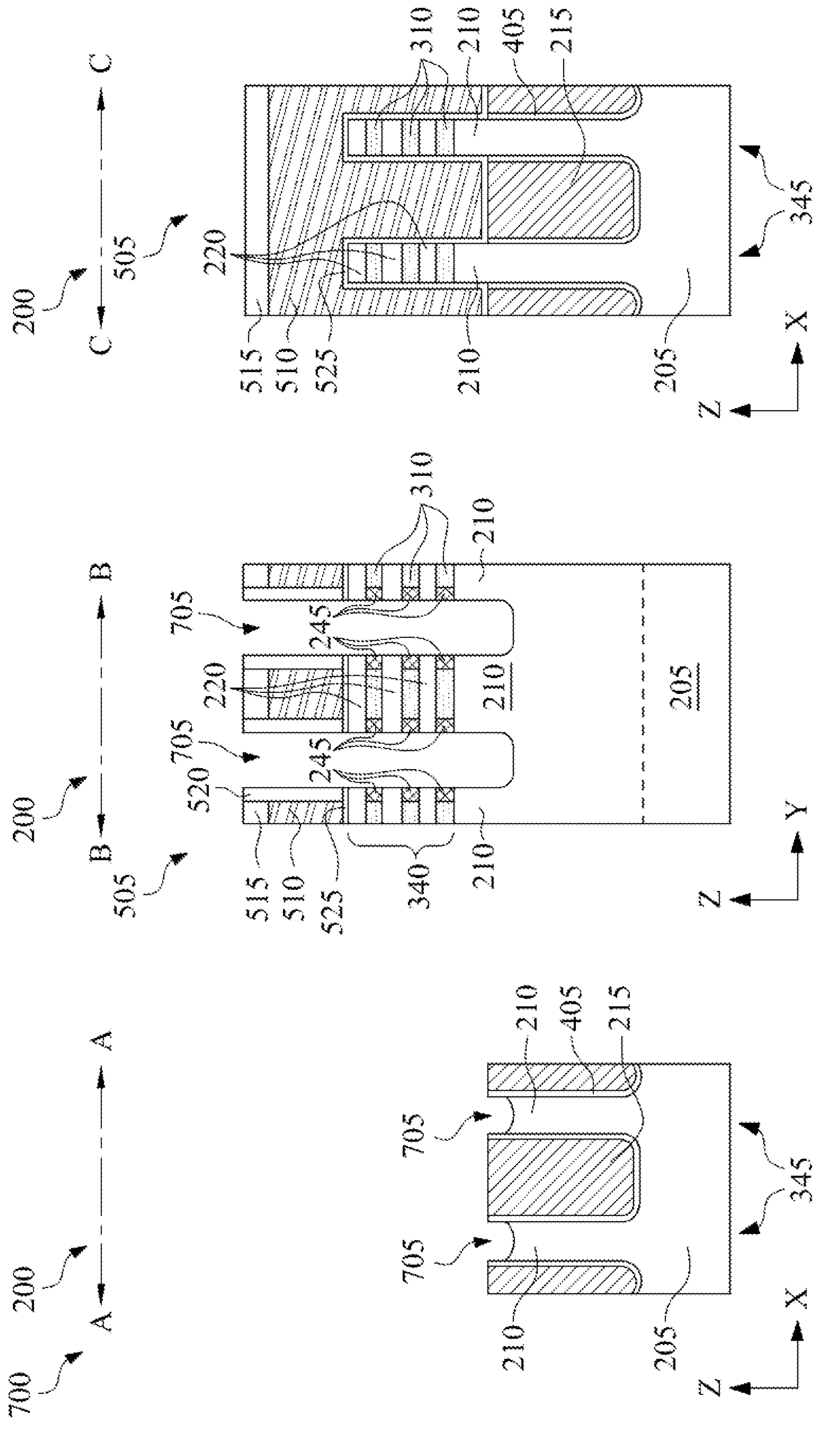

As shown in the cross-sectional plane A-A and in the cross sectional plane B-B in FIG. 7D, the insulating layer 715 is partially removed such that remaining portions of the insulating layer 715 correspond to the inner spacers 245 in the cavities 710. The etch tool 108 may perform an etch operation to partially remove the insulating layer 715.

In some implementations, the etch operation may result in the surfaces of the inner spacers 245 facing the source/drain recesses 705 being curved or recessed. The depth of the recesses in the inner spacers 245 may be in a range of approximately 0.2 nanometers to approximately 3 nanometers. As another example, the depth of the recesses in the inner spacers 245 may be in a range of approximately 0.5 nanometers to approximately 2 nanometers. As another example, the depth of the recesses in the inner spacers 245 may be in a range of less than approximately 0.5 nanometers. In some implementations, the surfaces of the inner spacers 245 facing the source/drain recesses 705 are approximately flat such that the surfaces of the inner spacers 245 and the surfaces of the ends of the nanostructure channels 220 are approximately even and flush.

As indicated above, FIGS. 7A-7D are provided as examples. Other examples may differ from what is described with regard to FIGS. 7A-7D. Example implementation 700 may include additional operations, fewer operations, different operations, and/or a different order of operations than those described in connection with FIGS. 7A-7D.

Figure 8:
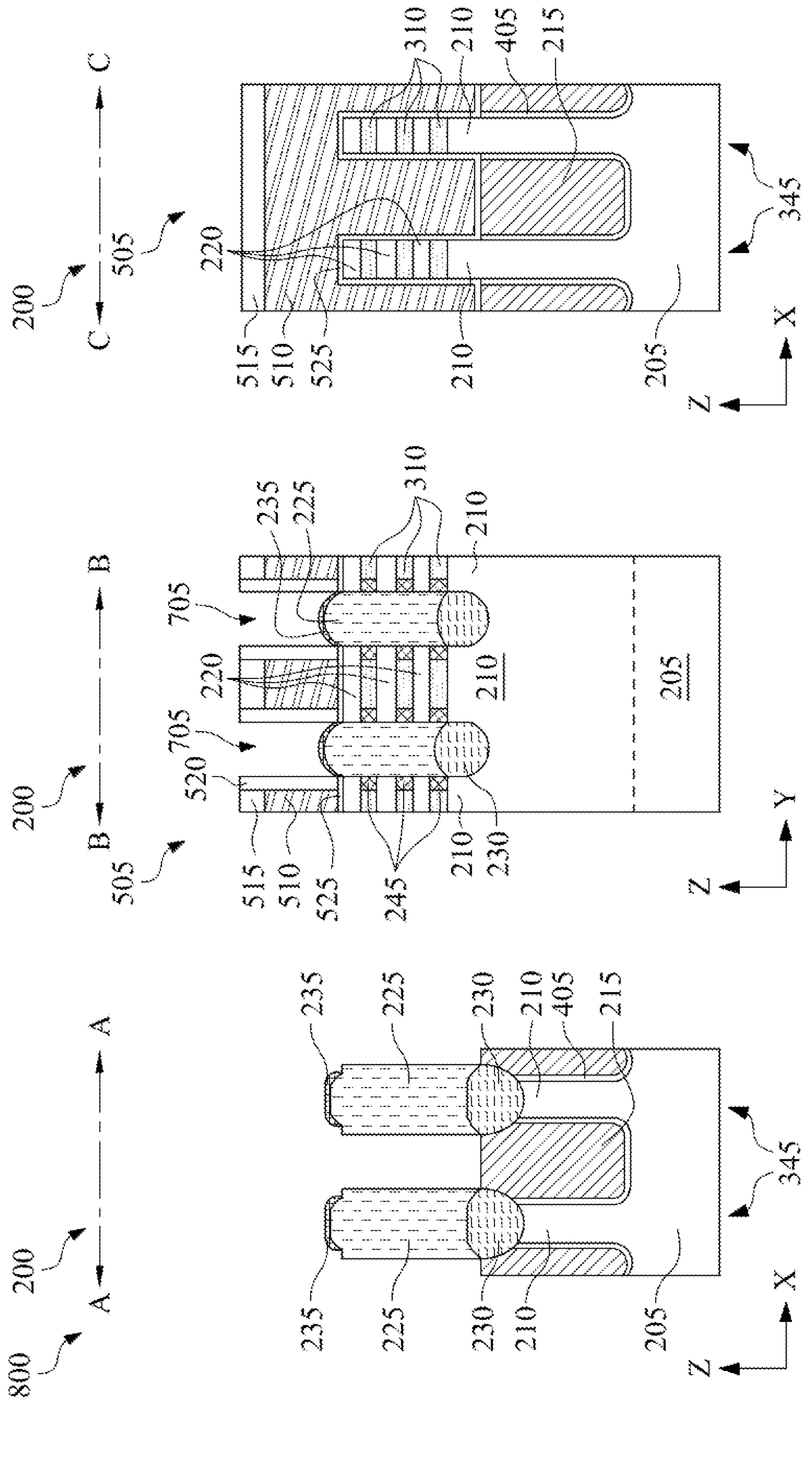
FIG. 8 is a diagram of an example implementation of a source/drain region formation process described herein.

FIG. 8 is a diagram of an example implementation 800 of a source/drain region formation process described herein. The example implementation 800 includes an example of forming the source/drain regions 225 in the source/drain recesses 705 for the semiconductor device 200. FIG. 8 is illustrated from a plurality of perspectives illustrated in FIG. 5, including the perspective of the cross-sectional plane A-A in FIG. 5, the perspective of the cross-sectional plane B-B in FIG. 5, and the perspective of the cross-sectional plane C-C in FIG. 5. In some implementations, the operations described in connection with the example implementation 800 are performed after the processes described in connection with FIGS. 3A-7D.

As shown in the cross-sectional plane A-A and the cross-sectional plane B-B in FIG. 8, the source/drain recesses 705 are filled with one or more layers to form the source/drain regions 225 in the source/drain recesses 705. For example, the deposition tool 102 may deposit a buffer region 230 at the bottom of the source/drain recesses 705, the deposition tool 102 may deposit the source/drain regions 225 on the buffer region 230, and the deposition tool 102 may deposit a capping layer 235 on the source/drain regions 225. The buffer region 230 may include silicon (Si), silicon doped with boron (SiB) or another dopant, and/or another material. The buffer region 230 may be included to reduce, minimize, and/or prevent dopant migration and/or current leakage from the source/drain regions 225 into the adjacent mesa regions 210, which might otherwise cause short channel effects in the semiconductor device 200. Accordingly, the buffer region 230 may increase the performance of the semiconductor device 200 and/or increase yield of the semiconductor device 200.

The source/drain regions 225 may include one or more layers of epitaxially grown material. For example, the deposition tool 102 may epitaxially grow a first layer of the source/drain regions 225 (referred to as an L1) over the buffer region 230, and may epitaxially grow a second layer of the source/drain regions 225 (referred to as an L2, an L2-1, and/or an L2-2) over the first layer. The first layer may include a lightly doped silicon (e.g., doped with boron (B), phosphorous (P), and/or another dopant), and may be included as shielding layer to reduce short channel effects in the semiconductor device 200 and to reduce dopant extrusion or migration into the nanostructure channels 220. The second layer may include a highly doped silicon or highly doped silicon germanium. The second layer may be included to provide a compressive stress in the source/drain regions 225 to reduce boron loss.

As indicated above, FIG. 8 is provided as an example. Other examples may differ from what is described with regard to FIG. 8. Example implementation 800 may include additional operations, fewer operations, different operations, and/or a different order of operations than those described in connection with FIG. 8.

Figure 9:
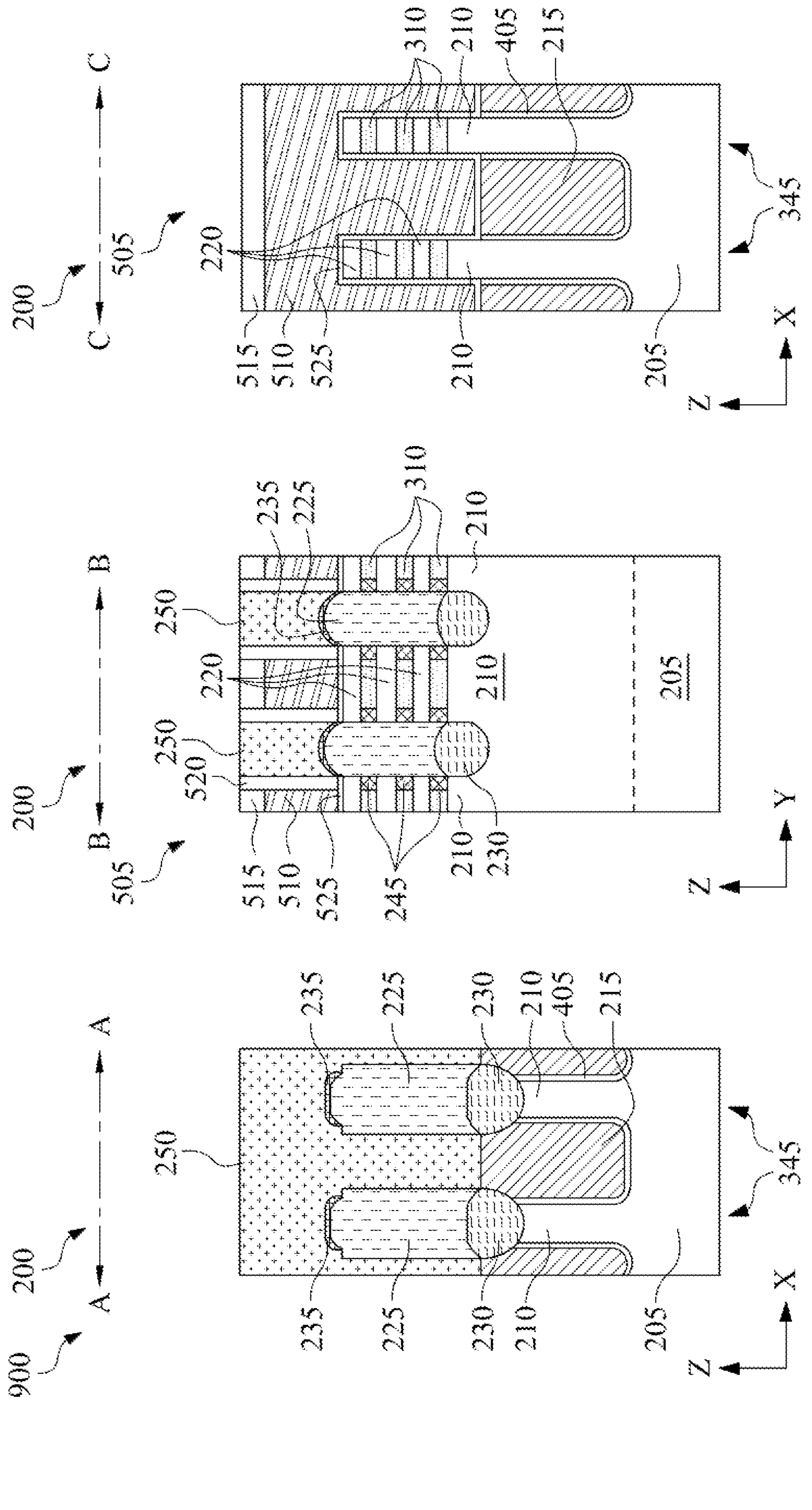
FIG. 9 is a diagram of an example implementation of an interlayer dielectric layer formation process described herein.

FIG. 9 is a diagram of an example implementation 900 of an ILD formation process described herein. FIG. 9 is illustrated from a plurality of perspectives illustrated in FIG. 5, including the perspective of the cross-sectional plane A-A in FIG. 5, the perspective of the cross-sectional plane B-B in FIG. 5, and the perspective of the cross-sectional plane C-C in FIG. 5. In some implementations, the operations described in connection with the example implementation 900 are performed after the operations described in connection with FIGS. 3A-8.

As shown in the cross-sectional plane A-A and the cross-sectional plane B-B in FIG. 9, the ILD layer 250 is formed over the source/drain regions 225. The ILD layer 250 fills in areas between the dummy gate structures 505, and over the source/drain regions 225. The ILD layer 250 is formed to reduce the likelihood of and/or prevent damage to the source/drain regions 225 during the replacement gate process. The ILD layer 250 may be referred to as an ILD zero (ILDO) layer or another ILD layer.

In some implementations, a contact etch stop layer (CESL) is conformally deposited (e.g., by the deposition tool 102) over the source/drain regions 225, over the dummy gate structures 505, and on the spacer layers 520 prior to formation of the ILD layer 250. The ILD layer 250 is then formed on the CESL. The CESL may provide a mechanism to stop an etch process when forming contacts or vias for the source/drain regions 225. The CESL may be formed of a dielectric material having a different etch selectivity from adjacent layers or components. The CESL may include or may be a nitrogen containing material, a silicon containing material, and/or a carbon containing material. Furthermore, the CESL may include or may be silicon nitride ($Si_xN_y$), silicon carbon nitride (SiCN), carbon nitride (CN), silicon oxynitride (SiON), silicon carbon oxide (SiCO), or a combination thereof, among other examples. The CESL may be deposited using a deposition process, such as ALD, CVD, or another deposition technique.

As indicated above, the number and arrangement of operations and devices shown in FIG. 9 are provided as one or more examples. In practice, there may be additional operations and devices, fewer operations and devices, different operations and devices, or differently arranged operations and devices than those shown in FIG. 9.

Figure 10A:
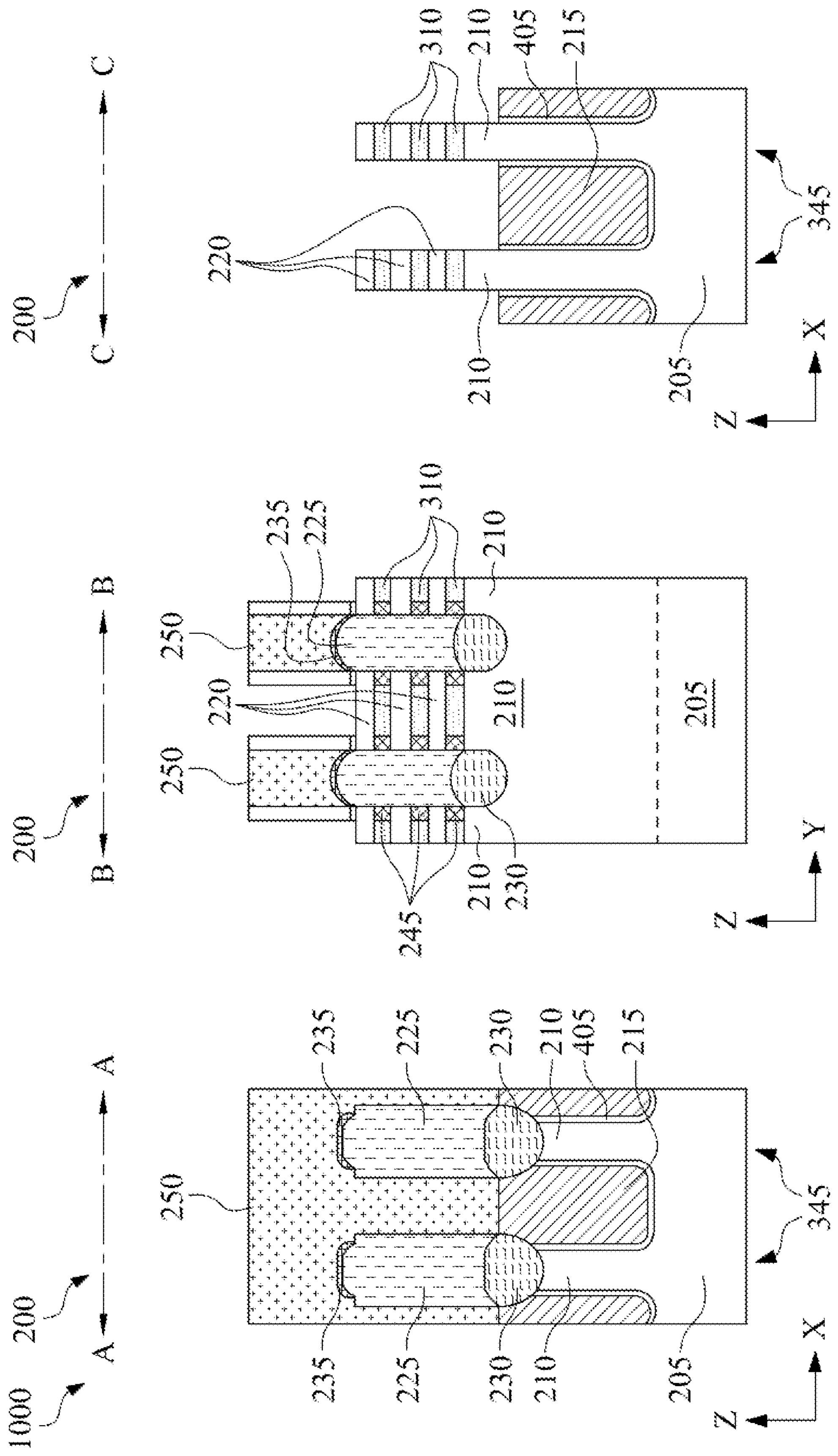
FIGS. 10A-10C are diagrams of an example implementation of a replacement gate process described herein.
Figure 10B:
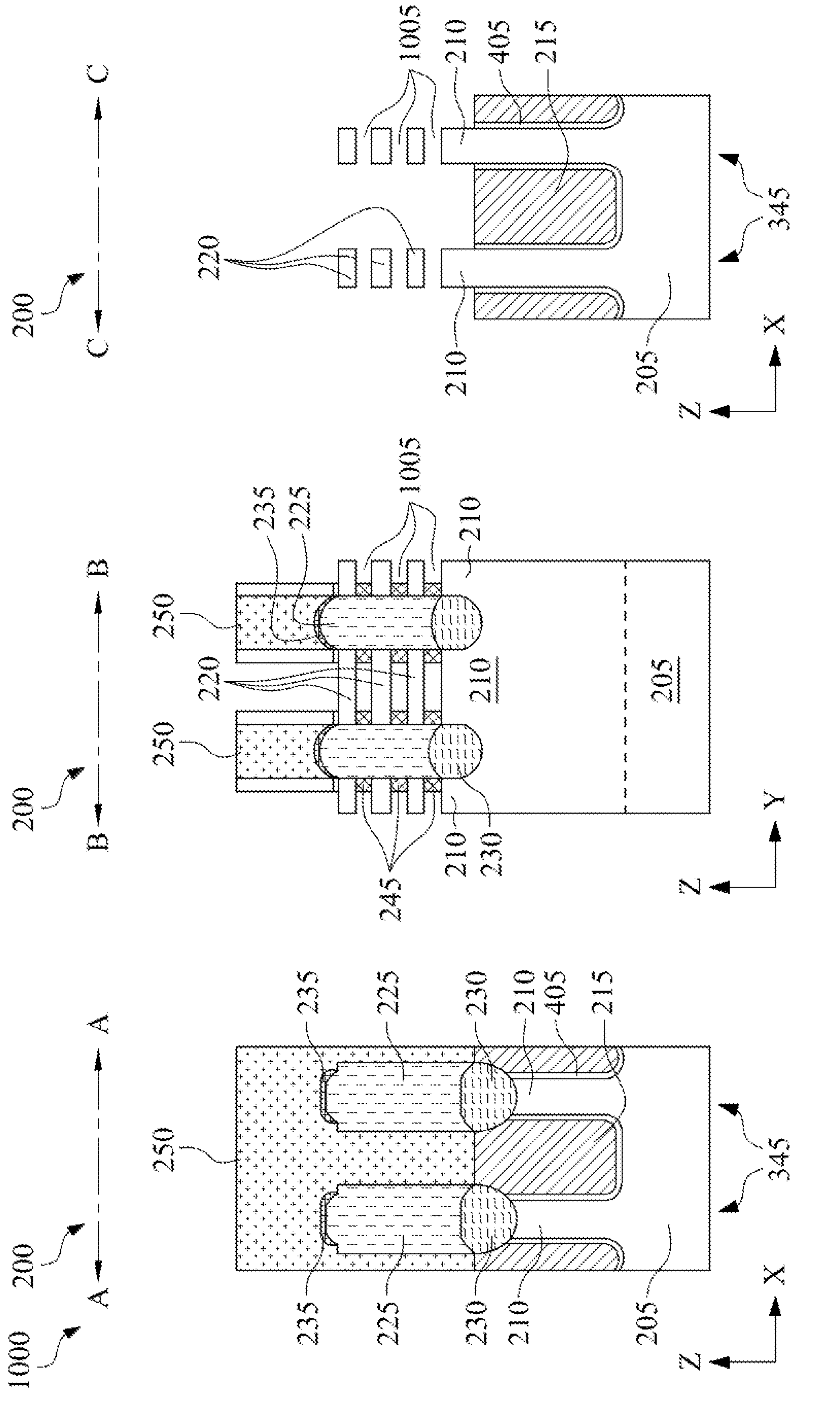
Figure 10C:
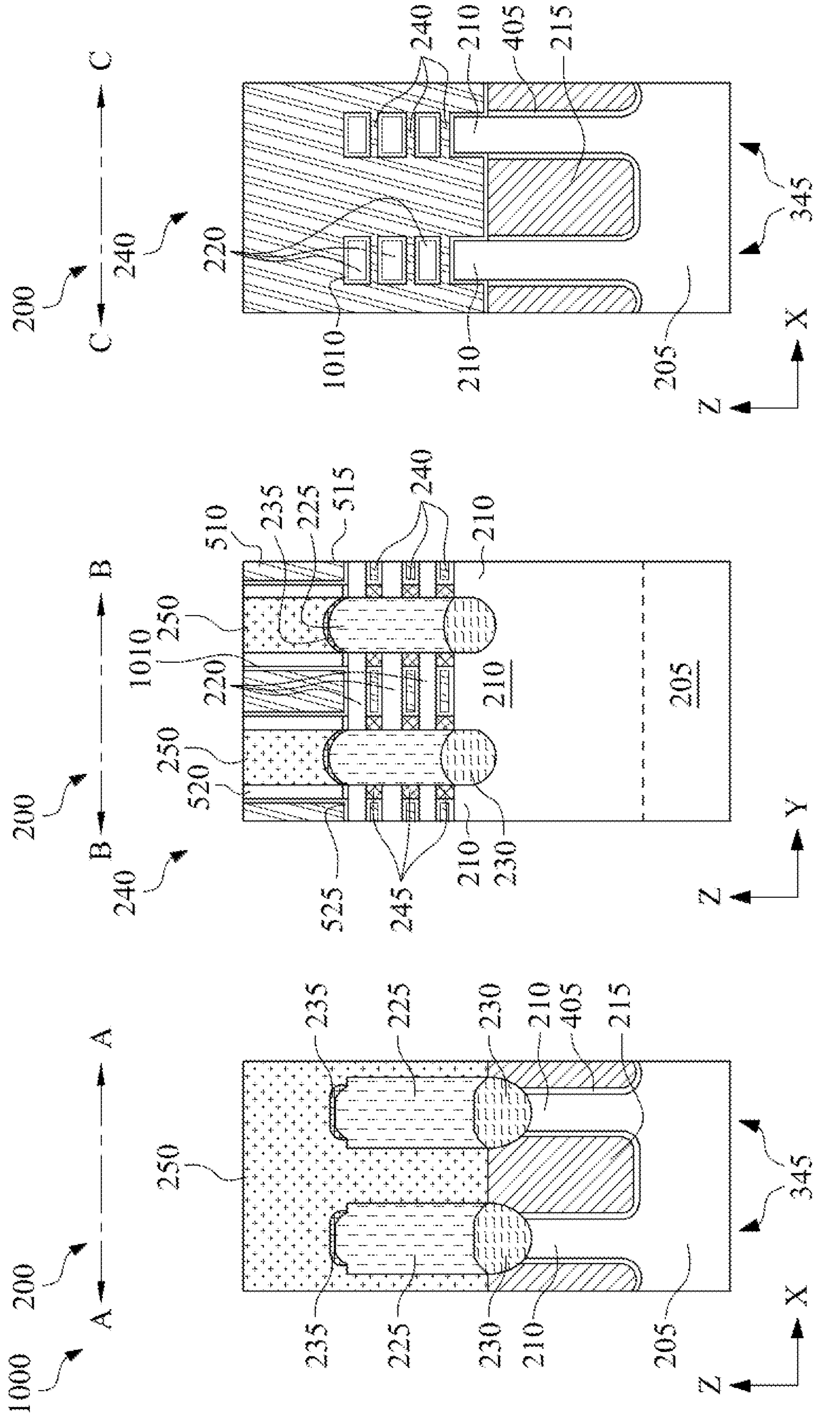

FIGS. 10A-10C are diagrams of an example implementation 1000 of a replacement gate (RPG) process described herein. The example implementation 1000 includes an example of a replacement gate process for replacing the dummy gate structures 505 with the gate structures 240 (e.g., the replacement gate structures) of the semiconductor device 200. FIGS. 10A-10C are illustrated from a plurality of perspectives illustrated in FIG. 5, including the perspective of the cross-sectional plane A-A in FIG. 5, the perspective of the cross-sectional plane B-B in FIG. 5, and the perspective of the cross-sectional plane C-C in FIG. 5. In some implementations, the operations described in connection with the example implementation 1000 are performed after the operations described in connection with FIGS. 3A-9.

As shown in the cross-sectional plane B-B and the cross-sectional plane C-C in FIG. 10A, the replacement gate operation is performed (e.g., by one or more of the semiconductor processing tools 102-112) to remove the dummy gate structures 505 from the semiconductor device 200. The removal of the dummy gate structures 505 leaves behind openings (or recesses) 1005 between the ILD layer 250 over the source/drain regions 225. The dummy gate structures 505 may be removed in one or more etch operations. Such etch operations may include a plasma etch technique, a wet chemical etch technique, and/or another type of etch technique.

As shown in the cross-sectional plane B-B and the cross-sectional plane C-C in FIG. 10B, a nanostructure release operation (e.g., an SiGe release operation) is performed to remove the first layers 310 (e.g., the silicon germanium layers). This results in openings 1005 between the nanostructures channels 220 (e.g., the areas around the nanostructure channels 220). The nanostructure release operation may include the etch tool 108 performing an etch operation to remove the first layer 310 based on a difference in etch selectivity between the material of the first layers 310 and the material of the nanostructure channels 220, and between the material of the first layers 310 and the material of the inner spacers 245. The inner spacers 245 may function as etch stop layers in the etch operation to protect the source/drain regions 225 from being etched.

As shown in the cross-sectional plan B-B and the cross-sectional plane C-C in FIG. 10C, the replacement gate operation continues where deposition tool 102 and/or the plating tool 112 forms the gate structures (e.g., replacement gate structures) 240 in the openings 1005 between the source/drain regions 225. In particular, the gate structures 240 fill the areas between and around the nanostructure channels 220 that were previously occupied by the first layers 310 such that the gate structures 240 wrap around the nanostructure channels 220 and surround the nanostructure channels 220 on at least three sides of the nanostructure channels 220. In some implementations, the gate structures 240 fully wrap around the nanostructure channels 220 and surround the nanostructure channels 220 on all four sides of the nanostructure channels 220. The gate structures 240 may include metal gate structures. A conformal high-k dielectric liner 1010 may be deposited onto the nanostructure channels 220 and on sidewalls prior to formation of the gate structures 240. The high-k dielectric liner 1010 may be a gate dielectric layer between the gate structures 240 and the nanostructure channels 220. The gate structures 240 may include additional layers such as an interfacial layer, a work function tuning layer, and/or a metal electrode structure, among other examples.

As indicated above, the number and arrangement of operations and devices shown in FIGS. 10A-10C are provided as one or more examples. In practice, there may be additional operations and devices, fewer operations and devices, different operations and devices, or differently arranged operations and devices than those shown in FIGS. 10A-10C.

FIGS. 11A-11I are diagrams of an example implementation 1100 of forming an active region isolation structure described herein. The example implementation 1100 includes an example of forming the active region isolation structure (e.g., a CMODE structure) in the semiconductor device 200 after the replacement gate process to replace the dummy gate structures 705 with the gate structures 240 (metal gate structures) of the semiconductor device 200. The active region isolation structure may be formed along a gate structure 240 to create a region of electrical isolation in one or more mesa regions 210 and/or one or more stacks of nanostructure channels 220 under the gate structure 240. Thus, the active region isolation structure enables an underlying nanostructure channel 220 to be separated into multiple (electrically isolated) nanostructure channels 220.

FIGS. 11A-11I are illustrated from a plurality of perspectives illustrated in FIG. 7A, including the perspective of the cross-sectional plane B-B in FIG. 7A (e.g., across a plurality of gate structures 240) and the perspective of the cross-sectional plane C-C in FIG. 7A (e.g., along a gate structure 240). In some implementations, the operations described in connection with the example implementation 1100 are performed after the operations described in connection with FIGS. 3A-10C.

Figure 11A:
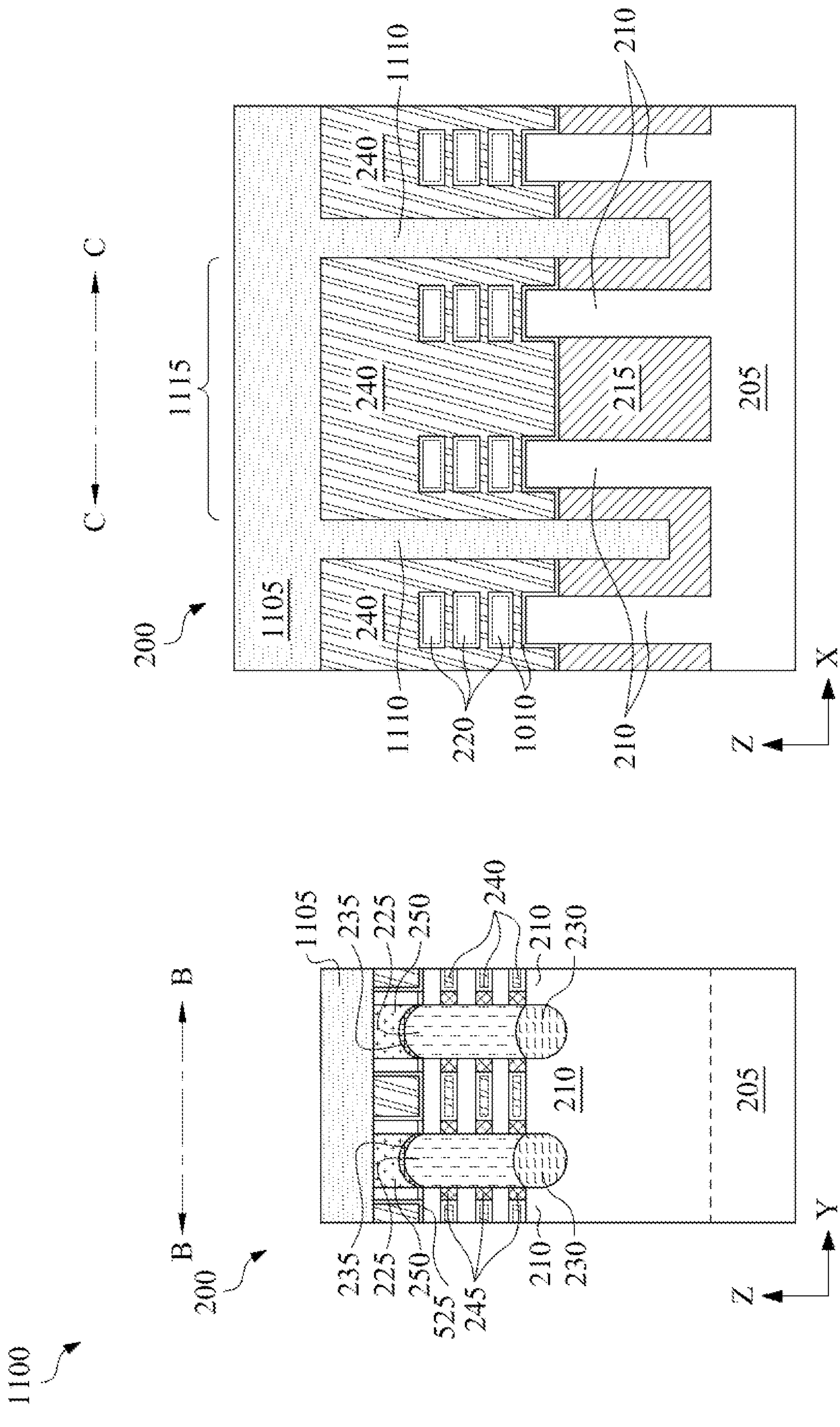
FIGS. 11A-11I are diagrams of an example implementation of a forming an active region isolation structure described herein.

As shown in FIG. 11A, a hard mask layer 1105 may be formed over and/or on the semiconductor device 200. The hard mask layer 1105 may be formed to enable a pattern to be used to etch the gate structure 240 to form a recess in which the active region isolation structure is to be formed. The hard mask layer 1105 may include a dielectric material such as a silicon oxide ($SiO_x$ such as $SiO_2$), a silicon nitride ($Si_xN_y$ such as a $Si_3N_4$), a silicon oxynitride (SiON), fluoride-doped silicate glass (FSG), a high-k dielectric material, and/or another suitable dielectric material. A deposition tool 102 may be used to deposit the hard mask layer 1105 using a PVD technique, an ALD technique, a CVD technique, an oxidation technique, another type of deposition technique described in connection with FIG. 1, and/or another suitable deposition technique. In some implementations, the planarization tool 110 may be used to planarize the hard mask layer 1105 after the hard mask layer 1105 is deposited.

As further shown in FIG. 11A, gate isolation structures 1110 may be formed through the gate structure 240 to segment or partition the gate structure 240 into a plurality of electrically isolated gate structures 240. The gate isolation structures 1110 enable the gate structures 240 to be operated independently, enabling multiple transistors to be formed along the gate structure 240. The gate isolation structures 1110 may extend in a direction (e.g., the Y direction) that is approximately perpendicular to the gate structure 240 (e.g., the X direction). The gate isolation structures 1110 may include cut metal gate (CMG) isolation structures, cut poly gate isolation structures, and/or another type of gate isolation structures.

To form the gate isolation structures 1110, gate isolation recesses may be formed through the gate structure 240 and into one or more STI regions 215 under the gate structure 240. In some implementations, a pattern in a photoresist layer is used to etch the gate structure 240 and the STI regions 215 to form the gate isolation recesses. In these implementations, a deposition tool 102 may be used to form the photoresist layer on the gate structure 240. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the gate structure 240 and the STI regions 215 based on the pattern to form the gate isolation recesses in the gate structure 240 and the STI regions 215. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for forming the gate isolation recesses based on a pattern.

A deposition tool 102 may be used to deposit the material of the gate isolation structures 1110 in the gate isolation recesses using a PVD technique, an ALD technique, a CVD technique, an oxidation technique, another type of deposition technique described in connection with FIG. 1, and/or another suitable deposition technique. In some implementations, the gate isolation structures 1110 are formed in the same set of one or more deposition operations as the hard mask layer 1105, and therefore the gate isolation structures 1110 and the hard mask layer 1105 may be formed of the same material. For example, a deposition tool 102 may deposit the material of the gate isolation structures 1110 in the gate isolation recesses, and may continue to deposit excess material on the gate structure 240 after the gate isolation recesses are filled to form the hard mask layer 1105.

Figure 11B:
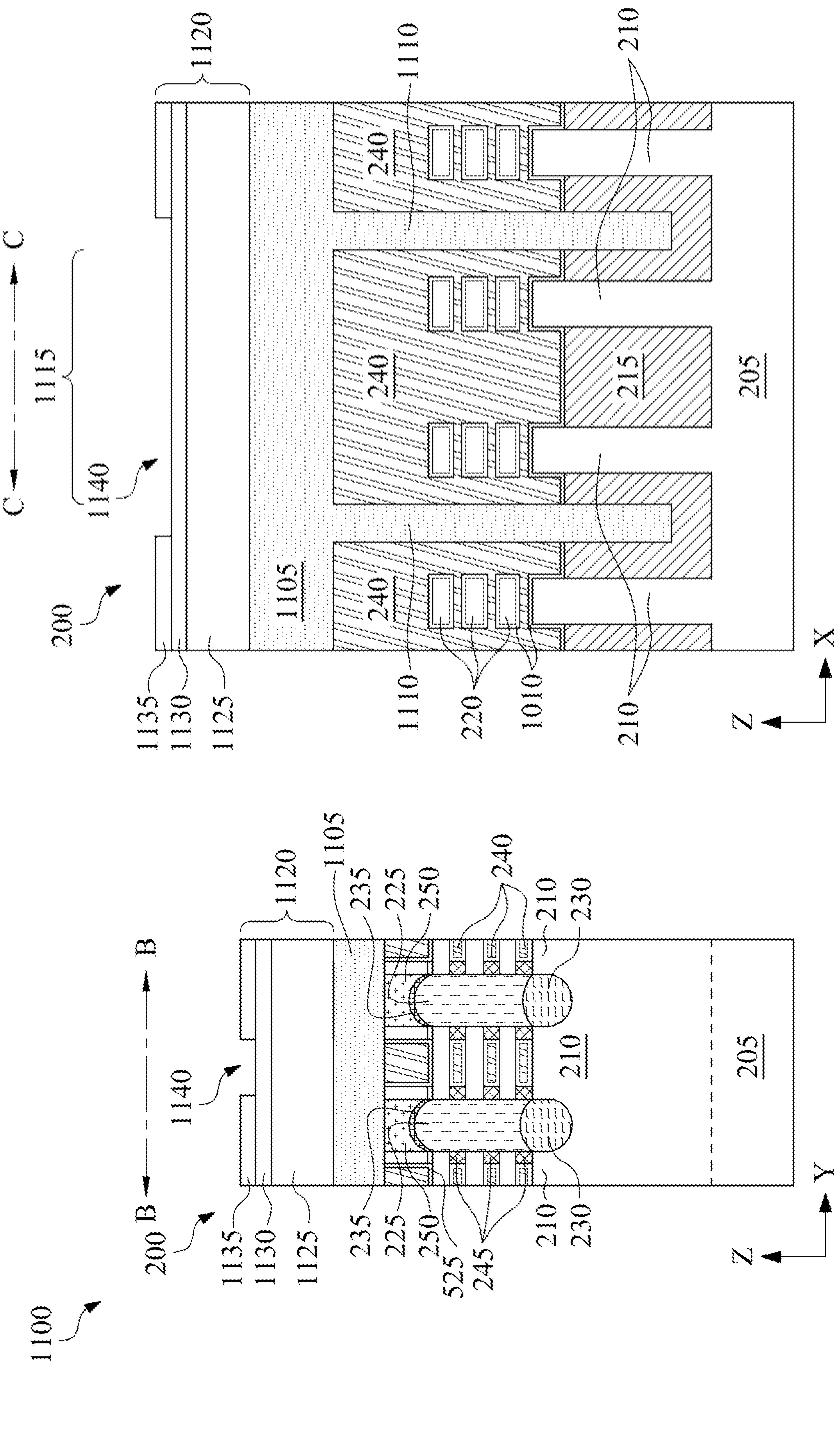

As shown in FIG. 11B, a patterning stack 1120 may be formed over and/or on the hard mask layer 1105. The patterning stack 1120 may be used to pattern the hard mask layer 1105 for forming an active region isolation recess between the gate isolation structures 1110. The patterning stack 1120 may include one or more masking layers, such as a bottom layer 1125, a middle layer 1130, and a top layer 1135. The bottom layer 1125 may include a carbon-containing material and/or another suitable material. The middle layer 1130 may include an oxide-containing material and/or another suitable material. The top layer 1135 may include a photoresist layer that is used to transfer a pattern 1140 to the bottom layer 1125 and middle layer 1130. The different materials of the bottom layer 1125 and middle layer 1130 provide etch selectivity between the bottom layer 1125 and middle layer 1130, which enables the aspect ratio of the pattern 1140 to be tightly controlled.

A deposition tool 102 may be used to deposit the bottom layer 1125 and the middle layer 1130 using a PVD technique, an ALD technique, a CVD technique, an oxidation technique, another type of deposition technique described in connection with FIG. 1, and/or another suitable deposition technique. In some implementations, the planarization tool 110 may be used to planarize the bottom layer 1125 and/or the middle layer 1130 after the bottom layer 1125 and/or the middle layer 1130 are deposited. A deposition tool 102 may be used to deposit the top layer 1135 using a spin coating technique and/or another suitable deposition technique.

As further shown in FIG. 11B, the pattern 1140 may be formed in the top layer 1135. In some implementations, a wet cleaning operation may be performed prior to forming the pattern 1140. The pattern 1140 may be formed using an exposure tool 104 to expose the top layer 1135 to a radiation source to form the pattern 1140, and a developer tool 106 to develop and remove portions of the top layer 1135 to expose the pattern 1140. The pattern 1140 may be formed above a portion of the gate structure 240 between the gate isolation structures 1110.

Figure 11C:
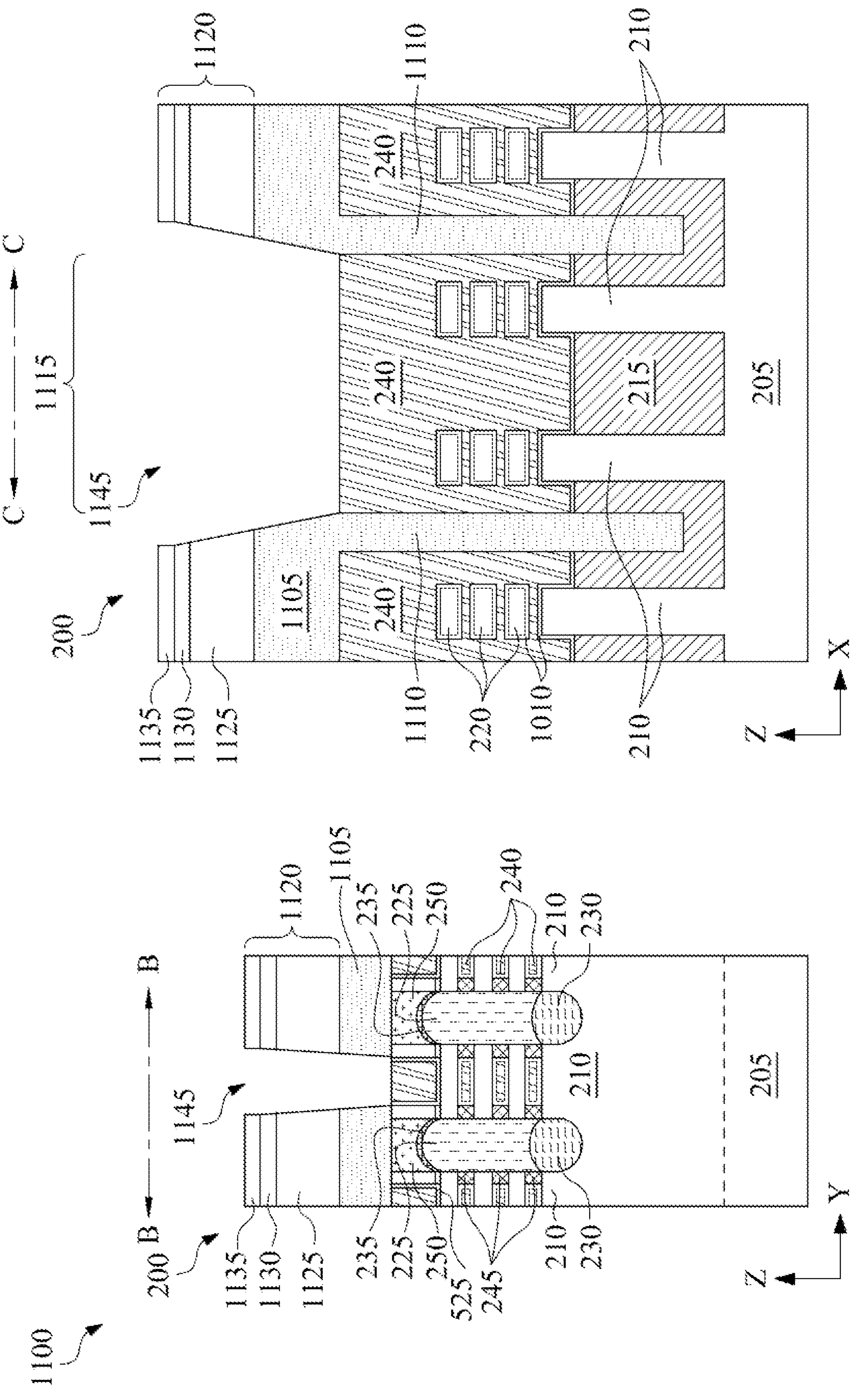

As shown in FIG. 11C, the pattern 1140 is transferred to the bottom layer 1125 and the middle layer 1130 of the patterning stack 1120. An etch tool 108 may be used to etch the bottom layer 1125 and the middle layer 1130 based on the pattern 1140 in the top layer 1135 to transfer the pattern 1140 to the bottom layer 1125 and the middle layer 1130. In some implementations, the etch operation includes a dry etch (e.g., a plasma etch operation). In some implementations, the etch operation includes another type of etch operation such as a wet chemical etch operation.

As further shown in FIG. 11C, the pattern 1140 in the bottom layer 1125 and the middle layer 1130 may be used to form an active region isolation recess 1145 (e.g., a CMODE recess) in the hard mask layer 1105. An etch tool 108 may be used to etch the hard mask layer 1105 based on the pattern 1140 in the bottom layer 1125 and the middle layer 1130 to form the active region isolation recess 1145. In some implementations, the etch operation includes a dry etch (e.g., a plasma etch operation). In some implementations, the etch operation includes another type of etch operation such as a wet chemical etch operation. The etch may stop on the gate structure 240. In some implementations, a photoresist removal tool may be used to remove the remaining portions of the patterning stack 1120 (e.g., using a chemical stripper, plasma ashing, and/or another technique) after the active region isolation recess 1145 is formed. In some implementations, a wet cleaning operation may be performed after the active region isolation recess 1145 is formed.

Figure 11D:
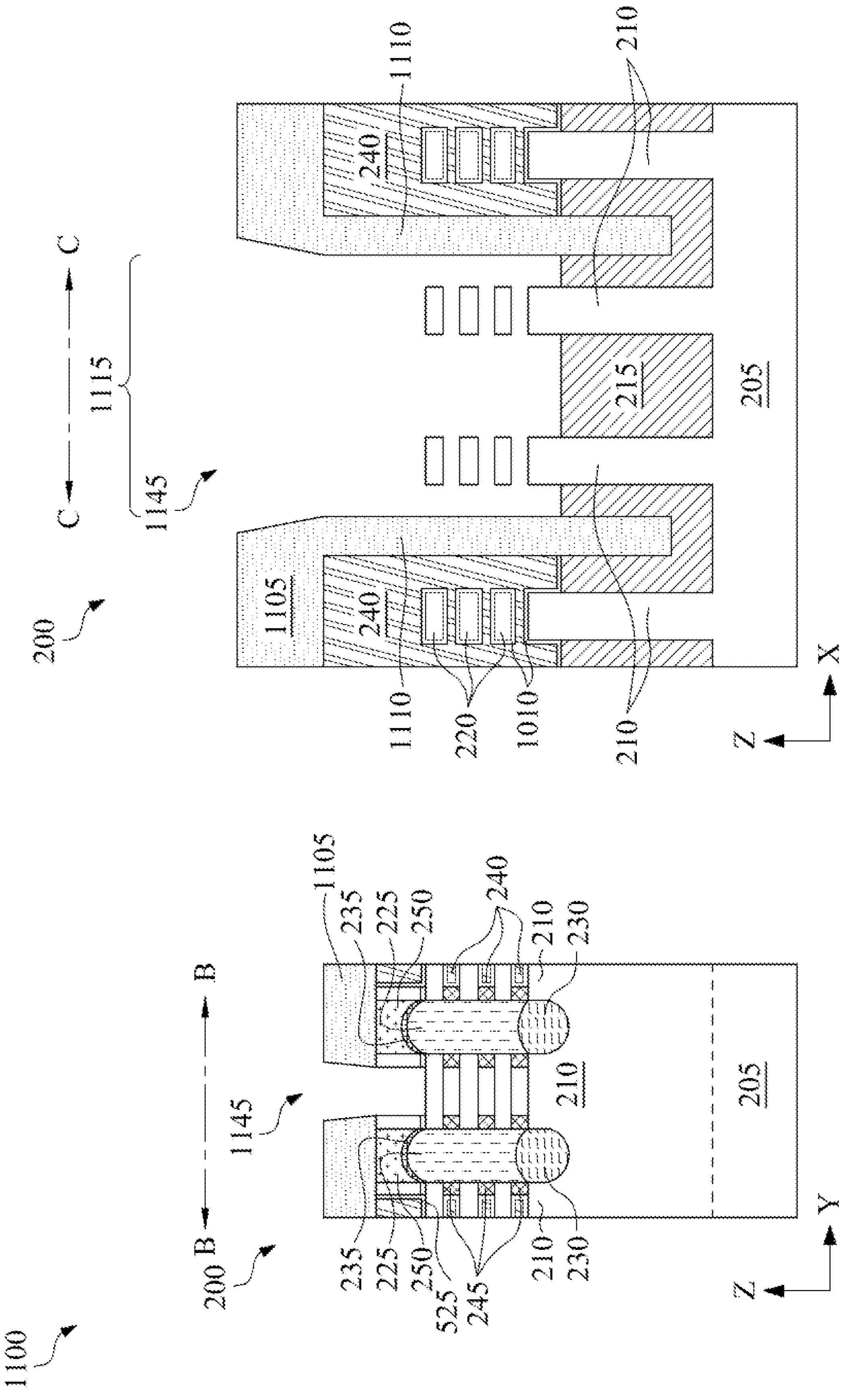

As shown in FIG. 11D, the gate structure 240 may be etched to extend the active region isolation recess 1145 down to the STI regions 215 under the gate structure 240. The active region isolation recess 1145 may be formed through the gate structure 240 between the gate isolation structures 1110. The etch operation may also remove portions of the high-k dielectric liner 1010 between the gate isolation structures 1110.

The gate structure 240 may be etched using the gate isolation structures 1110 and the hard mask layer 1105 as a self-aligned pattern based on the etch selectivity between the gate structure 240 and the gate isolation structures 1110 and the hard mask layer 1105. In other words, no additional masking/patterning layers are needed, and the hard mask layer 1105 and the gate isolation structures 1110 control the location of the etching of the gate structure 240. An etch tool 108 may be used to etch the gate structure 240 and the high-k dielectric liner 1010. In some implementations, the etch operation includes a dry etch (e.g., a plasma etch operation). In some implementations, the etch operation includes another type of etch operation such as a wet chemical etch operation.

The nanostructure channels 220 between the gate isolation structures 1110 may be exposed in the active region isolation recess 1145 after the gate structure 240 and high-k dielectric liner 1010 are etched. Moreover, portions of the mesa regions 210 under the nanostructure channels 220 between the gate isolation structures 1110 may be exposed in the active region isolation recess 1145 after the gate structure 240 and high-k dielectric liner 1010 are etched. In some implementations, a wet cleaning operation may be performed after the gate structure 240 and high-k dielectric liner 1010 are etched.

The gate structure 240 may be formed of materials (e.g., metal materials) that are better able to withstand the stresses and strains imparted onto the semiconductor device 200 during etching of the gate structure 240 compared to the materials of the dummy gate structures 705. Accordingly, performing the CMODE process after the dummy gate structures 705 are replaced with the gate structures 240 may result in fewer layout dependent effects on the semiconductor device 200, such as gate deformation. Thus, performing the CMODE process after the dummy gate structures 705 are replaced with the gate structures 240 may reduce or minimize the amount of threshold voltage shifting in the semiconductor device 200.

The material(s) of the gate structure 240 may have a greater Young's modulus than the material(s) of the dummy gate structures 705, and may therefore better resist deformation than the dummy gate structures 705. For example, the gate structure 240 may include materials such as tungsten (W) (Young's modulus of approximately 400 gigapascals (GPa) to approximately 420 GPa), titanium nitride (TiN) (Young's modulus of approximately 260 GPa to approximately 600 GPa), titanium aluminide (TiAl) (Young's modulus of approximately 236 GPa to approximately 270 GPa), and/or hafnium oxide ($HfO_2$) (Young's modulus of approximately 160 GPa to approximately 200 GPa), whereas the dummy gate structures 705 may include materials such as silicon (Si) (Young's modulus of approximately 140 GPa to approximately 180 GPa) and/or silicon nitride ($Si_3N_4$) (Young's modulus of approximately 280 GPa to approximately 290 GPa). The Young's modulus of the material(s) of the gate structure 240 may be greater than the Young's modulus of the material(s) of the dummy gate structures 705 due to the higher tensile stress (o) of the material(s) of the gate structure 240, resulting in the gate structure 240 being more difficult to deform than the dummy gate structures 705.

Figure 11E:
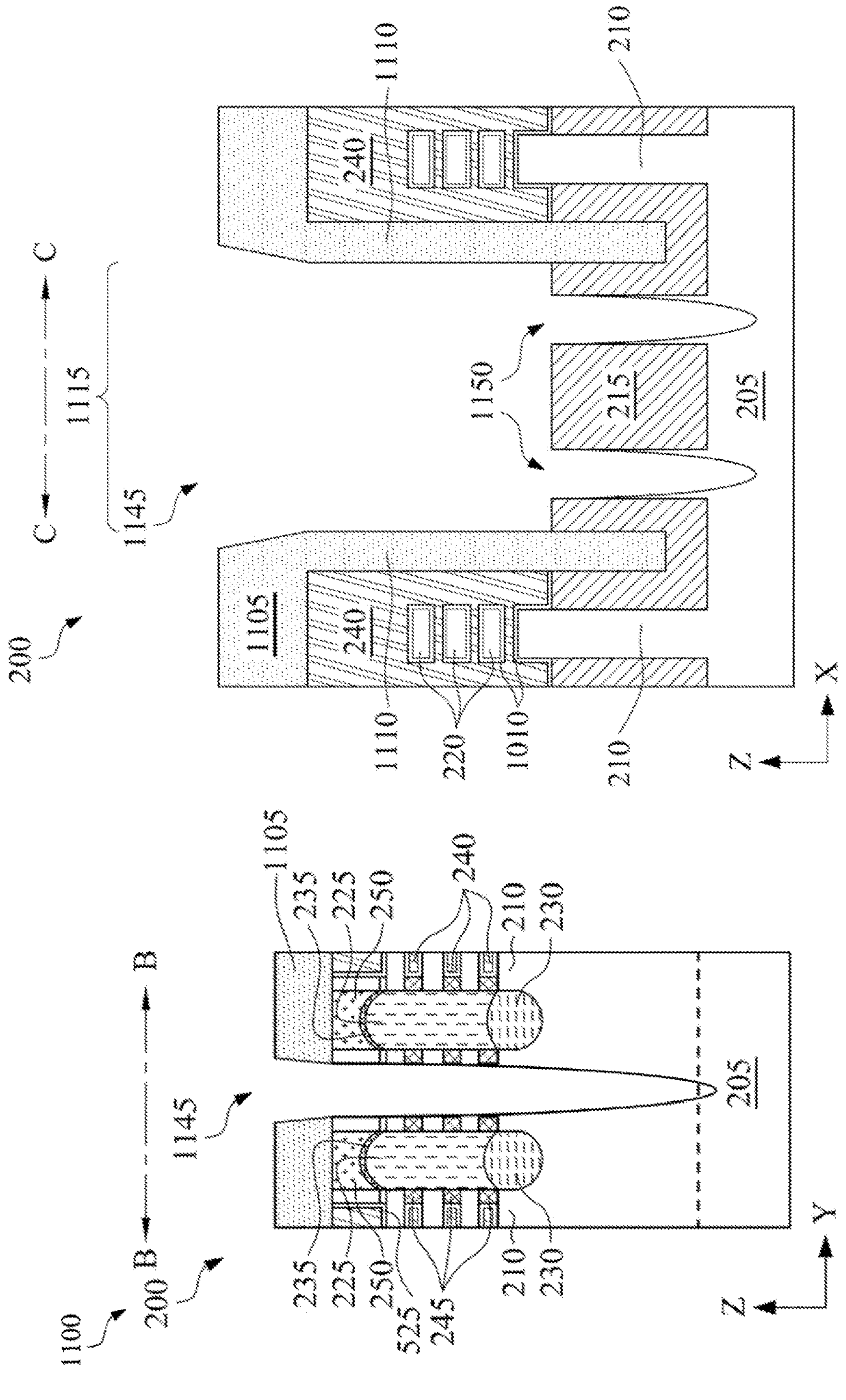

As shown in FIG. 11E, the nanostructure channels 220 between the gate isolation structures 1110, that are exposed in the active region isolation recess 1145, may be removed after the gate structure 240 and high-k dielectric liner 1010 are etched. Moreover, the mesa regions 210 under the nanostructure channels 220 may be removed through the active region isolation recess 1145, resulting in recess extensions 1150 between the STI regions 215 that are located between the gate isolation structures 1110. As a result, the active region isolation recess 1145 extends down to and, in some implementations, into the semiconductor substrate 205 below the STI regions 215. Removal of the nanostructure channels 220 and associated mesa regions 210 under the nanostructure channels 220 results in the nanostructure channels 220 and associated mesa regions 210 being segmented into portions in the Y direction. This enables the portions of the nanostructure channels 220 and associated mesa regions 210 to be electrically isolated, which enables multiple active regions to be included in the nanostructure channels 220 and associated mesa regions 210.

In some implementations, an inductively coupled plasma (ICP) is used to etch the nanostructure channels 220 and the mesa regions 210. The plasma may be a hydrogen bromide (HBr) based plasma etchant, a chlorine ($Cl_2$) based plasma etchant, a boron trichloride ($BCl_3$) based plasma etchant, and/or another plasma based etchant with oxygen ($O_2$) and/or carbon dioxide ($CO_2$) added. The concentration of $BCl_3$ and/or $Cl_2$ in the plasma based etchant may be low to provide high etch selectivity between the mesa regions 210 (e.g., silicon) and the STI regions 215 (e.g., silicon dioxide) between the gate isolation structures 1110.

The plasma may be generated using an etch tool 108, such as an inductively coupled plasma (ICP) tool, a resonant antenna plasma source driven by a radio frequency (RF) power generator, and/or another type of plasma based etch tool. A frequency of a multiple of 13.56 megahertz (MHz) (e.g., 13.56 MHZ, 27 MHz) may be used for the RF power generator. The RF power generator may be operated to provide a source power that is included in a range of approximately 100 watts to approximately 2500 watts. However, other values for the range are within the scope of the present disclosure. In some implementations, a pulse plasma etch may be performed with a duty cycle that is included in a range of approximately 10% to approximately 100%. However, other values for the range are within the scope of the present disclosure. An RF bias power to a pedestal in the process chamber of the etch tool 108 may be included in a range of approximately 10 watts to approximately 2000 watts. However, other values for the range are within the scope of the present disclosure. The process chamber of the etch tool 108 may be operated at a pressure that is included in a range of approximately 3 milliTorr (mTorr) to approximately 150 mTorr. However, other values for the range are within the scope of the present disclosure. The process chamber of the etch tool 108 may be operated at a temperature that is included in a range of approximately 20 degrees Celsius to approximately 150 degrees Celsius. However, other values for the range are within the scope of the present disclosure.

Figure 11F:
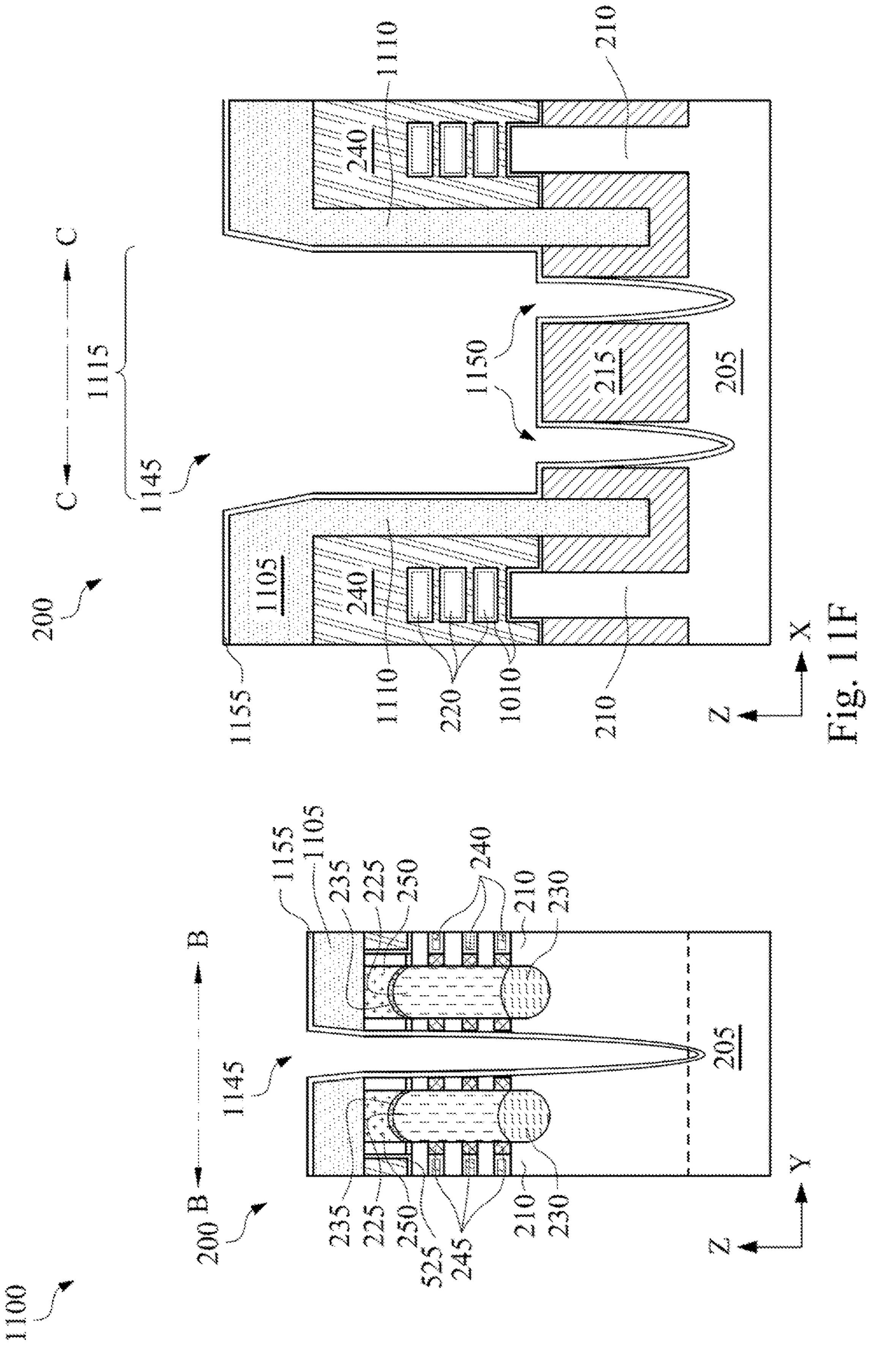

As shown in FIG. 11F, a dielectric liner 1155 of the active region isolation structure 1115 may be formed in the active region isolation recess 1145. The dielectric liner 1155 may be conformally deposited on the sidewalls of the active region isolation recess 1145 (corresponding to sidewalls of the gate isolation structures 1110 that are exposed in the active region isolation recess 1145), on bottom surfaces of the active region isolation recess 1145 (corresponding to top surfaces of the STI regions 215 exposed in the active region isolation recess 1145), and on the surfaces of the recess extensions 1150 of the active region isolation recess 1145 (corresponding to sidewalls of the STI regions 215 and portions of the semiconductor substrate 205). A deposition tool 102 may be used to deposit the dielectric liner 1155 using a PVD technique, an ALD technique, a CVD technique, an oxidation technique, another type of deposition technique described in connection with FIG. 1, and/or another suitable deposition technique. The dielectric liner 1155 may include a dielectric material such as a silicon oxide ($SiO_x$ such as $SiO_2$), a silicon nitride ($Si_xN_y$ such as a $Si_3N_4$), a silicon oxynitride (SiON), fluoride-doped silicate glass (FSG), a high-k dielectric material, and/or another suitable dielectric material.

Figure 11G:
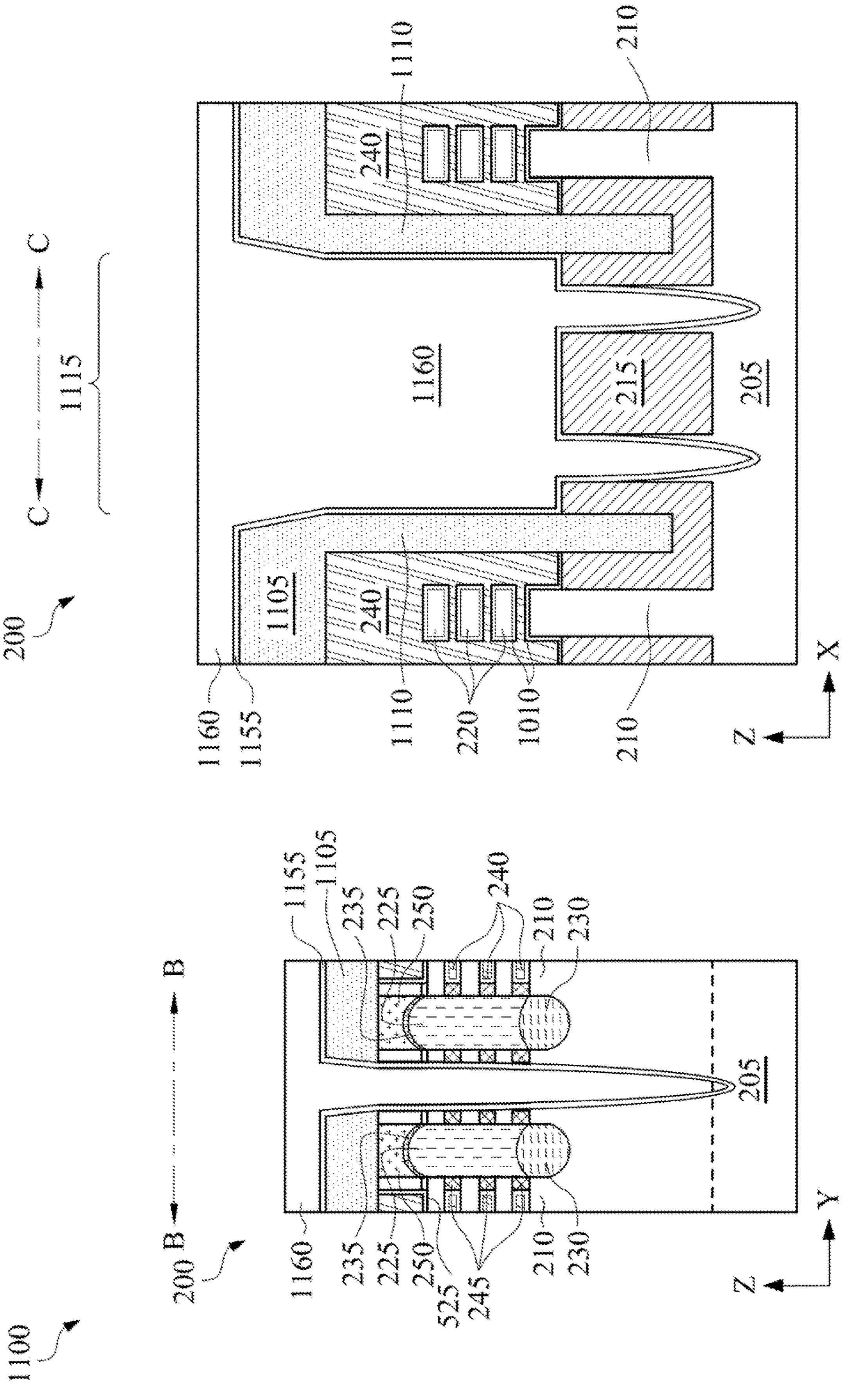

As shown in FIG. 11G, the active region isolation recess 1145 may be filled with a dielectric layer 1160 over and/or on the dielectric liner 1155 of the active region isolation structure 1115. The active region isolation recess 1145 may be over-filled with the dielectric layer 1160 to ensure that the active region isolation recess 1145 is fully filled with the dielectric layer 1160 and to minimize the formation of gaps or voids in the active region isolation structure 1115. A deposition tool 102 may be used to deposit the dielectric layer 1160 using a PVD technique, an ALD technique, a CVD technique, an oxidation technique, another type of deposition technique described in connection with FIG. 1, and/or another suitable deposition technique. The dielectric layer 1160 may include a dielectric material such as a silicon oxide ($SiO_x$ such as $SiO_2$), a silicon nitride ($Si_xN_y$ such as a $Si_3N_4$), a silicon oxynitride (SiON), fluoride-doped silicate glass (FSG), a high-k dielectric material, and/or another suitable dielectric material.

Figure 11H:
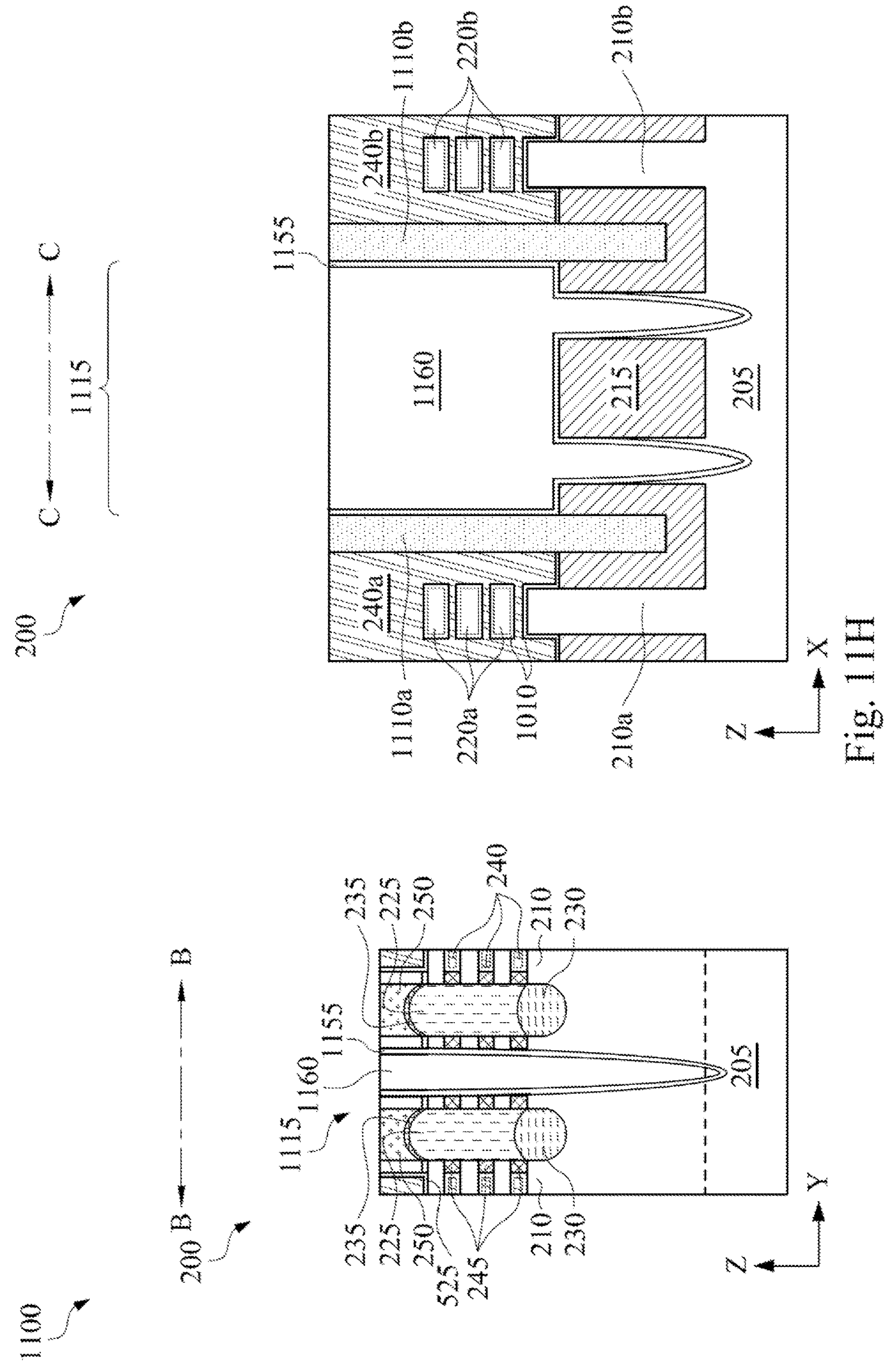

As shown in FIG. 11H, a planarization operation may be performed to planarize the semiconductor device 200 after the layers of the active region isolation structure 1115 are formed. A planarization tool 110 may be used to planarize the semiconductor device 200 to remove the hard mask layer 1105, to remove excess material of the dielectric liner 1155, and/or to remove excess material of the dielectric layer 1160.

The semiconductor device 200 may include a first plurality of nanostructure channels 220*a* over a first mesa region 210*a* that extends above a semiconductor substrate 205, and a second plurality of nanostructure channels 220*b* over a second mesa region 210*b* that extends above the semiconductor substrate 205. The first plurality of nanostructure channels 220*a* and the second plurality of nanostructure channels 220*b* are arranged in a direction that is perpendicular to the semiconductor substrate 205 (e.g., the Z direction). The semiconductor device 200 may include a first gate structure 240*a* wrapping around each of the first plurality of nanostructure channels 220*a*, and a second gate structure 240*b* wrapping around each of the second plurality of nanostructure channels 220*b*. The semiconductor device 200 may include a first gate isolation structure 1110*a* and a second gate isolation structure 1110*b* between the first gate structure 240*a* and the second gate structure 240*b*. The semiconductor device 200 may include an active region isolation structure 1115 (e.g., a CMODE structure) between the gate isolation structures 1110*a* and 1110*b*. The active region isolation structure 1115 may be located between the first gate structure 240*a* and the first gate isolation structure 1110*a*, and between the second gate structure 240*b* and the second gate isolation structure 1110*b*. A dielectric liner 1155 of the active region isolation structure 1115 is included directly on a sidewall of the first gate isolation structure 1110*a* and directly on a sidewall of the second gate isolation structure 1110*b*. The first gate structure 240*a* may be in direct contact with a sidewall of the first gate isolation structure 1110*a*, and the second gate structure 240*b* may be in direct contact with a sidewall of the second gate isolation structure 1110*b*. The dielectric liner 1155 may be located between the dielectric layer 1160 of the active region isolation structure 1115 and the gate isolation structures 1110*a* and 1110*b*.

Figure 11I:
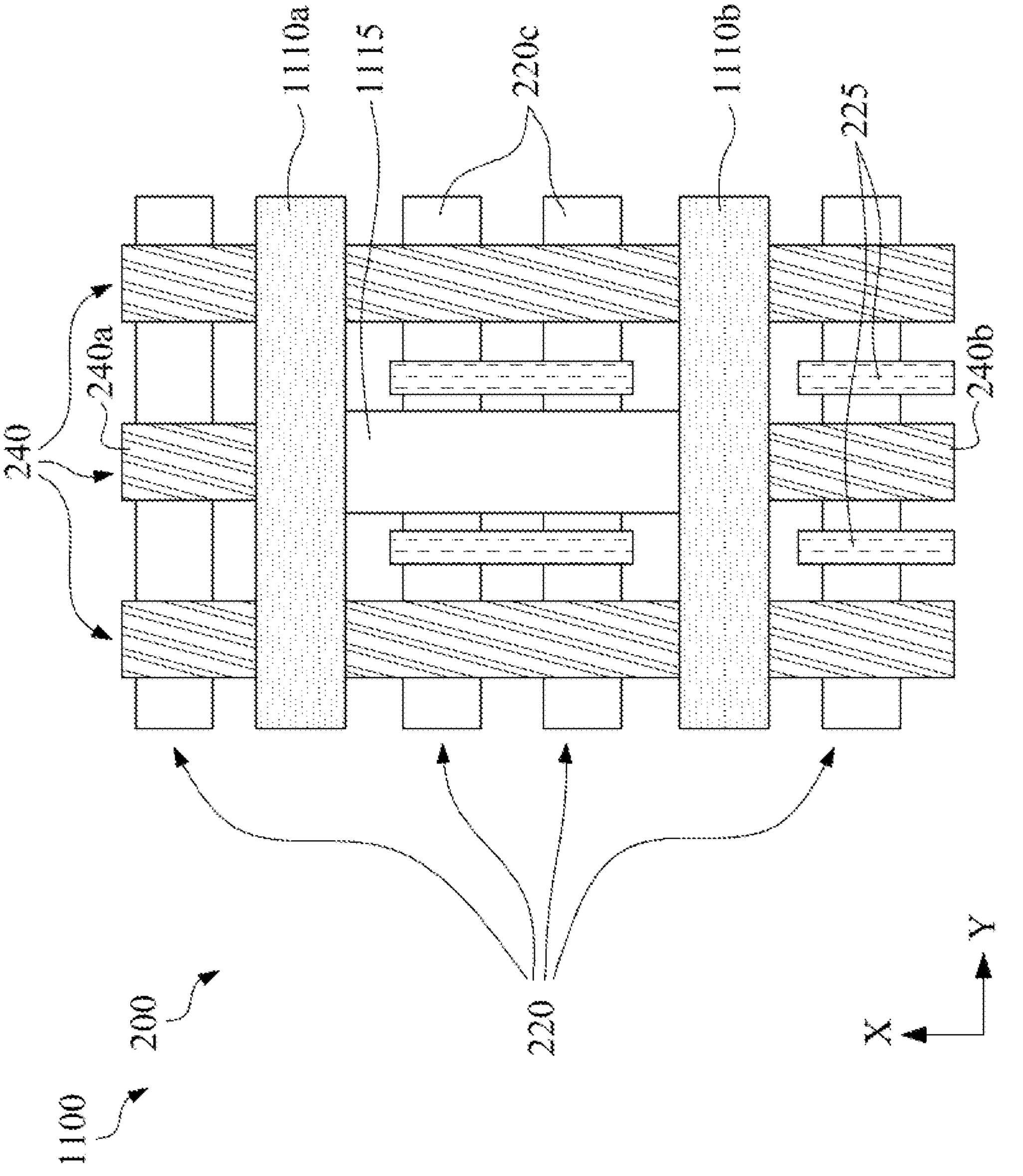

FIG. 11I illustrates a top-down view of the semiconductor device 200. As shown in FIG. 11I, the nanostructure channels 220 may extend in the Y direction in the semiconductor device 200, and the gate structures 240 may extend in the X direction in the semiconductor device 200. Source/drain regions 225 may be recessed in one or more of the nanostructure channels 220 such that a source/drain region 225 is adjacent to ends of one or more sets of nanostructure channels 220. The gate isolation structures 1110*a* and 1110*b* may extend in the Y direction and may extend across one or more gate structures 240. The gate isolation structures 1110*a* and 1110*b* may segment one or more of the gate structures 240 into a plurality of gate structures, such as a gate structure 240*a* and a gate structure 240*b*. The active region isolation structure 1115 may be included between the gate isolation structures 1110*a* and 1110*b* in place of where a portion of a gate structure 240 (and the underlying nanostructure channels 220 and mesa regions 210) were removed. The active region isolation structure 1115 segments one or more of the nanostructure channels 220*c* into a plurality of portions on opposing sides of the active region isolation structure 1115.

As indicated above, the number and arrangement of operations and devices shown in FIGS. 11A-11I are provided as one or more examples. In practice, there may be additional operations and devices, fewer operations and devices, different operations and devices, or differently arranged operations and devices than those shown in FIGS. 11A-11I.

Figure 12A:
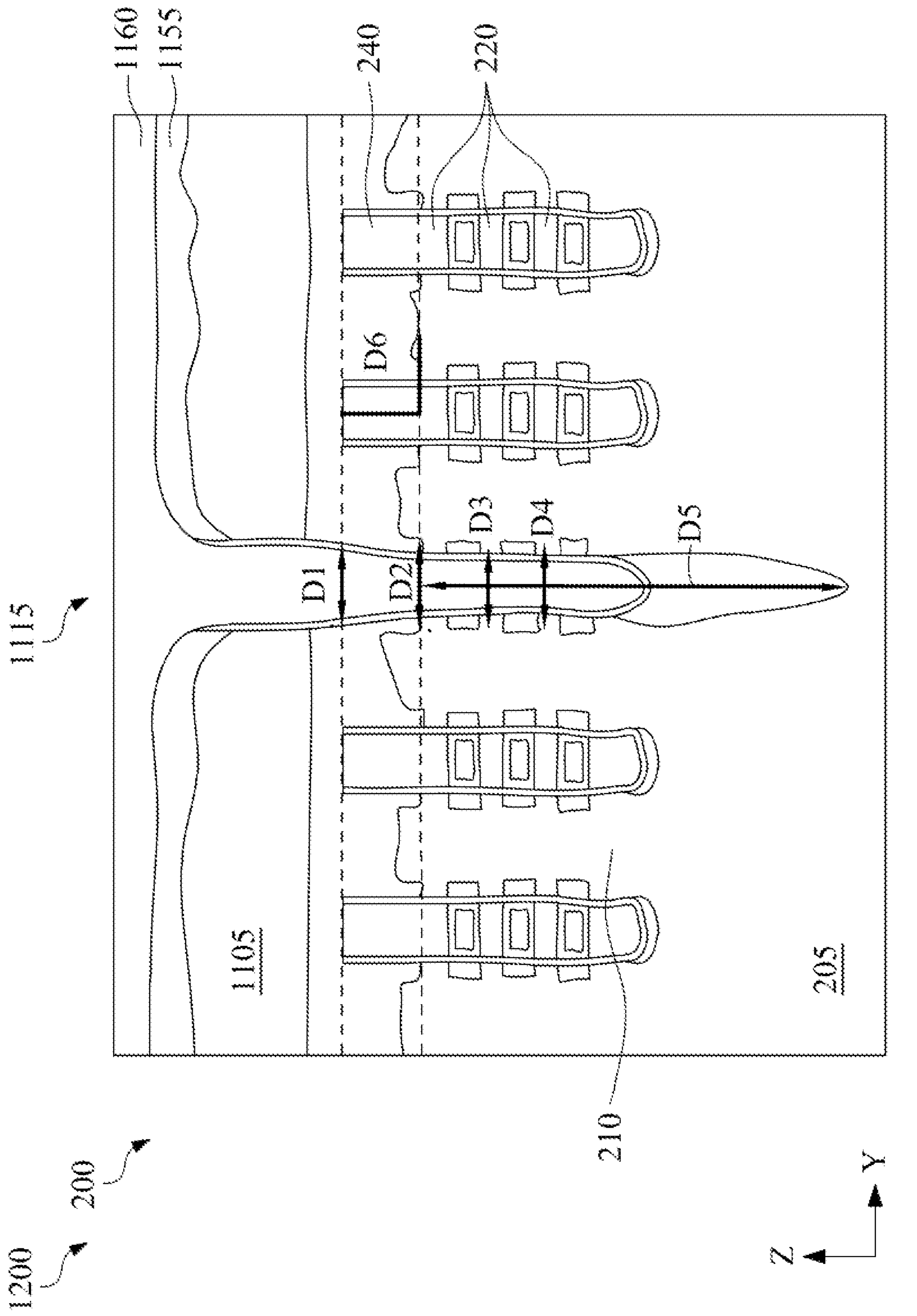
FIGS. 12A and 12B are diagrams of example implementations of a semiconductor device described herein.
Figure 12B:
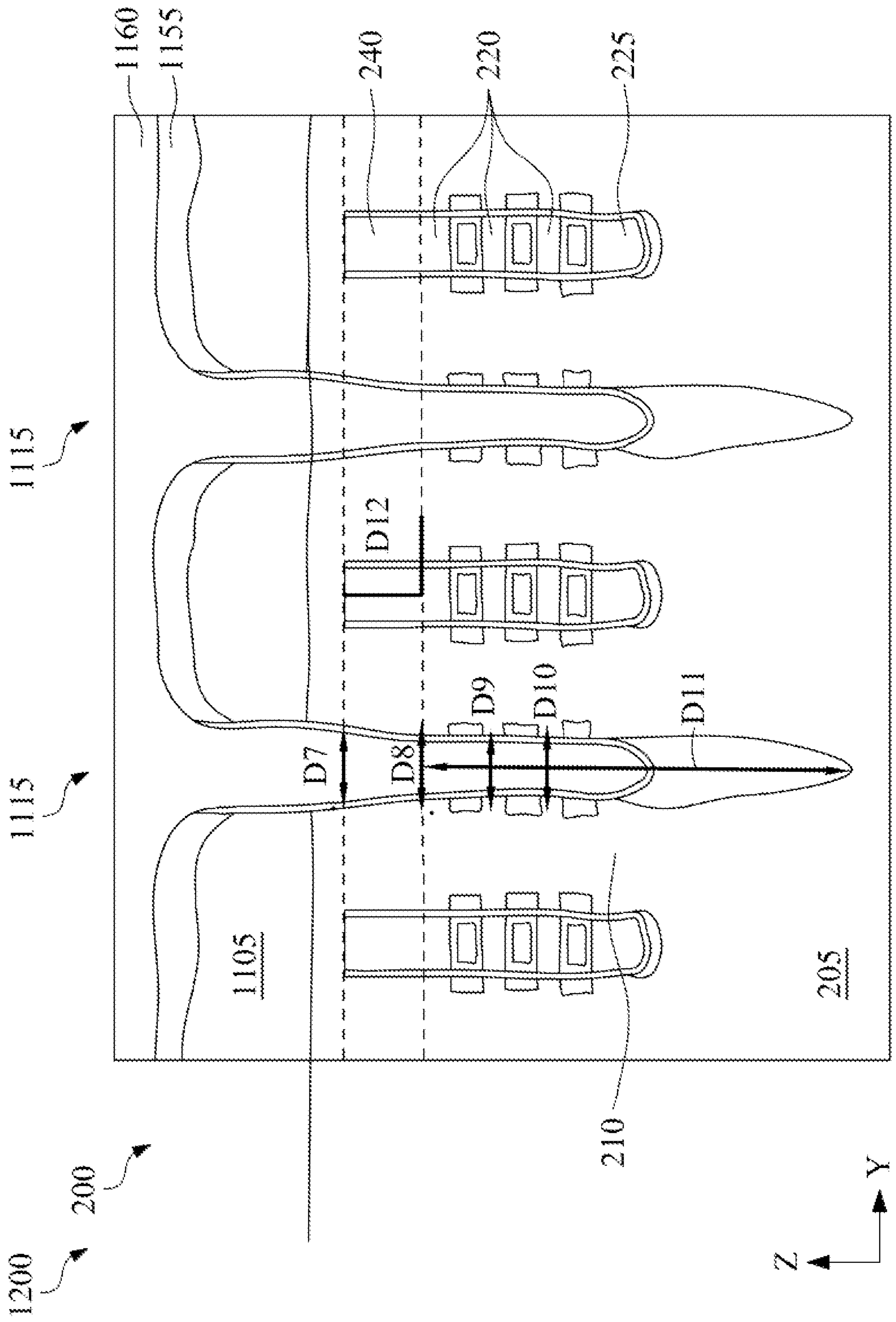

FIGS. 12A and 12B are diagrams of example implementations 1200 of the semiconductor device 200 described herein. FIG. 12A is an example implementation of a sparsely patterned CMODE area (e.g., an ISO area) of the semiconductor device 200, and FIG. 12B is an example implementation of a densely patterned CMODE area of the semiconductor device 200 that includes a plurality of active region isolation structures 1115.

As shown in FIG. 12A, the semiconductor device 200 may include one or more dimensions in the sparsely patterned CMODE area, such as a dimension D1, a dimension D2, a dimension D3, a dimension D4, a dimension D5, and/or a dimension D6, among other examples.

The dimension D1 may correspond to a width (sometimes referred to as a "critical dimension" or "CD") of the active region isolation structure 1115 at a height of the top of the gate structures 240 (corresponding to a bottom of the hard mask layer 1105). In some implementations, the dimension D1 may be included in a range of approximately 23 nanometers to approximately 24 nanometers. However, other values and/or other ranges for the dimension D1 are within the scope of the present disclosure.

The dimension D2 may correspond to a width of the active region isolation structure 1115 at a height of the topmost nanostructure channels 220. In some implementations, the dimension D2 may be included in a range of approximately 20 nanometers to approximately 21 nanometers. However, other values and/or other ranges for the dimension D2 are within the scope of the present disclosure.

The dimension D3 may correspond to a width of the active region isolation structure 1115 at a height of the middle nanostructure channels 220. In some implementations, the dimension D3 may be included in a range of approximately 18 nanometers to approximately 20 nanometers. However, other values and/or other ranges for the dimension D3 are within the scope of the present disclosure.

The dimension D4 may correspond to a width of the active region isolation structure 1115 at a height of the bottom nanostructure channels 220. In some implementations, the dimension D4 may be included in a range of approximately 18 nanometers to approximately 20 nanometers. However, other values and/or other ranges for the dimension D4 are within the scope of the present disclosure.

The dimension D5 may correspond to a depth, height, or thickness of the active region isolation structure 1115 to the topmost nanostructure channels 220. In some implementations, the dimension D5 may be included in a range of approximately 114 nanometers to approximately 115 nanometers. However, other values and/or other ranges for the dimension D5 are within the scope of the present disclosure.

The dimension D6 may correspond to an angle of a gate structure 240 relative to the surface of the topmost nanostructure channels 220. In some implementations, the dimension D6 may be included in a range of approximately 90 degrees to approximately 92 degrees. However, other values and/or other ranges for the dimension D6 are within the scope of the present disclosure.

In some implementations, a ratio of the dimension D1 to the dimension D2 is included in a range of approximately 1.09:1 to approximately 1.2:1. However, other values for the range are within the scope of the present disclosure. In some implementations, a ratio of the dimension D1 to the dimension D3 is included in a range of approximately 1.15:1 to approximately 1.33:1. However, other values for the range are within the scope of the present disclosure. In some implementations, a ratio of the dimension D1 to the dimension D4 is included in a range of approximately 1.15:1 to approximately 1.33:1. However, other values for the range are within the scope of the present disclosure. In some implementations, a ratio of the dimension D2 to the dimension D3 is included in a range of approximately 1:1 to approximately 1.17:1. However, other values for the range are within the scope of the present disclosure. In some implementations, a ratio of the dimension D2 to the dimension D4 is included in a range of approximately 1:1 to approximately 1.17:1. However, other values for the range are within the scope of the present disclosure.

In some implementations, a ratio of the dimension D5 to the dimension D1 is included in a range of approximately 4.75:1 to approximately 5:1. However, other values for the range are within the scope of the present disclosure. In some implementations, a ratio of the dimension D5 to the dimension D2 is included in a range of approximately 5.42:1 to approximately 5.75:1. However, other values for the range are within the scope of the present disclosure. In some implementations, a ratio of the dimension D5 to the dimension D3 is included in a range of approximately 5.7:1 to approximately 6.39:1. However, other values for the range are within the scope of the present disclosure. In some implementations, a ratio of the dimension D5 to the dimension D4 is included in a range of approximately 5.7:1 to approximately 6.39:1. However, other values for the range are within the scope of the present disclosure.

As shown in FIG. 12B, the semiconductor device 200 may include one or more dimensions in the densely patterned CMODE area, such as a dimension D7, a dimension D8, a dimension D9, a dimension D10, a dimension D11, and/or a dimension D12, among other examples.

The dimension D7 may correspond to a width of an active region isolation structure 1115 at a height of the top of the gate structures 240 (corresponding to a bottom of the hard mask layer 1105). In some implementations, the dimension D7 may be included in a range of approximately 20.5 nanometers to approximately 25.3 nanometers. However, other values and/or other ranges for the dimension D7 are within the scope of the present disclosure.

The dimension D8 may correspond to a width of an active region isolation structure 1115 at a height of the topmost nanostructure channels 220. In some implementations, the dimension D8 may be included in a range of approximately 18.8 nanometers to approximately 21.9 nanometers. However, other values and/or other ranges for the dimension D8 are within the scope of the present disclosure.

The dimension D9 may correspond to a width of an active region isolation structure 1115 at a height of the middle nanostructure channels 220. In some implementations, the dimension D9 may be included in a range of approximately 16.2 nanometers to approximately 19.6 nanometers. However, other values and/or other ranges for the dimension D9 are within the scope of the present disclosure.

The dimension D10 may correspond to a width of an active region isolation structure 1115 at a height of the bottom nanostructure channels 220. In some implementations, the dimension D10 may be included in a range of approximately 15.3 nanometers to approximately 18.9 nanometers. However, other values and/or other ranges for the dimension D10 are within the scope of the present disclosure.

The dimension D11 may correspond to a depth, height, or thickness of an active region isolation structure 1115 to the topmost nanostructure channels 220. In some implementations, the dimension D11 may be included in a range of approximately 99.4 nanometers to approximately 154.9 nanometers. However, other values and/or other ranges for the dimension D11 are within the scope of the present disclosure.

The dimension D12 may correspond to an angle of a gate structure 240 relative to the surface of the topmost nanostructure channels 220. In some implementations, the dimension D12 may be included in a range of approximately 88.2 degrees to approximately 92 degrees. However, other values and/or other ranges for the dimension D12 are within the scope of the present disclosure.

In some implementations, a ratio of the dimension D7 to the dimension D8 is included in a range of approximately 0.93:1 to approximately 1.35:1. However, other values for the range are within the scope of the present disclosure. In some implementations, a ratio of the dimension D7 to the dimension D9 is included in a range of approximately 1.04:1 to approximately 1.56:1. However, other values for the range are within the scope of the present disclosure. In some implementations, a ratio of the dimension D7 to the dimension D10 is included in a range of approximately 1.08:1 to approximately 1.65:1. However, other values for the range are within the scope of the present disclosure. In some implementations, a ratio of the dimension D8 to the dimension D9 is included in a range of approximately 0.961 to approximately 1.35:1. However, other values for the range are within the scope of the present disclosure. In some implementations, a ratio of the dimension D8 to the dimension D10 is included in a range of approximately 1:1 to approximately 1.43:1. However, other values for the range are within the scope of the present disclosure. In some implementations, a ratio of the dimension D9 to the dimension D10 is included in a range of approximately 0.086:1 to approximately 1.28:1. However, other values for the range are within the scope of the present disclosure.

In some implementations, a ratio of the dimension D11 to the dimension D7 is included in a range of approximately 3.92:1 to approximately 7.56:1. However, other values for the range are within the scope of the present disclosure. In some implementations, a ratio of the dimension D11 to the dimension D8 is included in a range of approximately 4.53:1 to approximately 8.24:1. However, other values for the range are within the scope of the present disclosure. In some implementations, a ratio of the dimension D11 to the dimension D9 is included in a range of approximately 5.07:1 to approximately 9.56:1. However, other values for the range are within the scope of the present disclosure. In some implementations, a ratio of the dimension D11 to the dimension D10 is included in a range of approximately 5.25:1 to approximately 10.13:1. However, other values for the range are within the scope of the present disclosure.

As indicated above, FIGS. 12A and 12B are provided as examples. Other examples may differ from what is described with regard to FIGS. 12A and 12B.

Figure 13:
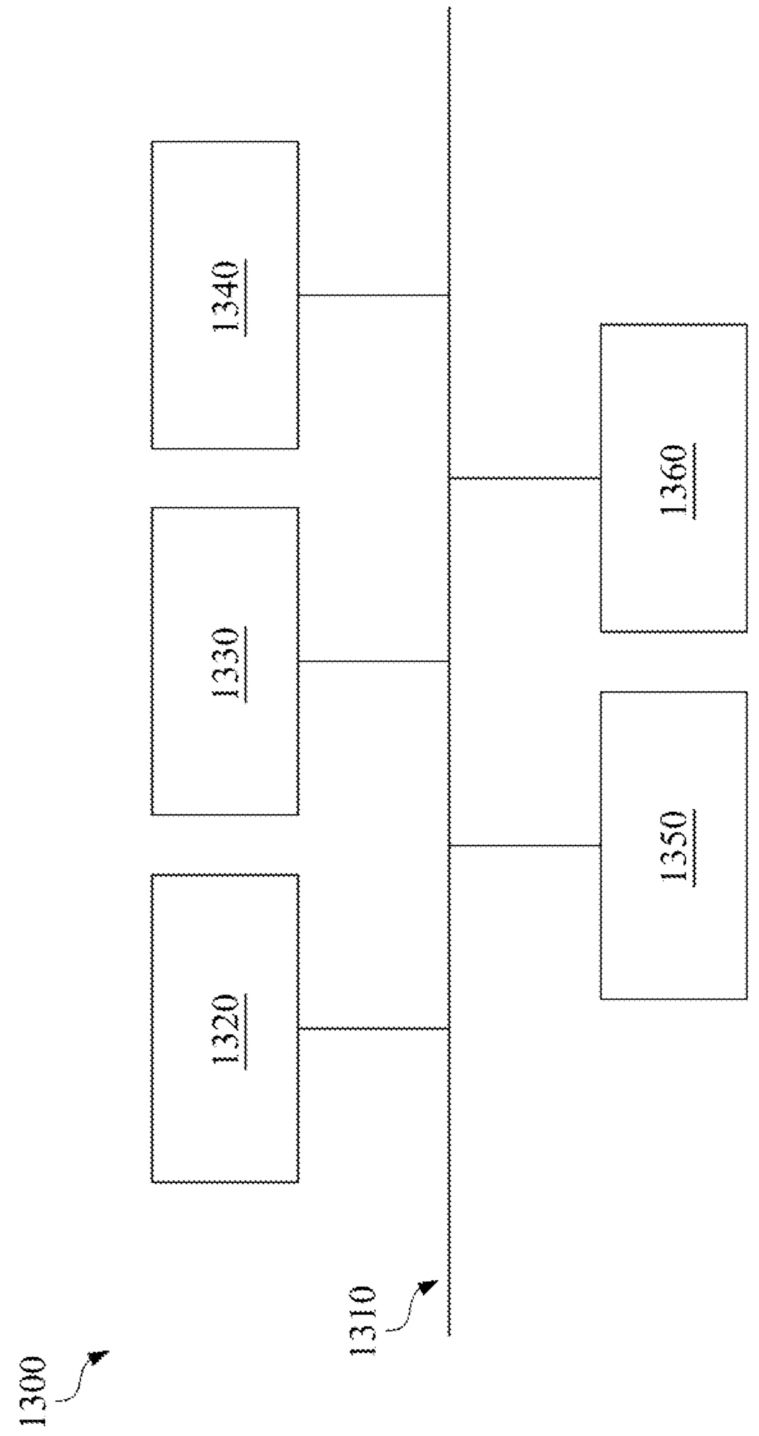
FIG. 13 is a diagram of example components of one or more devices described herein.

FIG. 13 is a diagram of example components of a device 1300 described herein. In some implementations, one or more of the semiconductor processing tools 102-112 and/or the wafer/die transport tool 114 may include one or more devices 1300 and/or one or more components of the device 1300. As shown in FIG. 13, the device 1300 may include a bus 1310, a processor 1320, a memory 1330, an input component 1340, an output component 1350, and/or a communication component 1360.

The bus 1310 may include one or more components that enable wired and/or wireless communication among the components of the device 1300. The bus 1310 may couple together two or more components of FIG. 13, such as via operative coupling, communicative coupling, electronic coupling, and/or electric coupling. For example, the bus 1310 may include an electrical connection (e.g., a wire, a trace, and/or a lead) and/or a wireless bus. The processor 1320 may include a central processing unit, a graphics processing unit, a microprocessor, a controller, a microcontroller, a digital signal processor, a field-programmable gate array, an application-specific integrated circuit, and/or another type of processing component. The processor 1320 may be implemented in hardware, firmware, or a combination of hardware and software. In some implementations, the processor 1320 may include one or more processors capable of being programmed to perform one or more operations or processes described elsewhere herein.

The memory 1330 may include volatile and/or nonvolatile memory. For example, the memory 1330 may include random access memory (RAM), read only memory (ROM), a hard disk drive, and/or another type of memory (e.g., a flash memory, a magnetic memory, and/or an optical memory). The memory 1330 may include internal memory (e.g., RAM, ROM, or a hard disk drive) and/or removable memory (e.g., removable via a universal serial bus connection). The memory 1330 may be a non-transitory computer-readable medium. The memory 1330 may store information, one or more instructions, and/or software (e.g., one or more software applications) related to the operation of the device 1300. In some implementations, the memory 1330 may include one or more memories that are coupled (e.g., communicatively coupled) to one or more processors (e.g., processor 1320), such as via the bus 1310. Communicative coupling between a processor 1320 and a memory 1330 may enable the processor 1320 to read and/or process information stored in the memory 1330 and/or to store information in the memory 1330.

The input component 1340 may enable the device 1300 to receive input, such as user input and/or sensed input. For example, the input component 1340 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 1350 may enable the device 1300 to provide output, such as via a display, a speaker, and/or a light-emitting diode. The communication component 1360 may enable the device 1300 to communicate with other devices via a wired connection and/or a wireless connection. For example, the communication component 1360 may include a receiver, a transmitter, a transceiver, a modem, a network interface card, and/or an antenna.

The device 1300 may perform one or more operations or processes described herein. For example, a non-transitory computer-readable medium (e.g., memory 1330) may store a set of instructions (e.g., one or more instructions or code) for execution by the processor 1320. The processor 1320 may execute the set of instructions to perform one or more operations or processes described herein. In some implementations, execution of the set of instructions, by one or more processors 1320, causes the one or more processors 1320 and/or the device 1300 to perform one or more operations or processes described herein. In some implementations, hardwired circuitry may be used instead of or in combination with the instructions to perform one or more operations or processes described herein. Additionally, or alternatively, the processor 1320 may be configured to perform one or more operations or processes described herein. Thus, implementations described herein are not limited to any specific combination of hardware circuitry and software.

The number and arrangement of components shown in FIG. 13 are provided as an example. The device 1300 may include additional components, fewer components, different components, or differently arranged components than those shown in FIG. 13. Additionally, or alternatively, a set of components (e.g., one or more components) of the device 1300 may perform one or more functions described as being performed by another set of components of the device 1300.

Figure 14:
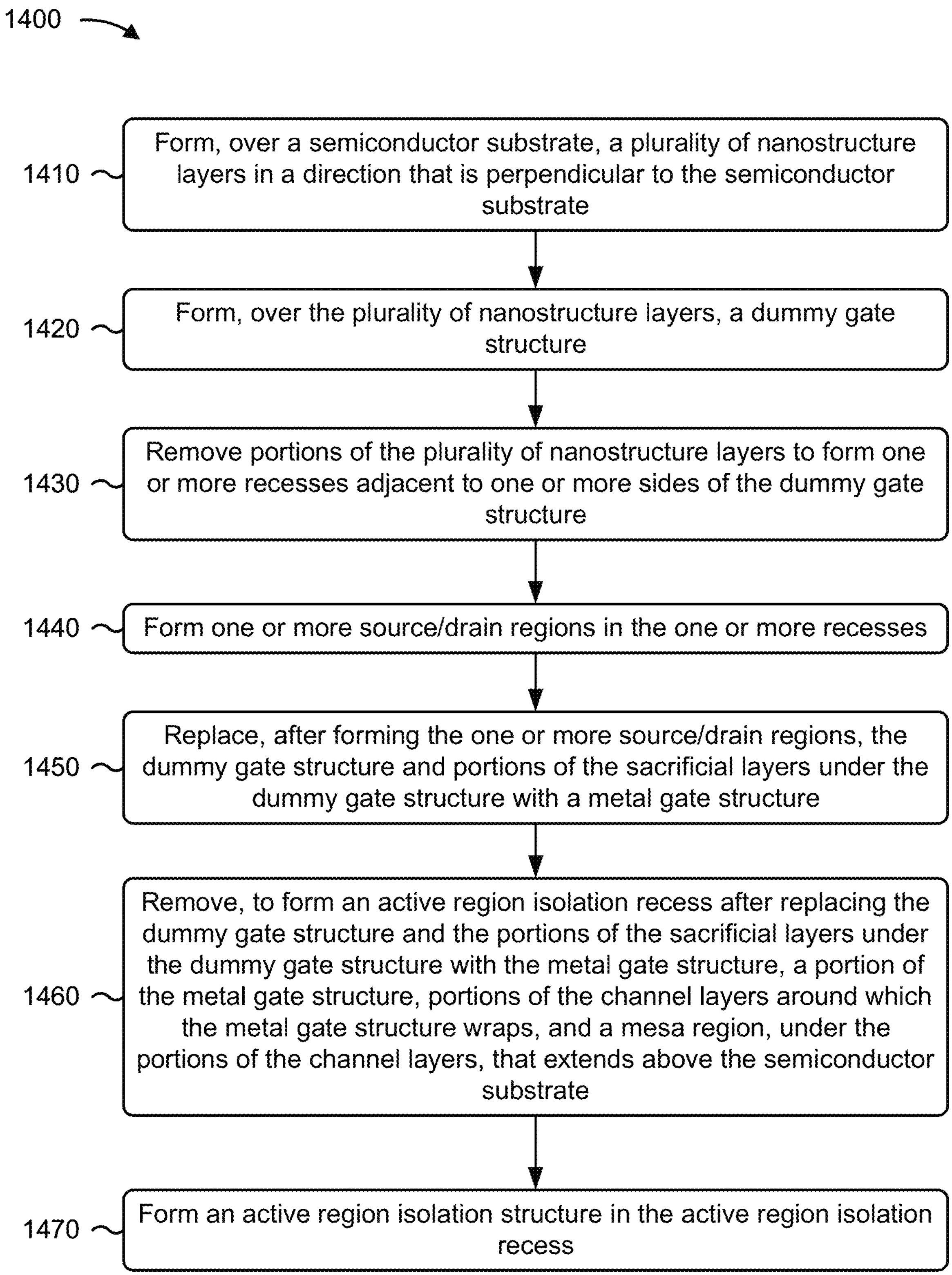
FIGS. 14 and 15 are flowcharts of example processes associated with forming a semiconductor device described herein.

FIG. 14 is a flowchart of an example process 1400 associated with forming a semiconductor device described herein. In some implementations, one or more process blocks of FIG. 14 are performed using one or more semiconductor processing tools (e.g., one or more of the semiconductor processing tools 102-112). Additionally, or alternatively, one or more process blocks of FIG. 14 may be performed using one or more components of device 1300, such as processor 1320, memory 1330, input component 1340, output component 1350, and/or communication component 1360.

As shown in FIG. 14, process 1400 may include forming, over a semiconductor substrate, a plurality of nanostructure layers in a direction that is perpendicular to the semiconductor substrate (block 1410). For example, one or more of the semiconductor processing tools 102-112 may be used to form, over a semiconductor substrate 205, a plurality of nanostructure layers (e.g., a layer stack 305) in a direction (e.g., the Z direction) that is perpendicular to the semiconductor substrate 205, as described herein. In some implementations, the plurality of nanostructure layers include a plurality of sacrificial layers (e.g., first layers 310) alternating with a plurality of channel layers (e.g., second layers 315).

As further shown in FIG. 14, process 1400 may include forming, over the plurality of nanostructure layers, a dummy gate structure (block 1420). For example, one or more of the semiconductor processing tools 102-112 may be used to form, over the plurality of nanostructure layers, a dummy gate structure 705, as described herein.

As further shown in FIG. 14, process 1400 may include removing portions of the plurality of nanostructure layers to form one or more recesses adjacent to one or more sides of the dummy gate structure (block 1430). For example, one or more of the semiconductor processing tools 102-112 may be used to remove portions of the plurality of nanostructure layers to form one or more recesses (e.g., source/drain recesses 805) adjacent to one or more sides of the dummy gate structure 705, as described herein.

As further shown in FIG. 14, process 1400 may include forming one or more source/drain regions in the one or more recesses (block 1440). For example, one or more of the semiconductor processing tools 102-112 may be used to form one or more source/drain regions 225 in the one or more recesses (e.g., source/drain recesses 805), as described herein.

As further shown in FIG. 14, process 1400 may include replacing, after forming the one or more source/drain regions, the dummy gate structure and portions of the sacrificial layers under the dummy gate structure with a metal gate structure (block 1450). For example, one or more of the semiconductor processing tools 102-112 may be used to replace, after forming the one or more source/drain regions 225, the dummy gate structure 705 and portions of the sacrificial layers under the dummy gate structure 705 with a metal gate structure (e.g., a gate structure 240), as described herein. In some implementations, the metal gate structure wraps around at least three sides of the channel layers.

As further shown in FIG. 14, process 1400 may include removing, to form an active region isolation recess after replacing the dummy gate structure and the portions of the sacrificial layers under the dummy gate structure with the metal gate structure, a portion of the metal gate structure, portions of the channel layers around which the metal gate structure wraps, and a mesa region, under the portions of the channel layers, that extends above the semiconductor substrate (block 1460). For example, one or more of the semiconductor processing tools 102-112 may be used to remove, to form an active region isolation recess 1145 after replacing the dummy gate structure 705 and the portions of the sacrificial layers under the dummy gate structure 705 with the metal gate structure, a portion of the metal gate structure, portions 340 of the channel layers around which the metal gate structure wraps, and a mesa region 210, under the portions 340 of the channel layers, that extends above the semiconductor substrate 205, as described herein.

As further shown in FIG. 14, process 1400 may include forming an active region isolation structure in the active region isolation recess (block 1470). For example, one or more of the semiconductor processing tools 102-112 may be used to form an active region isolation structure 1115 in the active region isolation recess 1145, as described herein.

Process 1400 may include additional implementations, such as any single implementation or any combination of implementations described below and/or in connection with one or more other processes described elsewhere herein.

In a first implementation, process 1400 includes removing, prior to removing the portion of the metal gate structure to form the active region isolation recess 1145, another portion of the metal gate structure to form a gate isolation recess in the metal gate structure, and forming, prior to removing the portion of the metal gate structure to form the active region isolation recess 1145, a gate isolation structure 1110 in the gate isolation recess.

In a second implementation, alone or in combination with the first implementation, removing the portion of the metal gate structure, the portions 340 of the channel layers around which the metal gate structure wraps, and the mesa region 210 includes removing, based on the gate isolation structure 1110, the portion of the metal gate structure, the portions 340 of the channel layers around which the metal gate structure wraps, and the mesa region 210.

In a third implementation, alone or in combination with one or more of the first and second implementations, process 1400 includes removing, prior to removing the portion of the metal gate structure to form the active region isolation recess 1145, a plurality of other portions of the metal gate structure to form a plurality of gate isolation recesses in the metal gate structure, and forming, prior to removing the portion of the metal gate structure to form the active region isolation recess 1145, a plurality of gate isolation structures 1110 in the plurality of gate isolation recesses.

In a fourth implementation, alone or in combination with one or more of the first through third implementations, removing the portion of the metal gate structure, the portions 340 of the channel layers around which the metal gate structure wraps, and the mesa region 210 includes removing, from between the plurality of gate isolation structures 1110, the portion of the metal gate structure, the portions 340 of the channel layers around which the metal gate structure wraps, and the mesa region 210.

In a fifth implementation, alone or in combination with one or more of the first through fourth implementations, forming the active region isolation structure 1115 includes forming a dielectric liner 1155 on sidewalls of the plurality of gate isolation structures 1110 in the active region isolation recess 1145, and filling the active region isolation recess 1145 with a dielectric layer 1160 over the dielectric liner 1155.

In a sixth implementation, alone or in combination with one or more of the first through fifth implementations, forming the plurality of gate isolation structures 1110 includes forming the plurality of gate isolation structures 1110 such that the plurality of gate isolation structures 1110 extend in a first direction (e.g., the X direction) across the metal gate structure, and forming the active region isolation structure 1115 includes forming the active region isolation structure 1115 such that the active region isolation structure 1115 extends in a second direction (e.g., the Y direction) in which the metal gate structure extends.

Although FIG. 14 shows example blocks of process 1400, in some implementations, process 1400 includes additional blocks, fewer blocks, different blocks, or differently arranged blocks than those depicted in FIG. 14. Additionally, or alternatively, two or more of the blocks of process 1400 may be performed in parallel.

Figure 15:
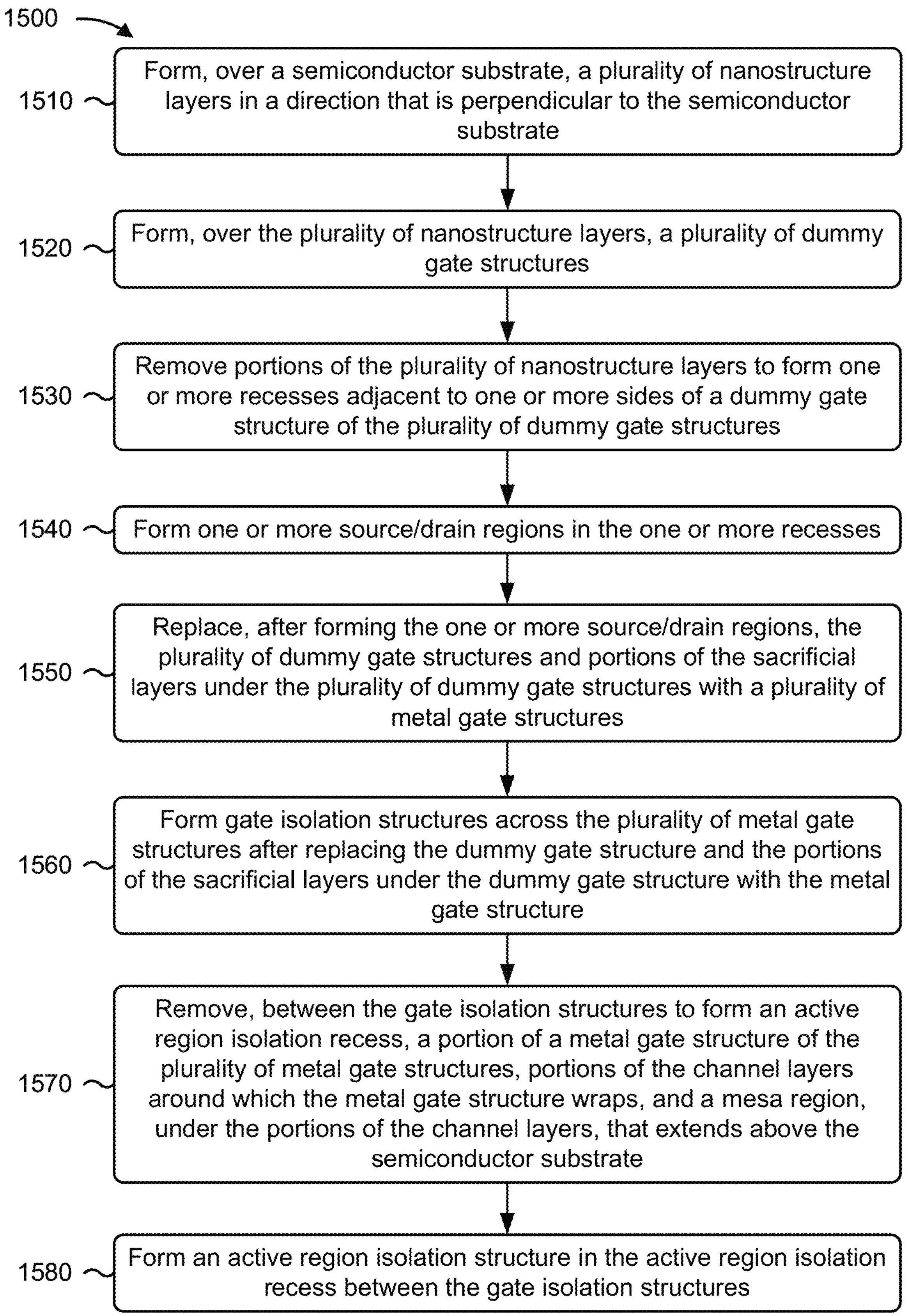

FIG. 15 is a flowchart of an example process 1500 associated with forming a semiconductor device described herein. In some implementations, one or more process blocks of FIG. 15 are performed using one or more semiconductor processing tools (e.g., one or more of the semiconductor processing tools 102-112). Additionally, or alternatively, one or more process blocks of FIG. 15 may be performed using one or more components of device 1300, such as processor 1320, memory 1330, input component 1340, output component 1350, and/or communication component 1360.

As shown in FIG. 15, process 1500 may include forming, over a semiconductor substrate, a plurality of nanostructure layers in a direction that is perpendicular to the semiconductor substrate (block 1510). For example, one or more of the semiconductor processing tools 102-112 may be used to form, over a semiconductor substrate 205, a plurality of nanostructure layers (e.g., a layer stack 305) in a direction (e.g., the Z direction) that is perpendicular to the semiconductor substrate 205, as described herein. In some implementations, the plurality of nanostructure layers includes a plurality of sacrificial layers (e.g., first layers 310) alternating with a plurality of channel layers (e.g., second layers 315).

As further shown in FIG. 15, process 1500 may include forming, over the plurality of nanostructure layers, a plurality of dummy gate structures (block 1520). For example, one or more of the semiconductor processing tools 102-112 may be used to form, over the plurality of nanostructure layers, a plurality of dummy gate structures 705, as described herein.

As further shown in FIG. 15, process 1500 may include removing portions of the plurality of nanostructure layers to form one or more recesses adjacent to one or more sides of a dummy gate structure of the plurality of dummy gate structures (block 1530). For example, one or more of the semiconductor processing tools 102-112 may be used to remove portions of the plurality of nanostructure layers to form one or more recesses (e.g., source/drain recesses 805) adjacent to one or more sides of a dummy gate structure 705 of the plurality of dummy gate structures 705, as described herein.

As further shown in FIG. 15, process 1500 may include forming one or more source/drain regions in the one or more recesses (block 1540). For example, one or more of the semiconductor processing tools 102-112 may be used to form one or more source/drain regions 225 in the one or more recesses (e.g., source/drain recesses 805), as described herein.

As further shown in FIG. 15, process 1500 may include replacing, after forming the one or more source/drain regions, the plurality of dummy gate structures and portions of the sacrificial layers under the plurality of dummy gate structures with a plurality of metal gate structures (block 1550). For example, one or more of the semiconductor processing tools 102-112 may be used to replace, after forming the one or more source/drain regions 225, the plurality of dummy gate structures 705 and portions of the sacrificial layers under the plurality of dummy gate structures 705 with a plurality of metal gate structures (e.g., gate structures 240), as described herein. In some implementations, the plurality of metal gate structures wraps around at least three sides of the channel layers.

As further shown in FIG. 15, process 1500 may include forming gate isolation structures across the plurality of metal gate structures after replacing the dummy gate structure and the portions of the sacrificial layers under the dummy gate structure with the metal gate structure (block 1560). For example, one or more of the semiconductor processing tools 102-112 may be used to form gate isolation structures 1110 across the plurality of metal gate structures after replacing the dummy gate structure 705 and the portions of the sacrificial layers under the dummy gate structure 705 with the metal gate structure, as described herein.

As further shown in FIG. 15, process 1500 may include removing, between the gate isolation structures to form an active region isolation recess, a portion of a metal gate structure of the plurality of metal gate structures, portions of the channel layers around which the metal gate structure wraps, and a mesa region, under the portions of the channel layers, that extends above the semiconductor substrate (block 1570). For example, one or more of the semiconductor processing tools 102-112 may be used to remove, between the gate isolation structures 1110 to form an active region isolation recess 1145, a portion of a metal gate structure of the plurality of metal gate structures, portions 340 of the channel layers around which the metal gate structure wraps, and a mesa region 210, under the portions 340 of the channel layers, that extends above the semiconductor substrate 205, as described herein.

As further shown in FIG. 15, process 1500 may include forming an active region isolation structure in the active region isolation recess between the gate isolation structures (block 1580). For example, one or more of the semiconductor processing tools 102-112 may be used to form an active region isolation structure 1115 in the active region isolation recess 1145 between the gate isolation structures 1110, as described herein.

Process 1500 may include additional implementations, such as any single implementation or any combination of implementations described below and/or in connection with one or more other processes described elsewhere herein.

In a first implementation, removing the portion of the metal gate structure, the portions 340 of the channel layers around which the metal gate structure wraps, and the mesa region 210 includes etching, using the gate isolation structures 1110 as a self-aligned mask, the portion of the metal gate structure, the portions 340 of the channel layers around which the metal gate structure wraps, and the mesa region 210.

In a second implementation, alone or in combination with the first implementation, removing the portion of the metal gate structure, the portions 340 of the channel layers around which the metal gate structure wraps, and the mesa region 210 includes performing a first etch operation to remove the portion of the metal gate structure, and performing, after the first etch operation, a second etch operation to remove the portions 340 of the channel layers around which the metal gate structure wraps, and the mesa region 210.

In a third implementation, alone or in combination with one or more of the first and second implementations, process 1500 includes performing, prior to the first etch operation, a third etch operation to remove a portion of a hard mask layer 1105 over the portion of the metal gate structure.

In a fourth implementation, alone or in combination with one or more of the first through third implementations, process 1500 includes forming the hard mask layer 1105 over the gate isolation structures 1110 prior to removing the portion of the metal gate structure, the portions 340 of the channel layers around which the metal gate structure wraps, and the mesa region 210.

In a fifth implementation, alone or in combination with one or more of the first through fourth implementations, forming the active region isolation structure 1115 includes forming a dielectric liner 1155 in the active region isolation recess 1145, and filling the active region isolation recess 1145 with a dielectric layer 1160 over the dielectric liner 1155.

In a sixth implementation, alone or in combination with one or more of the first through fifth implementations, forming the dielectric liner 1155 includes forming the dielectric liner 1155 such that the dielectric liner 1155 is in direct contact with sidewalls of the gate isolation structures 1110.

Although FIG. 15 shows example blocks of process 1500, in some implementations, process 1500 includes additional blocks, fewer blocks, different blocks, or differently arranged blocks than those depicted in FIG. 15. Additionally, or alternatively, two or more of the blocks of process 1500 may be performed in parallel.

FIGS. 16A-16E are diagrams of an example implementation 1600 of forming an active region isolation structure described herein. The example implementation 1600 includes an example of forming the active region isolation structure (e.g., a CMODE structure) in the semiconductor device 200 after the replacement gate process to replace the dummy gate structures 705 with the gate structures 240 (metal gate structures) of the semiconductor device 200. The active region isolation structure may be formed along a gate structure 240 to create a region of electrical isolation in one or more mesa regions 210 and/or one or more stacks of nanostructure channels 220 under the gate structure 240. Thus, the active region isolation structure enables an underlying nanostructure channel 220 to be separated into multiple (electrically isolated) nanostructure channels 220.

FIGS. 16A-16E are illustrated from a plurality of perspectives illustrated in FIG. 7A, including the perspective of the cross-sectional plane B-B in FIG. 7A (e.g., across a plurality of gate structures 240) and the perspective of the cross-sectional plane C-C in FIG. 7A (e.g., along a gate structure 240). In some implementations, the operations described in connection with the example implementation 1600 are performed after the operations described in connection with FIGS. 3A-10C.

Figure 16A:
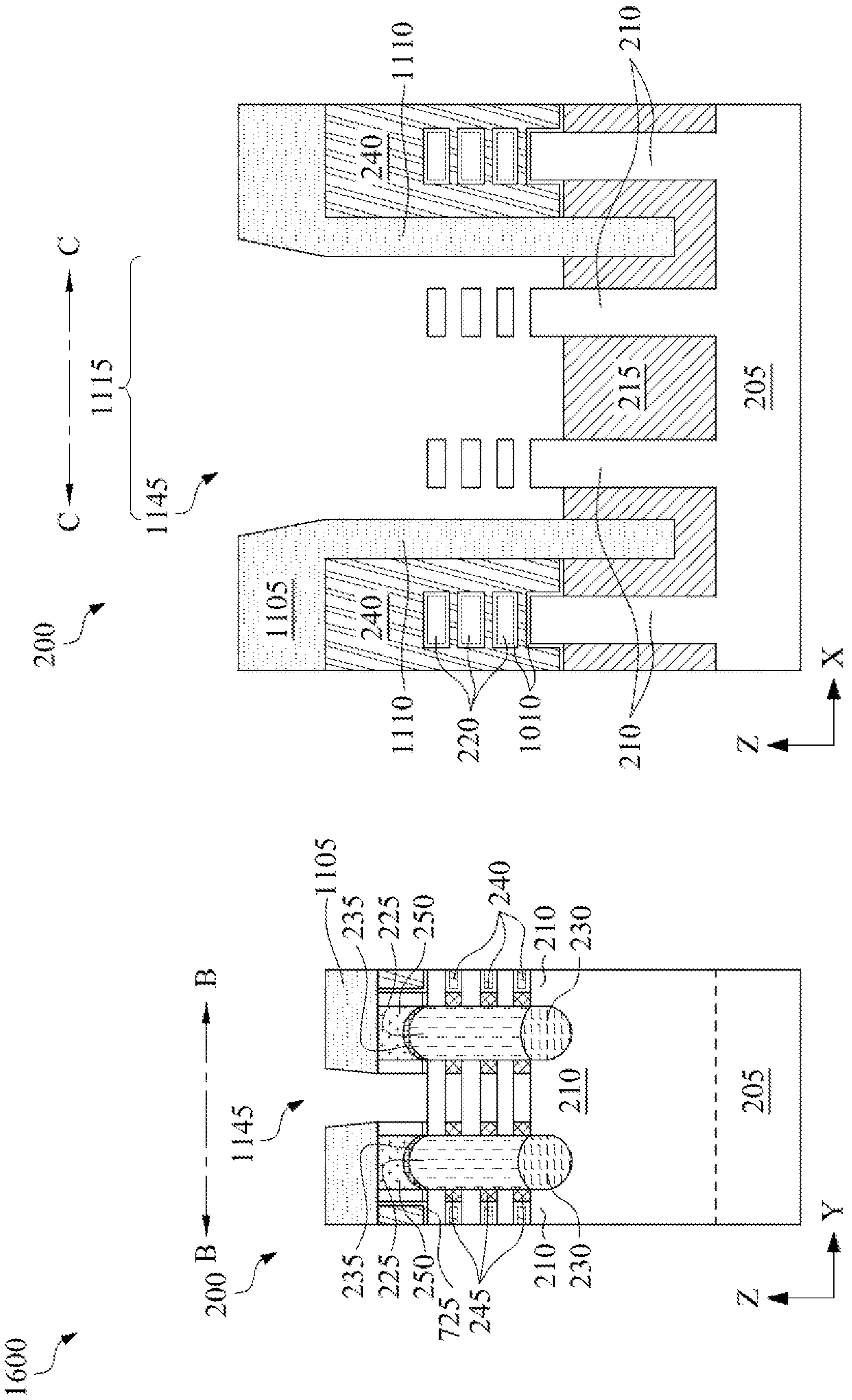
FIGS. 16A-16E are diagrams of an example implementation of a forming an active region isolation structure described herein.

As shown in FIG. 16A, one or more operations described in connection with FIGS. 11A-11D may be performed to form the active region isolation recess 1145 between the gate isolation structures 1110. The nanostructure channels 220 between the gate isolation structures 1110 may be exposed in the active region isolation recess 1145 after the gate structure 240 and high-k dielectric liner 1010 are etched. Moreover, portions of the mesa regions 210 under the nanostructure channels 220 between the gate isolation structures 1110 may be exposed in the active region isolation recess 1145 after the gate structure 240 and high-k dielectric liner 1010 are etched. In some implementations, a wet cleaning operation may be performed after the gate structure 240 and high-k dielectric liner 1010 are etched.

Figure 16B:
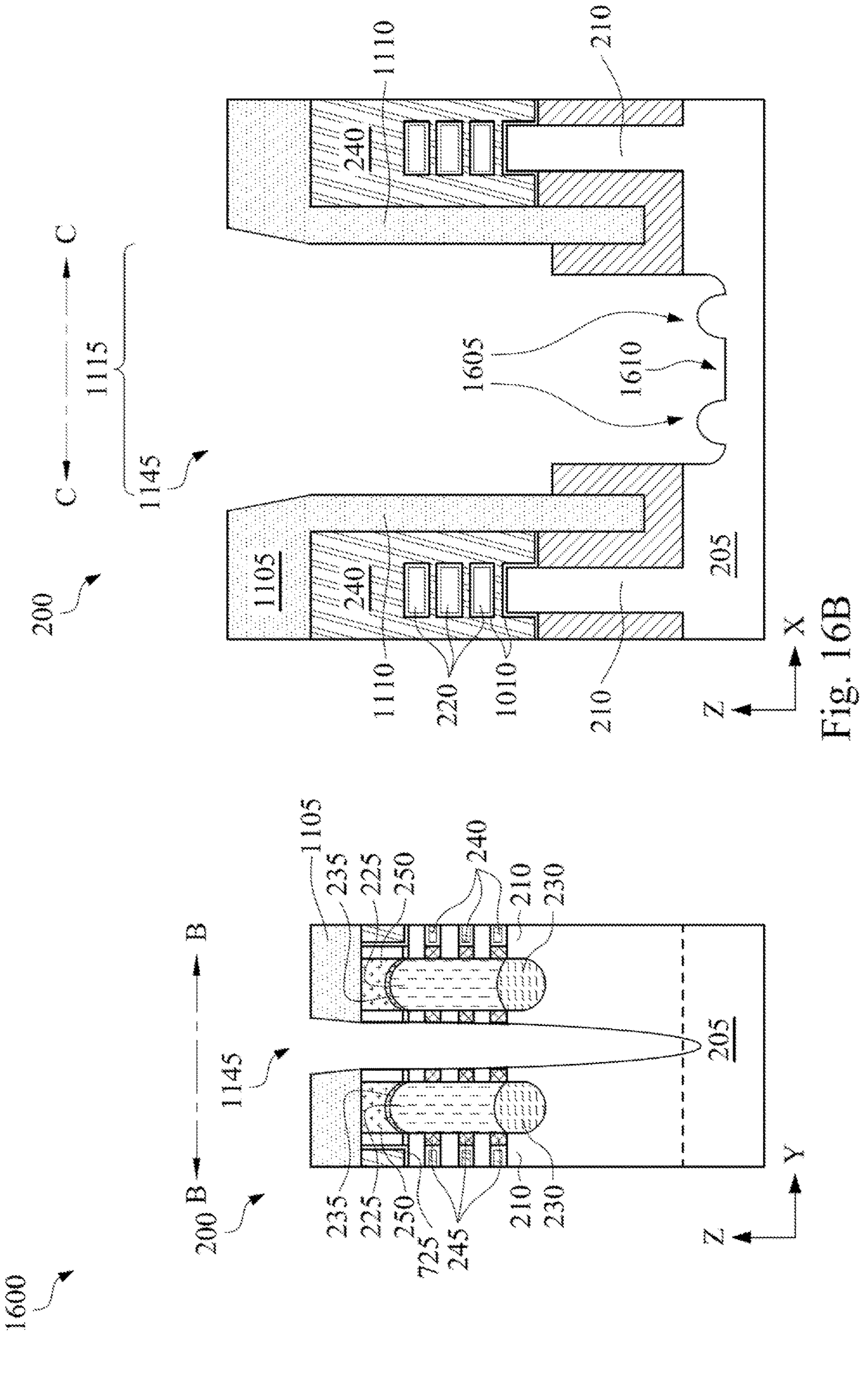

As shown in FIG. 16B, the nanostructure channels 220 between the gate isolation structures 1110, that are exposed in the active region isolation recess 1145, may be removed after the gate structure 240 and high-k dielectric liner 1010 are etched. Moreover, the mesa regions 210 under the nanostructure channels 220 may be removed through the active region isolation recess 1145. In comparison to the example implementation 1100 of FIGS. 11A-11I, the STI regions 215 that are located between the gate isolation structures 1110 are also removed in the example implementation 1600, as shown in FIG. 16B. This is due to the use of a low-selectivity etch technique, whereas the example implementation 1100 includes a high-selectivity etch technique (which results in the STI regions 215 that are located between the gate isolation structures 1110 remaining in the example implementation 1100).

The active region isolation recess 1145 extends down to and into the semiconductor substrate 205. As shown in FIG. 16B, the bottom surface of the active region isolation recess 1145 may have areas with different contours or segments. For example, segments 1605 may be raised above segments 1610. This may occur due to the different etch rates of the mesa portions 210 and the STI regions 215. In some implementations, an RCP is used to form the active region isolation recess 1145. The plasma may be a hydrogen bromide (HBr) based plasma etchant, a chlorine ($Cl_2$) based plasma etchant, a boron trichloride ($BCl_3$) based plasma etchant, and/or another plasma based etchant with oxygen ($O_2$) and/or carbon dioxide ($CO_2$) added. The concentration of $BCl_3$ and/or $Cl_2$ may be increased, relative to the example implementation 1100, to decrease the etch selectivity between the mesa regions 210 (e.g., silicon) and the STI regions 215 (e.g., silicon dioxide).

The plasma may be generated using an etch tool 108, such as an ICP tool, a resonant antenna plasma source driven by an RF power generator, and/or another type of plasma based etch tool. A frequency of a multiple of 13.56 MHz (e.g., 13.56 MHZ, 27 MHz) may be used for the RF power generator. The RF power generator may be operated to provide a source power that is included in a range of approximately 100 watts to approximately 2500 watts. However, other values for the range are within the scope of the present disclosure. In some implementations, a pulse plasma etch may be performed with a duty cycle that is included in a range of approximately 10% to approximately 100%. However, other values for the range are within the scope of the present disclosure. An RF bias power to a pedestal in the process chamber of the etch tool 108 may be included in a range of approximately 10 watts to approximately 2000 watts. However, other values for the range are within the scope of the present disclosure. The process chamber of the etch tool 108 may be operated at a pressure that is included in a range of approximately 3 mTorr to approximately 150 mTorr. However, other values for the range are within the scope of the present disclosure. The process chamber of the etch tool 108 may be operated at a temperature that is included in a range of approximately 20 degrees Celsius to approximately 150 degrees Celsius. However, other values for the range are within the scope of the present disclosure.

Figure 16C:
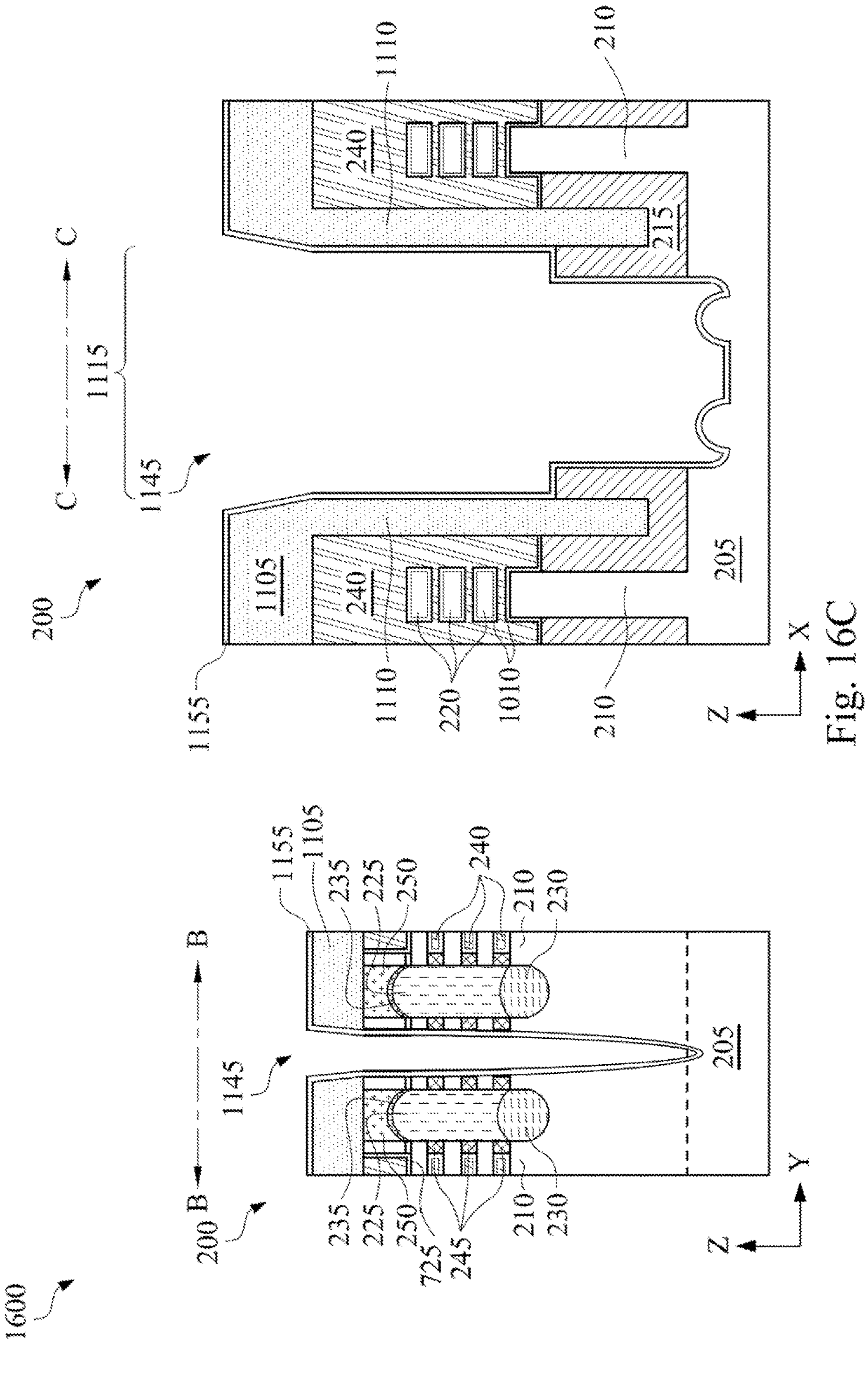

As shown in FIG. 16C, the dielectric liner 1155 of the active region isolation structure 1115 may be formed in the active region isolation recess 1145. The dielectric liner 1155 may be conformally deposited on the sidewalls of the active region isolation recess 1145 (corresponding to sidewalls of the gate isolation structures 1110 that are exposed in the active region isolation recess 1145 and portions of the STI regions 215 under the gate isolation structures 1110), and on bottom surfaces of the active region isolation recess 1145 (corresponding to top surfaces of the semiconductor substrate 205). A deposition tool 102 may be used to deposit the dielectric liner 1155 using a PVD technique, an ALD technique, a CVD technique, an oxidation technique, another type of deposition technique described in connection with FIG. 1, and/or another suitable deposition technique. The dielectric liner 1155 may include a dielectric material such as a silicon oxide ($SiO_x$ such as $SiO_2$), a silicon nitride ($Si_xN_y$ such as a $Si_3N_4$), a silicon oxynitride (SiON), fluoride-doped silicate glass (FSG), a high-k dielectric material, and/or another suitable dielectric material.

Figure 16D:
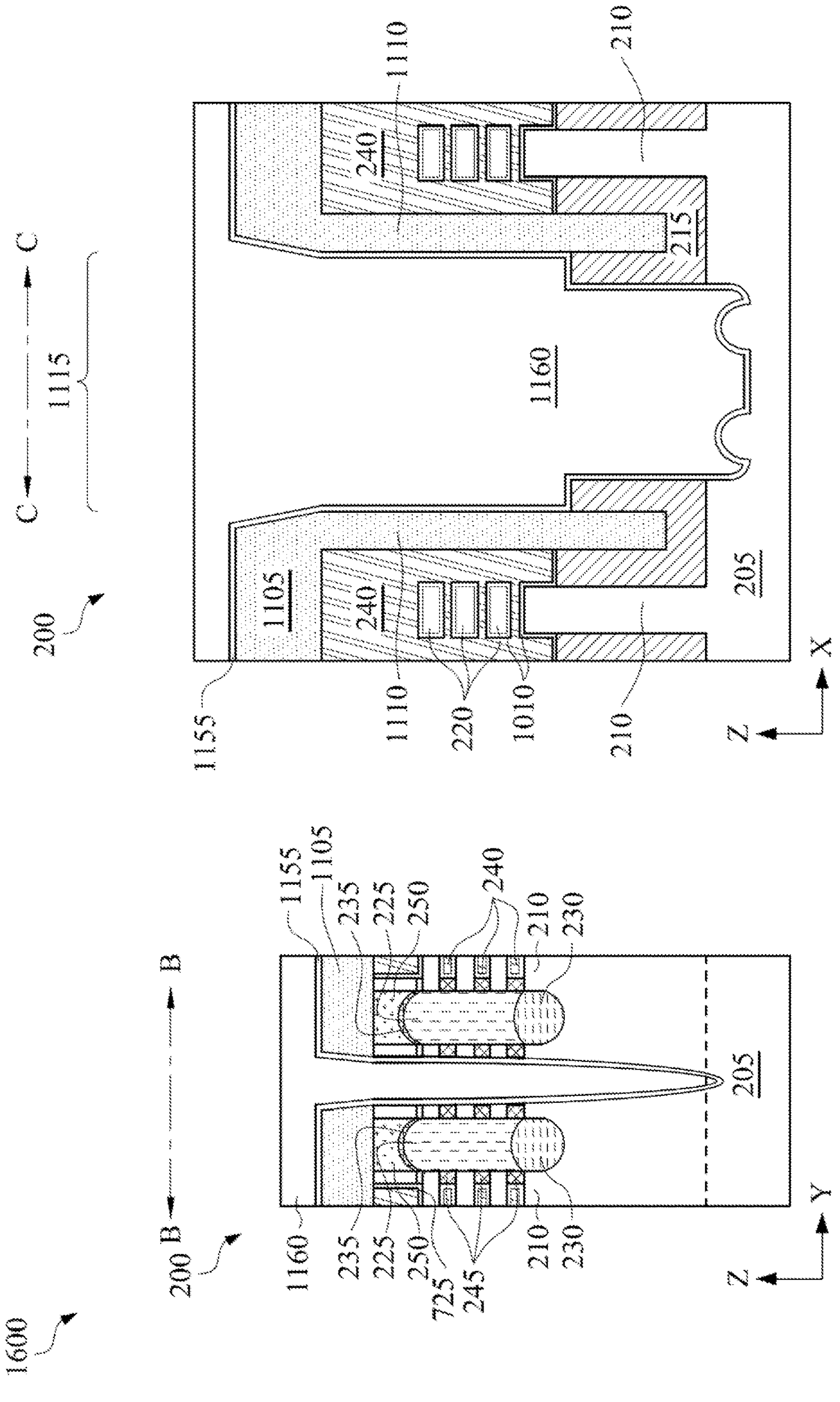

As shown in FIG. 16D, the active region isolation recess 1145 may be filled with a dielectric layer 1160 over and/or on the dielectric liner 1155 of the active region isolation structure 1115. The active region isolation recess 1145 may be over-filled with the dielectric layer 1160 to ensure that the active region isolation recess 1145 is fully filled with the dielectric layer 1160 and to minimize the formation of gaps or voids in the active region isolation structure 1115. A deposition tool 102 may be used to deposit the dielectric layer 1160 using a PVD technique, an ALD technique, a CVD technique, an oxidation technique, another type of deposition technique described in connection with FIG. 1, and/or another suitable deposition technique. The dielectric layer 1160 may include a dielectric material such as a silicon oxide ($SiO_x$ such as $SiO_2$), a silicon nitride ($Si_xN_y$ such as a $Si_3N_4$), a silicon oxynitride (SiON), fluoride-doped silicate glass (FSG), a high-k dielectric material, and/or another suitable dielectric material.

Figure 16E:
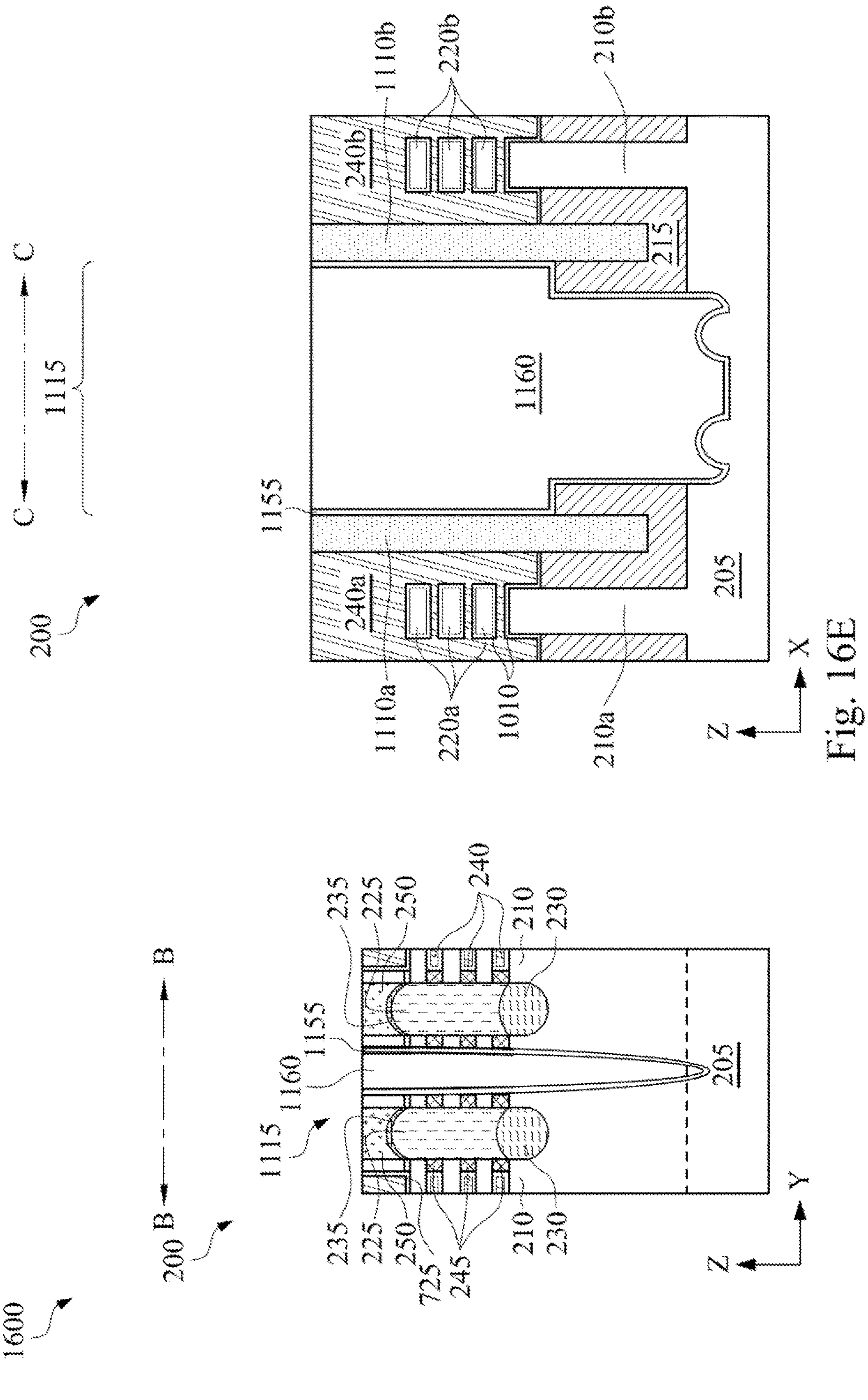

As shown in FIG. 16E, a planarization operation may be performed to planarize the semiconductor device 200 after the layers of the active region isolation structure 1115 are formed. A planarization tool 110 may be used to planarize the semiconductor device 200 to remove the hard mask layer 1105, to remove excess material of the dielectric liner 1155, and/or to remove excess material of the dielectric layer 1160.

As indicated above, the number and arrangement of operations and devices shown in FIGS. 16A-16E are provided as one or more examples. In practice, there may be additional operations and devices, fewer operations and devices, different operations and devices, or differently arranged operations and devices than those shown in FIGS. 16A-16E.

In this way, a CMODE process may be performed to form a CMODE structure in a semiconductor device after a replacement gate process that is performed to replace the polysilicon dummy gate structures of the semiconductor device with metal gate structures. The CMODE process described herein includes removing a portion of a metal gate structure (as opposed to removing a portion of a polysilicon dummy gate structure) to enable formation of the CMODE structure in a recess left behind by removal of the portion of the metal gate structure. The materials used for the metal gate structures of the semiconductor device may be stronger and may better withstand the stresses and strains of etching and forming the CMODE structures of the semiconductor device. Accordingly, the CMODE process described herein may reduce the likelihood of stress release of the source/drain regions on opposing sides of the CMODE structures, may reduce the likelihood of depth loading in the semiconductor, and/or may reduce the likelihood of gate deformation in the semiconductor device, among other examples.

As described in greater detail above, some implementations described herein provide a method. The method includes forming, over a semiconductor substrate, a plurality of nanostructure layers in a direction that is perpendicular to the semiconductor substrate, where the plurality of nanostructure layers comprises a plurality of sacrificial layers alternating with a plurality of channel layers. The method includes forming, over the plurality of nanostructure layers, a dummy gate structure. The method includes removing portions of the plurality of nanostructure layers to form one or more recesses adjacent to one or more sides of the dummy gate structure. The method includes forming one or more source/drain regions in the one or more recesses. The method includes replacing, after forming the one or more source/drain regions, the dummy gate structure and portions of the sacrificial layers under the dummy gate structure with a metal gate structure, where the metal gate structure wraps around at least three sides of the channel layers. The method includes removing, to form an active region isolation recess after replacing the dummy gate structure and the portions of the sacrificial layers under the dummy gate structure with the metal gate structure, a portion of the metal gate structure, portions of the channel layers around which the metal gate structure wraps, and a mesa region, under the portions of the channel layers, that extends above the semiconductor substrate. The method includes forming an active region isolation structure in the active region isolation recess.

As described in greater detail above, some implementations described herein provide a method. The method includes forming, over a semiconductor substrate, a plurality of nanostructure layers in a direction that is perpendicular to the semiconductor substrate, where the plurality of nanostructure layers comprises a plurality of sacrificial layers alternating with a plurality of channel layers. The method includes forming, over the plurality of nanostructure layers, a plurality of dummy gate structures. The method includes removing portions of the plurality of nanostructure layers to form one or more recesses adjacent to one or more sides of a dummy gate structure of the plurality of dummy gate structures. The method includes forming one or more source/drain regions in the one or more recesses. The method includes replacing, after forming the one or more source/drain regions, the plurality of dummy gate structures and portions of the sacrificial layers under the plurality of dummy gate structures with a plurality of metal gate structures, where the plurality of metal gate structures wraps around at least three sides of the channel layers. The method includes forming gate isolation structures across the plurality of metal gate structures after replacing the dummy gate structure and the portions of the sacrificial layers under the dummy gate structure with the metal gate structure. The method includes removing, between the gate isolation structures to form an active region isolation recess, a portion of a metal gate structure of the plurality of metal gate structures, portions of the channel layers around which the metal gate structure wraps, and a mesa region, under the portions of the channel layers, that extends above the semiconductor substrate. The method includes forming an active region isolation structure in the active region isolation recess between the gate isolation structures.

As described in greater detail above, some implementations described herein provide a semiconductor device. The semiconductor device includes a first plurality of nanostructure channels over a first mesa region that extends above a semiconductor substrate, where the first plurality of nanostructure channels are arranged in a direction that is perpendicular to the semiconductor substrate. The semiconductor device includes a second plurality of nanostructure channels over a second mesa region that extends above the semiconductor substrate, where the second plurality of nanostructure channels are arranged in the direction that is perpendicular to the semiconductor substrate. The semiconductor device includes a first metal gate structure wrapping around each of the first plurality of nanostructure channels. The semiconductor device includes a second metal gate structure wrapping around each of the second plurality of nanostructure channels. The semiconductor device includes a gate isolation structure between the first metal gate structure and the second metal gate structure. The semiconductor device includes an active region isolation structure between the gate isolation structure and the second metal gate structure, where a dielectric liner of the active region isolation structure is included directly on a sidewall of the gate isolation structure.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming, over a semiconductor substrate, a plurality of nanostructure layers in a direction that is perpendicular to the semiconductor substrate, wherein the plurality of nanostructure layers comprises a plurality of sacrificial layers alternating with a plurality of channel layers;

forming, over the plurality of nanostructure layers, a dummy gate structure;

removing portions of the plurality of nanostructure layers to form one or more recesses adjacent to one or more sides of the dummy gate structure;

forming one or more source/drain regions in the one or more recesses;

replacing, after forming the one or more source/drain regions, the dummy gate structure and portions of the sacrificial layers under the dummy gate structure with a metal gate structure, wherein the metal gate structure wraps around at least three sides of the channel layers;

removing, to form an active region isolation recess after replacing the dummy gate structure and the portions of the sacrificial layers under the dummy gate structure with the metal gate structure:

a portion of the metal gate structure, portions of the channel layers around which the metal gate structure wraps, and a mesa region, under the portions of the channel layers, that extends above the semiconductor substrate; and forming an active region isolation structure in the active region isolation recess.

2. The method of claim 1, further comprising:

removing, prior to removing the portion of the metal gate structure to form the active region isolation recess, another portion of the metal gate structure to form a gate isolation recess in the metal gate structure; and forming, prior to removing the portion of the metal gate structure to form the active region isolation recess, a gate isolation structure in the gate isolation recess.

3. The method of claim 2, wherein removing the portion of the metal gate structure, the portions of the channel layers around which the metal gate structure wraps, and the mesa region comprises:

removing, based on the gate isolation structure, the portion of the metal gate structure, the portions of the channel layers around which the metal gate structure wraps, and the mesa region.

4. The method of claim 1, further comprising:

removing, prior to removing the portion of the metal gate structure to form the active region isolation recess, a plurality of other portions of the metal gate structure to form a plurality of gate isolation recesses in the metal gate structure; and forming, prior to removing the portion of the metal gate structure to form the active region isolation recess, a plurality of gate isolation structures in the plurality of gate isolation recesses.

5. The method of claim 4, wherein removing the portion of the metal gate structure, the portions of the channel layers around which the metal gate structure wraps, and the mesa region comprises:

removing, from between the plurality of gate isolation structures, the portion of the metal gate structure, the portions of the channel layers around which the metal gate structure wraps, and the mesa region.

6. The method of claim 5, wherein forming the active region isolation structure comprises:

forming a dielectric liner on sidewalls of the plurality of gate isolation structures in the active region isolation recess; and filling the active region isolation recess with a dielectric layer over the dielectric liner.

7. The method of claim 4, wherein forming the plurality of gate isolation structures comprises:

forming the plurality of gate isolation structures such that the plurality of gate isolation structures extend in a first direction across the metal gate structure; and wherein forming the active region isolation structure comprises:

forming the active region isolation structure such that the active region isolation structure extends in a second direction in which the metal gate structure extends.

8. A method, comprising:

forming, over a semiconductor substrate, a plurality of nanostructure layers in a direction that is perpendicular to the semiconductor substrate, wherein the plurality of nanostructure layers comprises a plurality of sacrificial layers alternating with a plurality of channel layers;

forming, over the plurality of nanostructure layers, a plurality of dummy gate structures;

removing portions of the plurality of nanostructure layers to form one or more recesses adjacent to one or more sides of a dummy gate structure of the plurality of dummy gate structures;

forming one or more source/drain regions in the one or more recesses;

replacing, after forming the one or more source/drain regions, the plurality of dummy gate structures and portions of the sacrificial layers under the plurality of dummy gate structures with a plurality of metal gate structures, wherein the plurality of metal gate structures wraps around the channel layers;

forming gate isolation structures across the plurality of metal gate structures after replacing the dummy gate structure and the portions of the sacrificial layers under the dummy gate structure with the metal gate structure;

removing, between the gate isolation structures to form an active region isolation recess:

a portion of a metal gate structure of the plurality of metal gate structures, portions of the channel layers around which the metal gate structure wraps, and a mesa region, under the portions of the channel layers, that extends above the semiconductor substrate; and forming an active region isolation structure in the active region isolation recess between the gate isolation structures.

9. The method of claim 8, wherein removing the portion of the metal gate structure, the portions of the channel layers around which the metal gate structure wraps, and the mesa region comprises:

etching, using the gate isolation structures as a self-aligned mask, the portion of the metal gate structure, the portions of the channel layers around which the metal gate structure wraps, and the mesa region.

10. The method of claim 8, wherein removing the portion of the metal gate structure, the portions of the channel layers around which the metal gate structure wraps, and the mesa region comprises:

performing a first etch operation to remove the portion of the metal gate structure; and performing, after the first etch operation, a second etch operation to remove the portions of the channel layers around which the metal gate structure wraps, and the mesa region.

11. The method of claim 10, further comprising:

performing, prior to the first etch operation, a third etch operation to remove a portion of a hard mask layer over the portion of the metal gate structure.

12. The method of claim 11, further comprising:

forming the hard mask layer over the gate isolation structures prior to removing the portion of the metal gate structure, the portions of the channel layers around which the metal gate structure wraps, and the mesa region.

13. The method of claim 8, wherein forming the active region isolation structure comprises:

forming a dielectric liner in the active region isolation recess; and filling the active region isolation recess with a dielectric layer over the dielectric liner.

14. The method of claim 13, wherein forming the dielectric liner comprises:

forming the dielectric liner such that the dielectric liner is in direct contact with sidewalls of the gate isolation structures.

15. A semiconductor device, comprising:

a first plurality of nanostructure channels over a first mesa region that extends above a semiconductor substrate, wherein the first plurality of nanostructure channels are arranged in a direction that is perpendicular to the semiconductor substrate;

a second plurality of nanostructure channels over a second mesa region that extends above the semiconductor substrate, wherein the second plurality of nanostructure channels are arranged in the direction that is perpendicular to the semiconductor substrate;

a first metal gate structure wrapping around each of the first plurality of nanostructure channels;

a second metal gate structure wrapping around each of the second plurality of nanostructure channels;

a gate isolation structure between the first metal gate structure and the second metal gate structure; and an active region isolation structure between the gate isolation structure and the second metal gate structure, wherein a dielectric liner of the active region isolation structure is included directly on a sidewall of the gate isolation structure, and wherein the first metal gate structure is in direct contact with another sidewall of the gate isolation structure.

16. The semiconductor device of claim 15, further comprising:

another gate isolation structure between the active region isolation structure and the second metal gate structure.

17. The semiconductor device of claim 16, wherein the second metal gate structure is in direct contact with a sidewall of the other gate isolation structure.

18. The semiconductor device of claim 17, wherein the dielectric liner of the active region isolation structure is in direct contact with another sidewall of the other gate isolation structure.

19. The semiconductor device of claim 15, wherein the dielectric liner is between a dielectric layer of the active region isolation structure and the gate isolation structure.

20. The semiconductor device of claim 15, wherein the active region isolation structure is configured to create electrical isolation between the first plurality of nanostructure channels and the second plurality of nanostructure channels.

* * * * *